US011393752B2

(12) United States Patent
Tanaka

(10) Patent No.: US 11,393,752 B2
(45) Date of Patent: Jul. 19, 2022

(54) ELECTRONIC COMPONENT

(71) Applicant: ROHM CO., LTD., Kyoto (JP)

(72) Inventor: Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 206 days.

(21) Appl. No.: 16/820,842

(22) Filed: Mar. 17, 2020

(65) Prior Publication Data

US 2020/0303304 A1   Sep. 24, 2020

(30) Foreign Application Priority Data

Mar. 20, 2019  (JP) .............................. JP2019-053247
Mar. 27, 2019  (JP) .............................. JP2019-061163

(51) Int. Cl.
*H01L 23/522*   (2006.01)

(52) U.S. Cl.
CPC ...... *H01L 23/5228* (2013.01); *H01L 23/5226* (2013.01)

(58) Field of Classification Search
CPC .................... H01L 23/5228; H01L 23/5226
See application file for complete search history.

(56) References Cited

U.S. PATENT DOCUMENTS

| 7,217,981 B2* | 5/2007 | Coolbaugh ............. H01L 28/20 |
| | | 257/380 |
| 2005/0202219 A1 | 9/2005 | Yamashita |
| 2007/0015363 A1* | 1/2007 | Hashimoto ............ H05K 1/167 |
| | | 438/689 |
| 2014/0284754 A1* | 9/2014 | Yamamoto ............. H01L 24/33 |
| | | 257/487 |

FOREIGN PATENT DOCUMENTS

| JP | 2005-235995 A | 9/2005 |
| JP | 2009-038099 A | 2/2009 |
| JP | 2013-172000 A | 9/2013 |
| JP | 2015-012259 A | 1/2015 |

* cited by examiner

*Primary Examiner* — Fernando L Toledo
*Assistant Examiner* — Neil R Prasad
(74) *Attorney, Agent, or Firm* — Rabin & Berdo, P.C.

(57) ABSTRACT

An electronic component includes a first insulating layer, a resistance layer including a metal thin film that is formed on the first insulating layer, the resistance layer having a first end portion, a second end portion and a central portion between the first end portion and the second end portion, a first electrode having a first contact portion and a second contact portion spaced away from the first contact portion both of which are in contact with the resistance layer at a portion of the first end portion side with respect to the central portion of the resistance layer, a notched portion formed in the first end portion of the resistance layer and between the first contact portion and the second contact portion, and a second electrode having a contact portion in contact with the resistance layer at a portion of the second end portion side with respect to the central portion of the resistance layer.

20 Claims, 42 Drawing Sheets

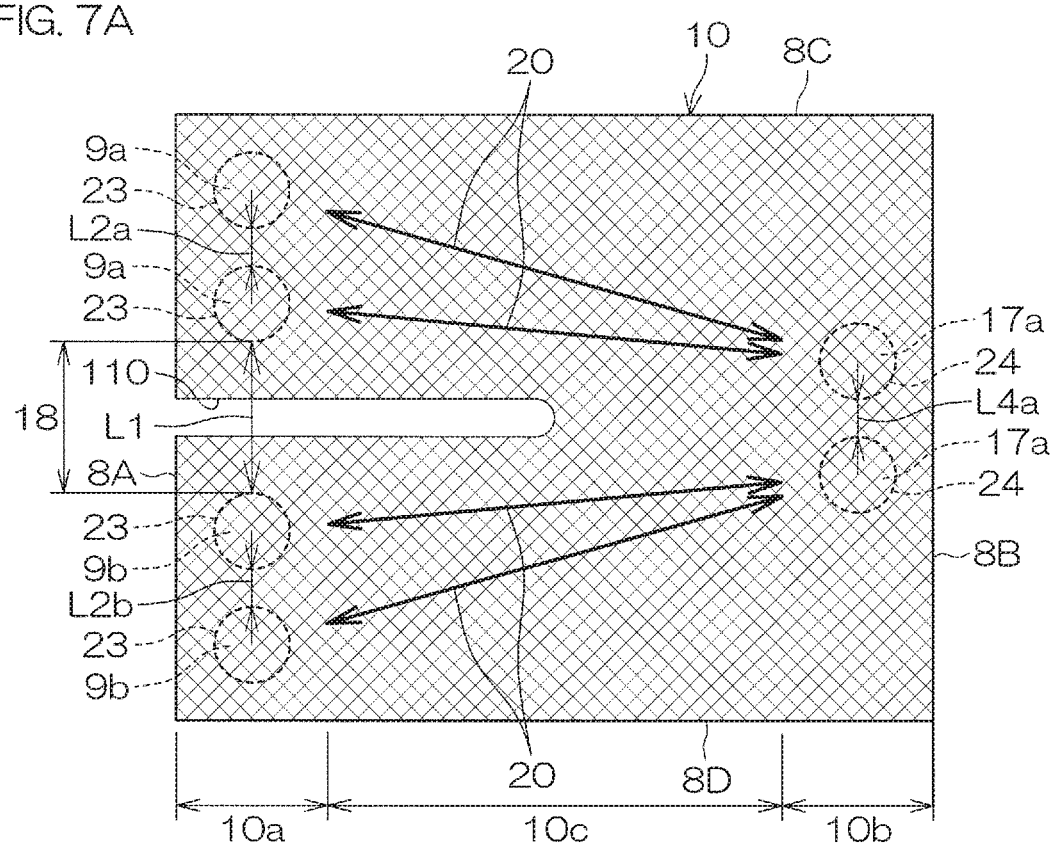

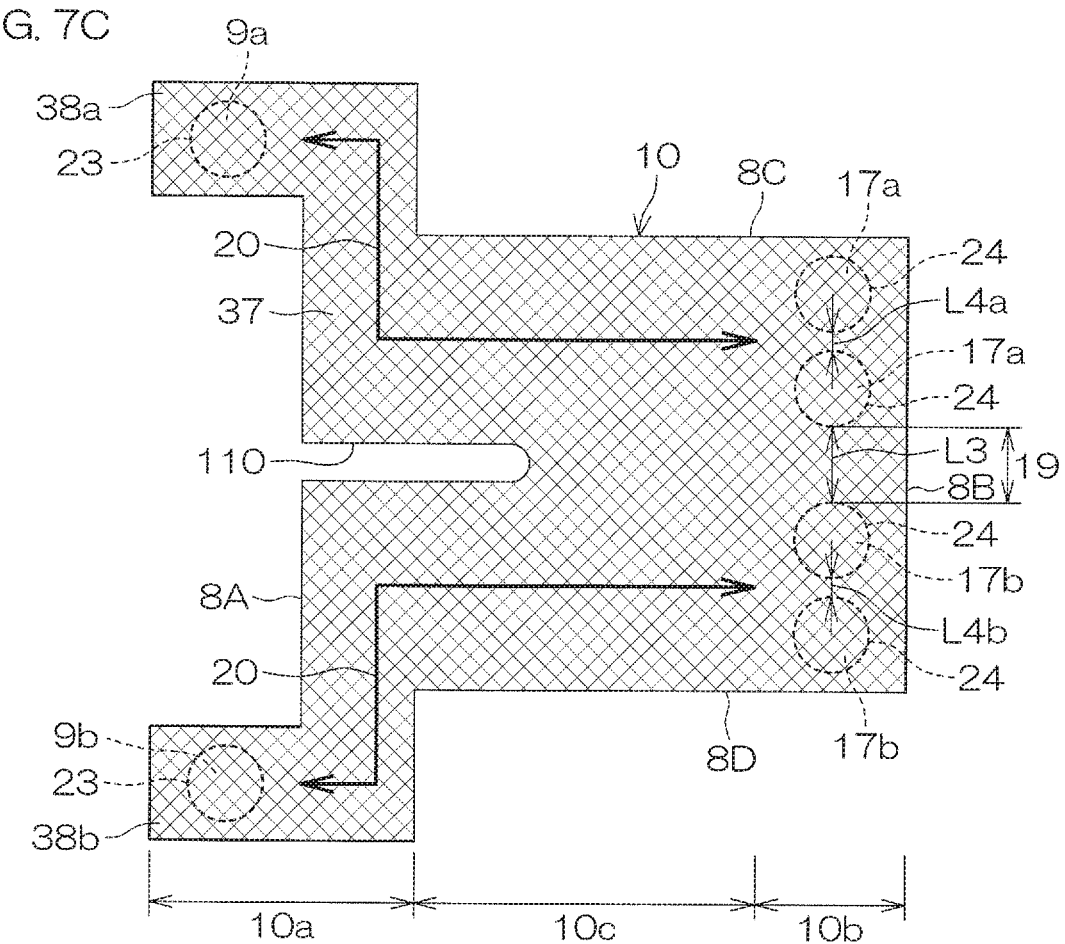

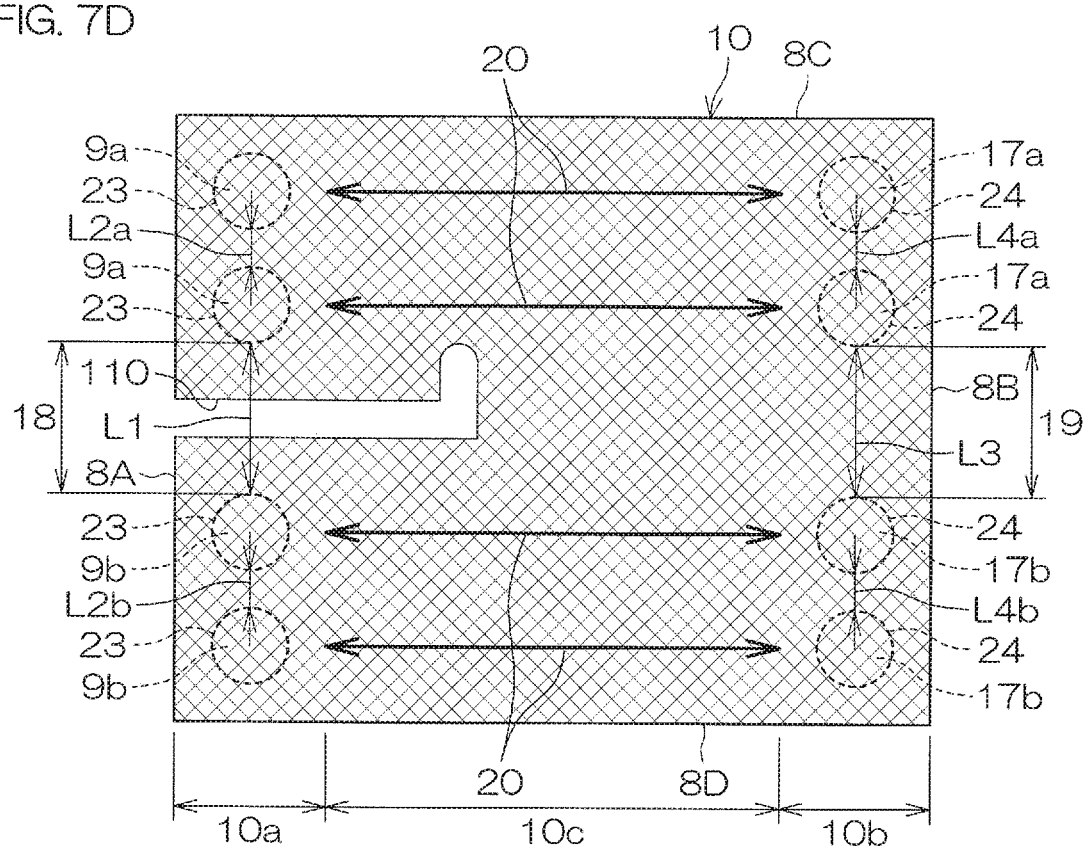

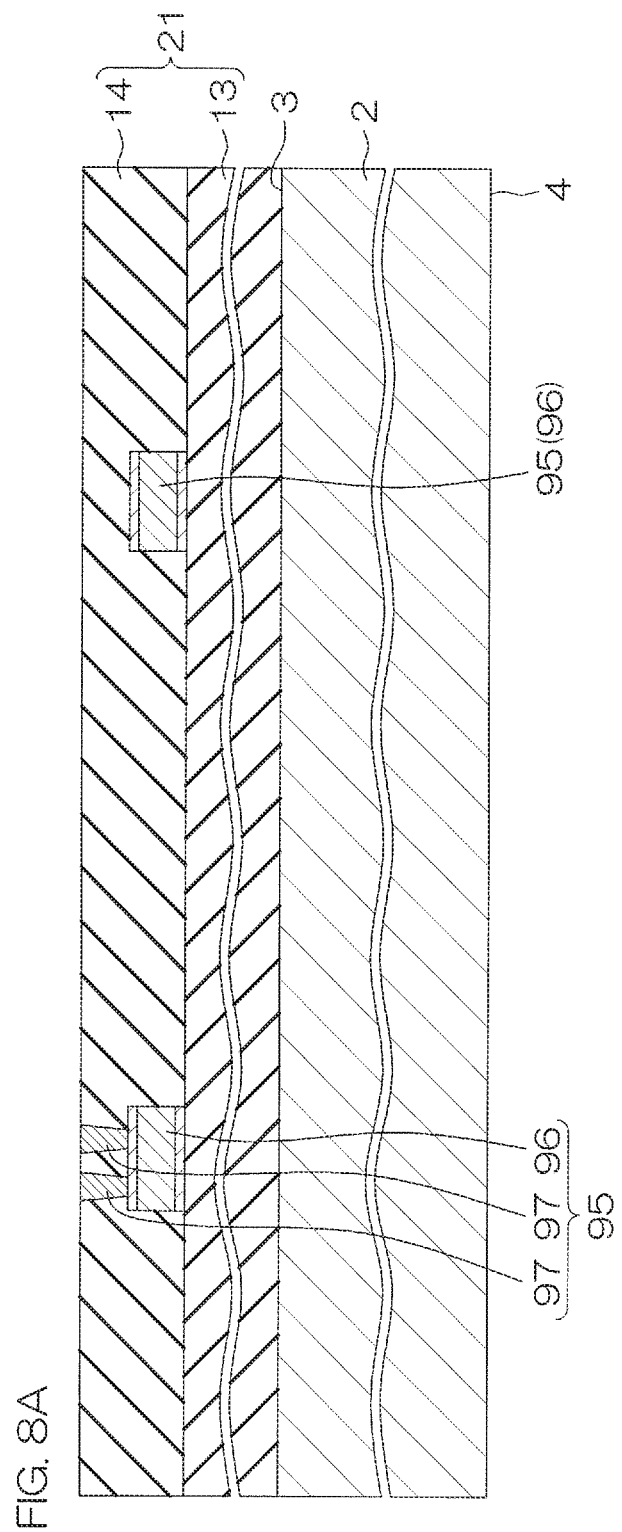

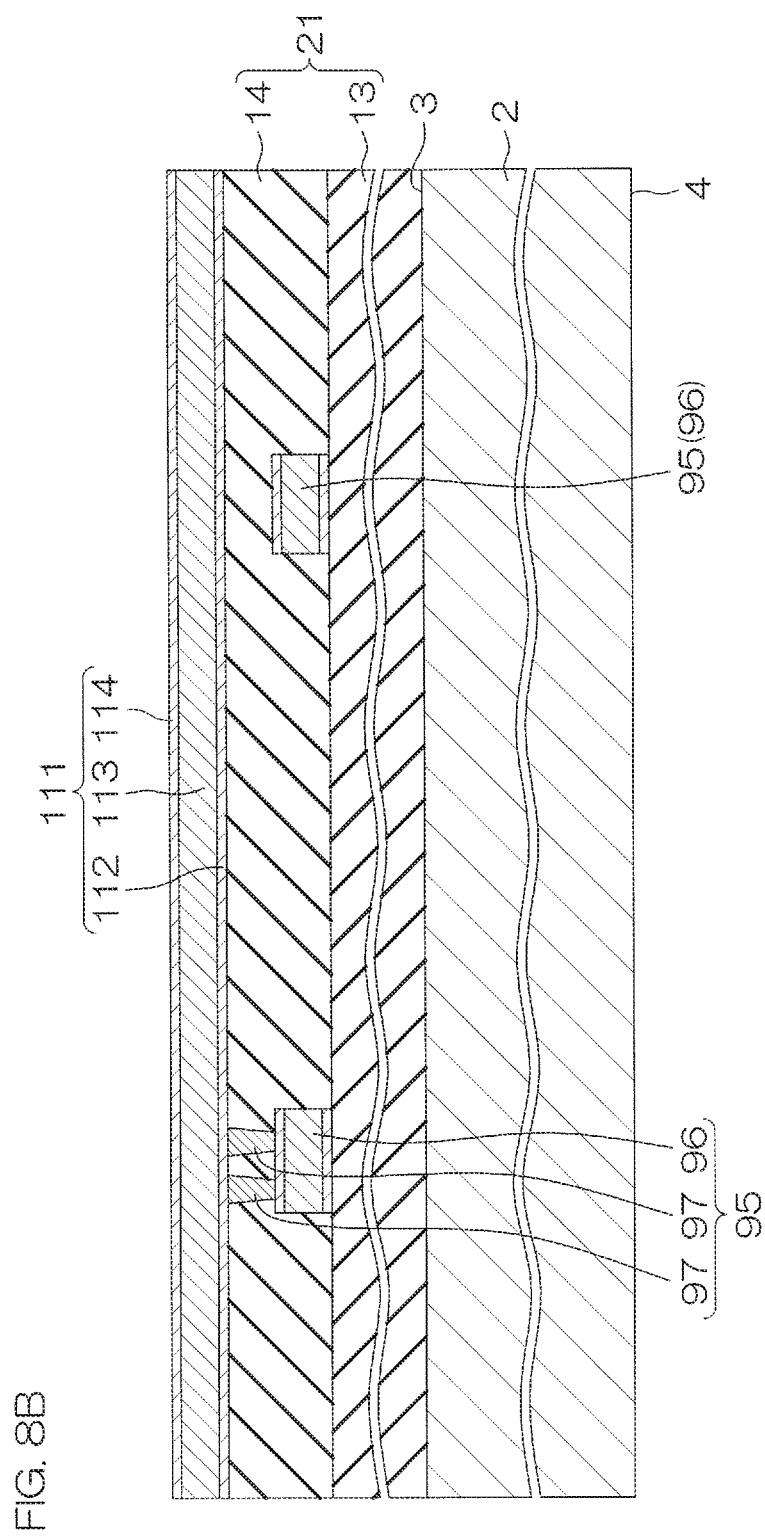

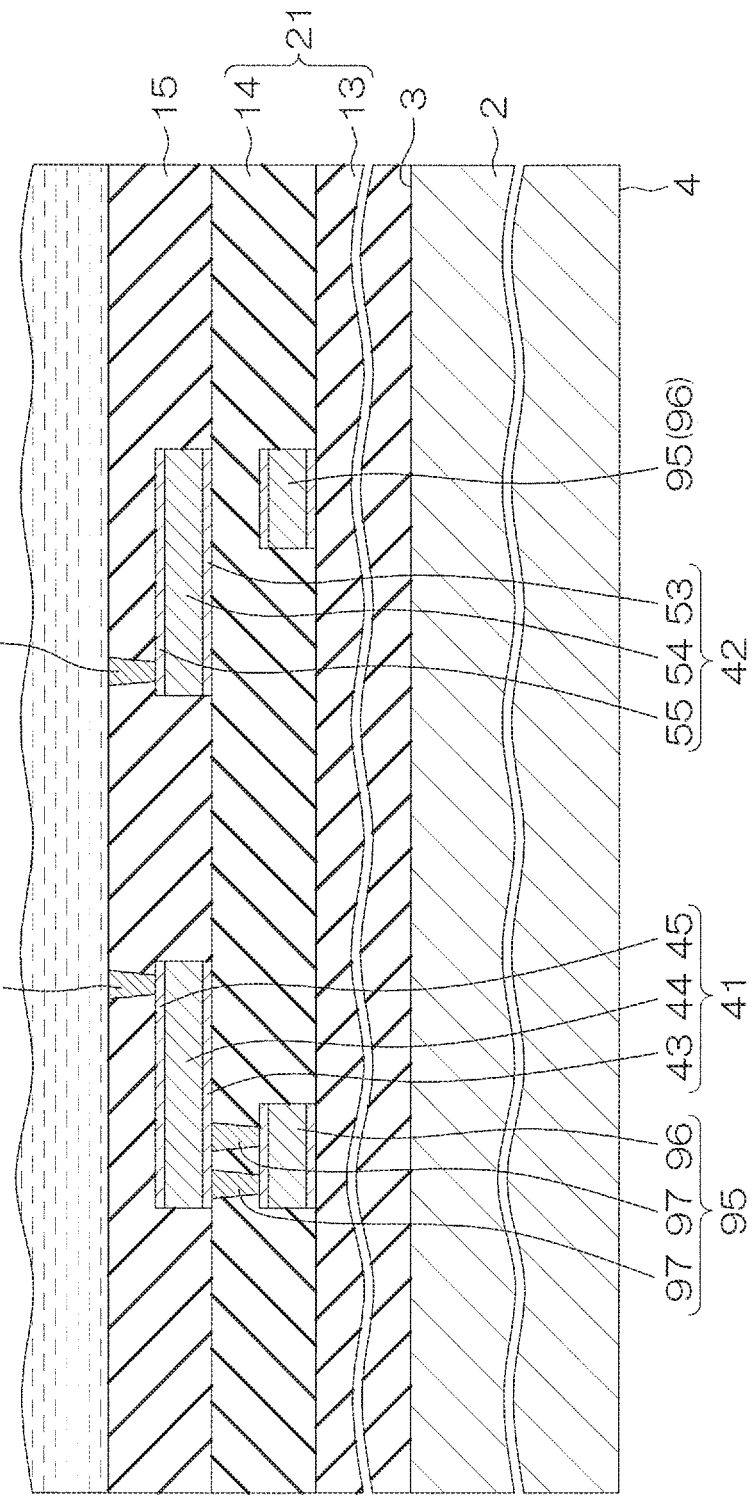

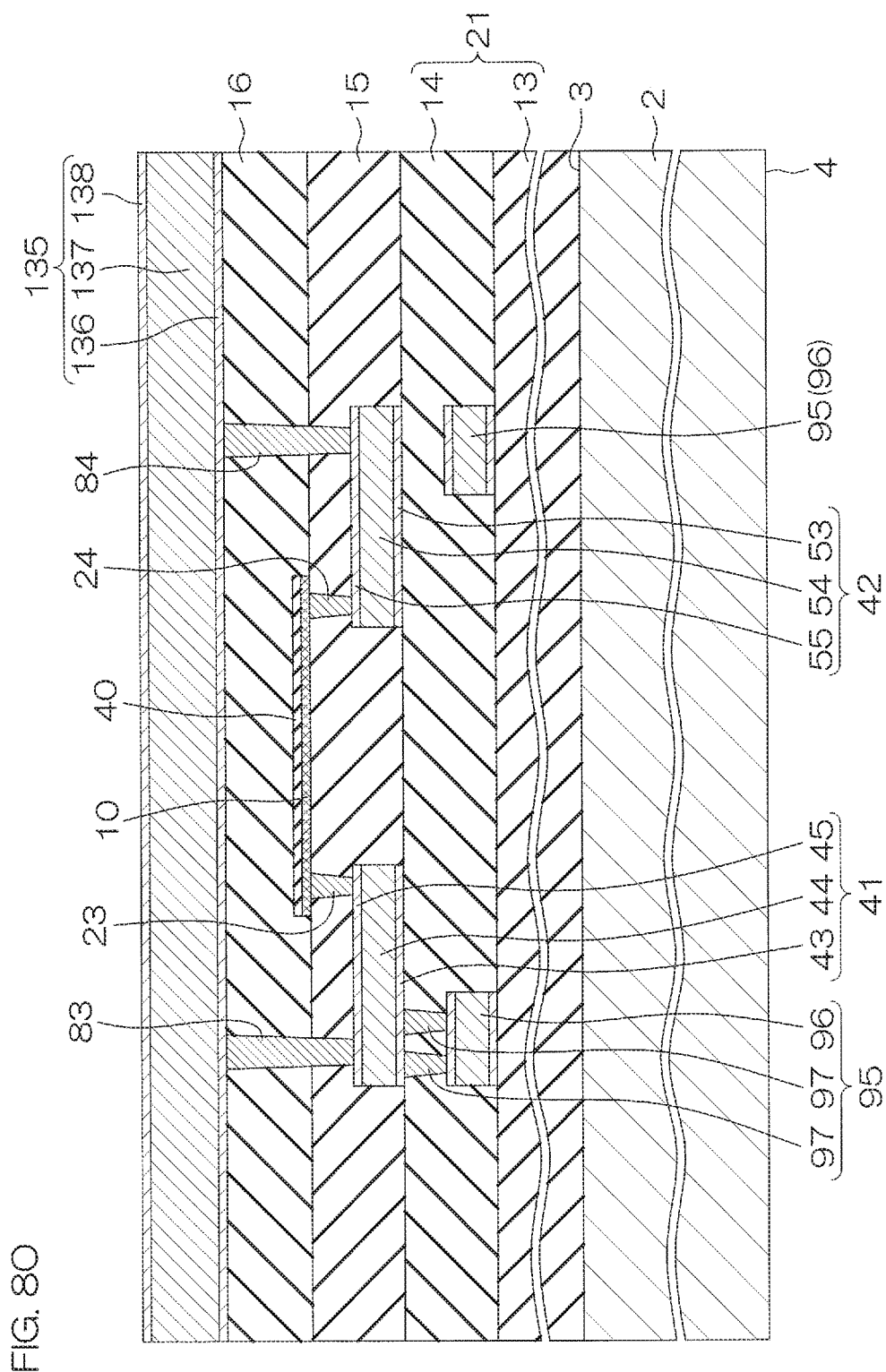

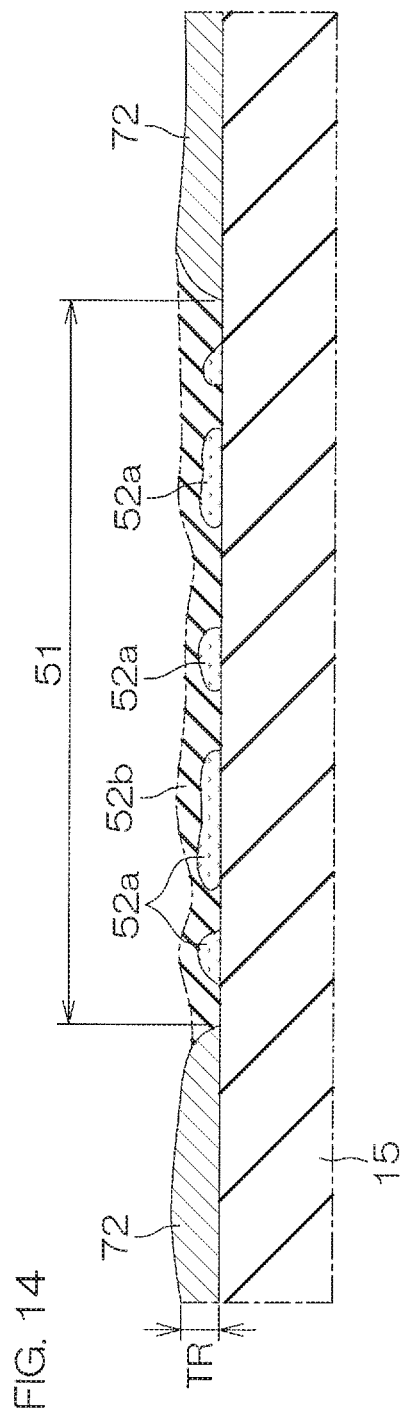

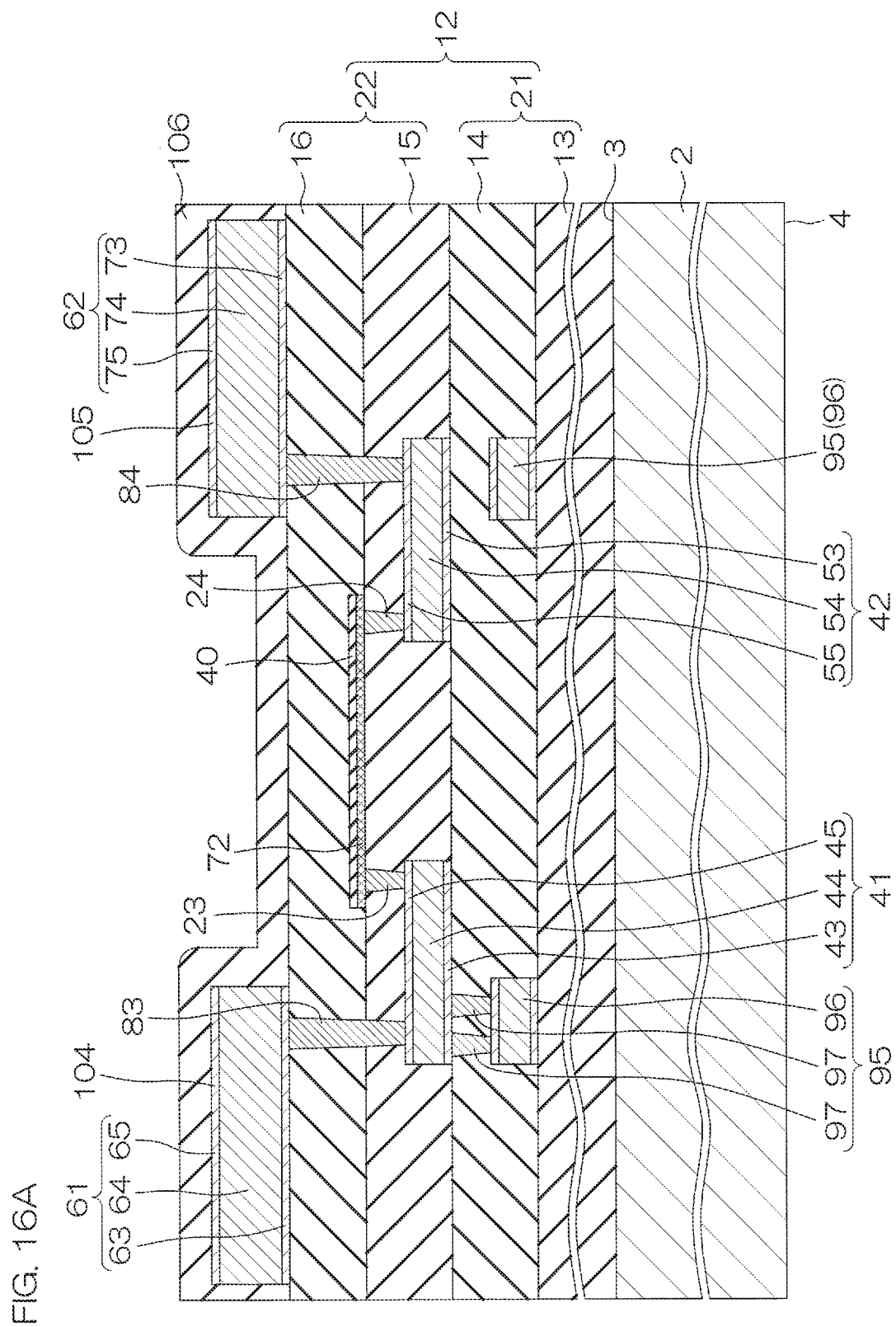

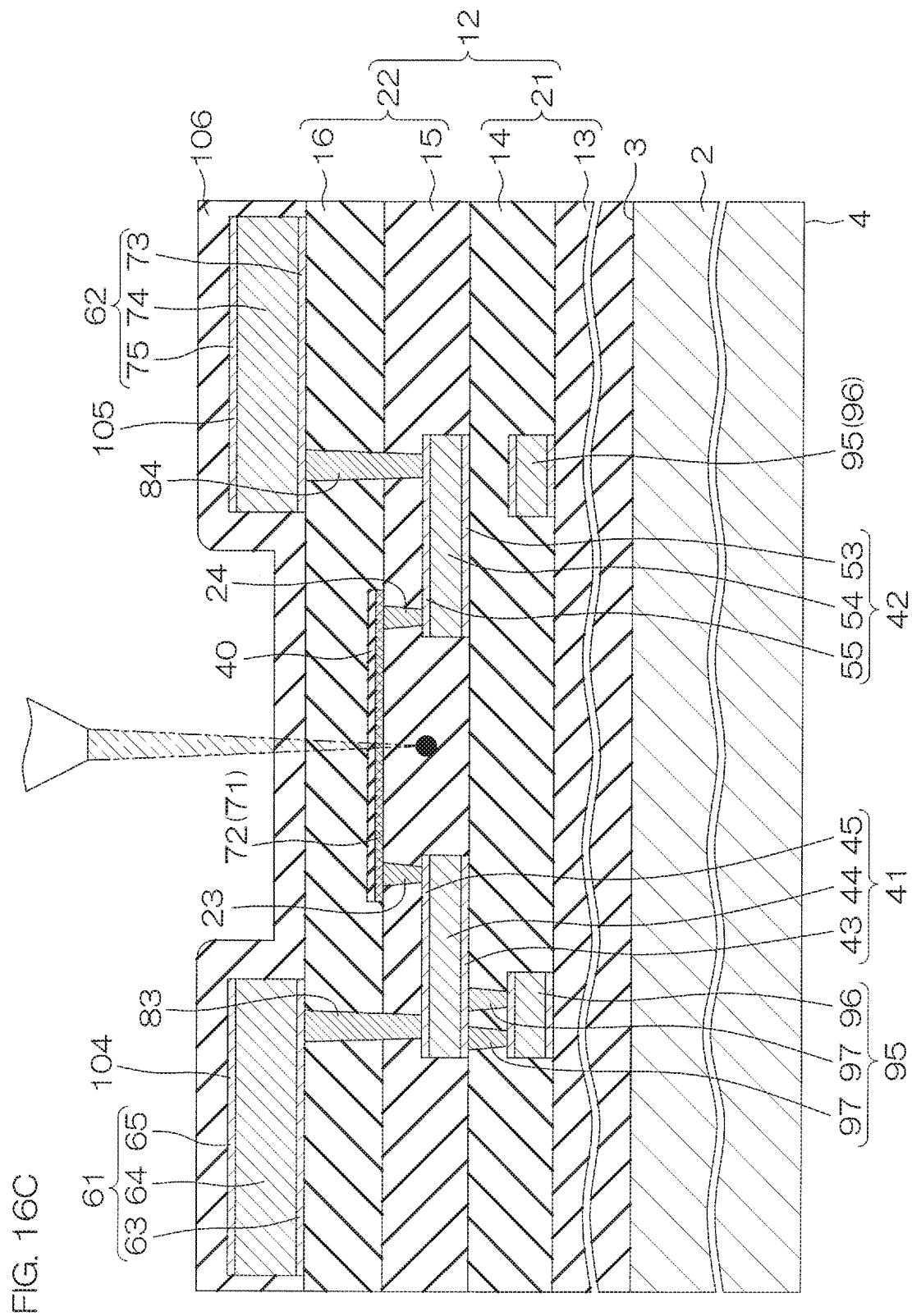

ELECTRONIC COMPONENT

CROSS-REFERENCE TO RELATED APPLICATIONS

This application corresponds to Japanese Patent Application No. 2019-053247 filed on Mar. 20, 2019 in the Japan Patent Office and Japanese Patent Application No. 2019-061163 filed on Mar. 27, 2019 in the Japan Patent Office, the disclosures of which are incorporated herein by reference in their entirety.

TECHNICAL FIELD

The present invention relates to an electronic component.

BACKGROUND ART

Patent Literature 1 (Japanese Patent Application Publication No. 2009-038099) discloses a semiconductor device including a semiconductor substrate, an insulating film formed on the semiconductor substrate, a polysilicon resistance layer formed on the insulating film, an insulating film formed on the polysilicon resistance layer, and a wiring connected, on the polysilicon resistance layer, to the polysilicon resistance layer.

Patent Literature 2 (Japanese Patent Application Publication No. 2013-172000) discloses a semiconductor device including a silicon substrate, a LOCOS oxide film formed on the silicon substrate, a polysilicon resistor formed on the LOCOS oxide film, and a wiring connected, on the polysilicon resistor, to the polysilicon resistor.

Patent Literature 3 (Japanese Patent Application Publication No. 2015-012259) discloses a semiconductor device including a silicon substrate, an insulating layer formed on the silicon substrate, a polysilicon resistance element formed on the insulating layer, and a wiring connected, on the polysilicon resistance element, to the polysilicon resistance element.

SUMMARY OF INVENTION

A preferred embodiment of the present invention provides an electronic component in which a resistance value of a resistance layer can be adjusted with a high degree of accuracy.

An electronic component according to a preferred embodiment of the present invention includes a first insulating layer, a resistance layer including a metal thin film that is formed on the first insulating layer, the resistance layer having a first end portion, a second end portion and a central portion between the first end portion and the second end portion, a first electrode having a first contact portion and a second contact portion spaced away from the first contact portion both of which are in contact with the resistance layer at a portion of the first end portion side with respect to the central portion of the resistance layer, a notched portion formed in the first end portion of the resistance layer and between the first contact portion and the second contact portion, and a second electrode having a contact portion in contact with the resistance layer at a portion of the second end portion side with respect to the central portion of the resistance layer.

According to the arrangement above, the first electrode is connected to the resistance layer at multiple portions, i.e., the first contact portion and the second contact portion. The notched portion (trimmed portion) for adjusting the resistance value of the resistance layer is formed in a portion of the resistance layer between the first contact portion and the second contact portion. That is, the notched portion is spaced away from a principal current path between the first contact portion of the first electrode and the contact portion of the second electrode and between the second contact portion of the first electrode and the contact portion of the second electrode. Therefore, the variation in the resistance value is reduced due to formation of the notched portion, and the resistance value of the resistance layer can thereby be adjusted with a high degree of accuracy.

BRIEF DESCRIPTION OF DRAWINGS

FIG. 7A is a plan view of a resistance layer according to a second configuration example.

FIG. 7C is a plan view of a resistance layer according to a fourth configuration example.

FIG. 7D is a plan view of a resistance layer according to a fifth configuration example.

FIG. 14 is a schematic enlarged sectional view of a region in which a trimming mark is formed.

FIGS. 16A to 16C are sectional views of a portion corresponding to FIG. 2, illustrating an example of a method for manufacturing the electronic component shown in FIG. 10.

DESCRIPTION OF EMBODIMENTS

Preferred Embodiments of the Present Invention shall now be described in detail with reference to the accompanying drawings.

Figure 1:
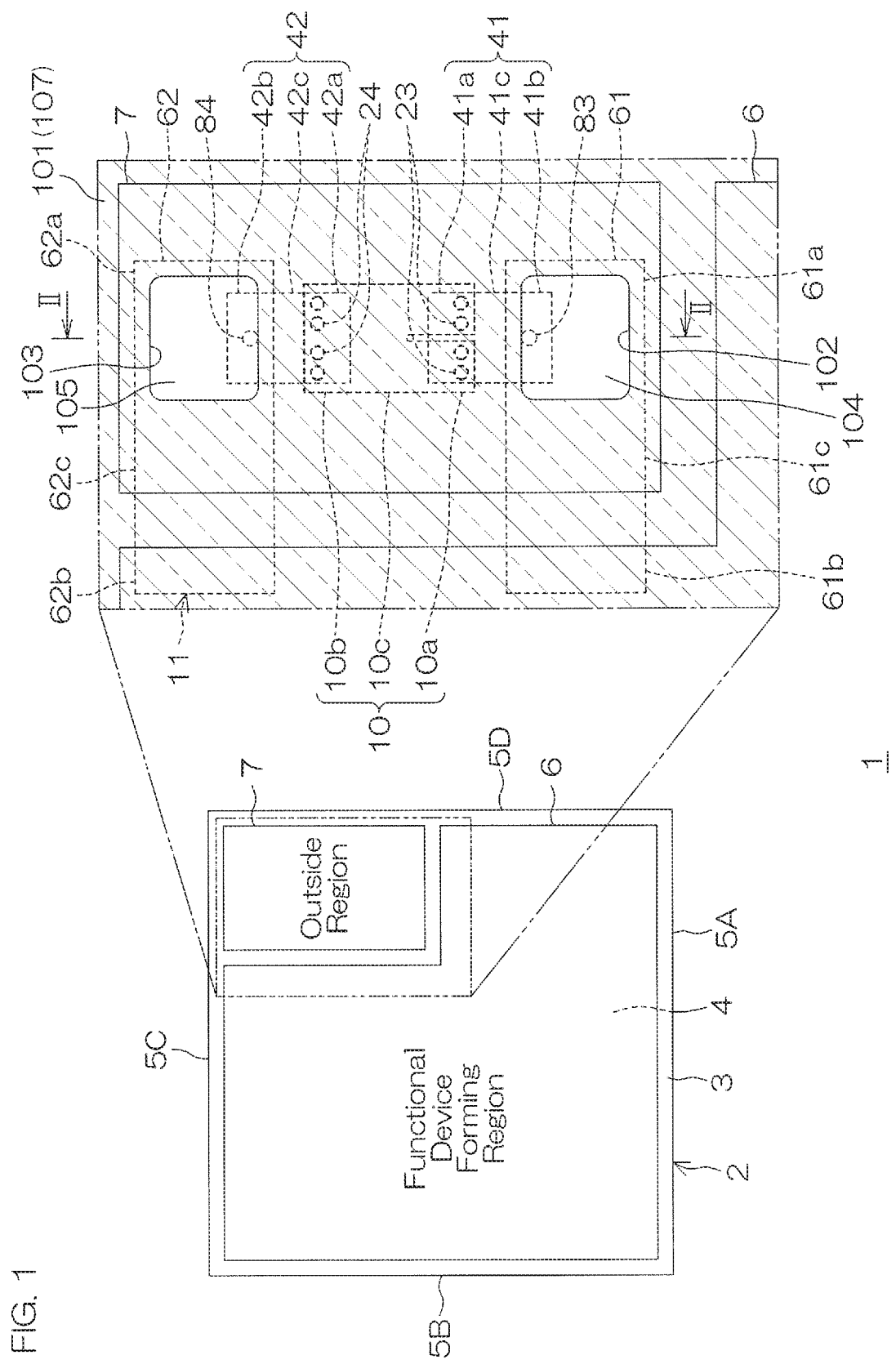
FIG. 1 is a schematic plan view of an electronic component according to a first preferred embodiment of the present invention, showing a configuration in which a resistance layer according to a first configuration example is incorporated.

FIG. 1 is a schematic plan view of an electronic component 1 according to a first preferred embodiment of the present invention, showing a configuration in which a resistance layer 10 according to a first configuration example is incorporated.

The electronic component 1 is a semiconductor device that contains conductor material or semiconductor material or includes various functional devices formed utilizing, for example, properties of semiconductor material. The electronic component 1 includes a chip-shaped semiconductor layer 2 formed in a rectangular parallelepiped shape. The semiconductor layer 2 includes a first principal surface 3 on one side, a second principal surface 4 on the other side, and side surfaces 5A, 5B, 5C, and 5D connecting the first principal surface 3 and the second principal surface 4.

The first principal surface 3 is a device forming surface. The first principal surface 3 and the second principal surface 4 are each formed in a quadrilateral shape (square shape in this configuration) in plan view as viewed in a direction normal to the surfaces (hereinafter referred to as simply "plan view").

The semiconductor layer 2 may be an Si semiconductor layer that contains Si (silicon) as an example of a semiconductor material. The Si semiconductor layer may have a layered structure that includes an Si semiconductor substrate and an Si epitaxial layer. The Si semiconductor layer may have a single-layer structure constituted by the Si semiconductor substrate.

The semiconductor layer 2 may be an SiC semiconductor layer that contains SiC (silicon carbide) as an example of a semiconductor material. The SiC semiconductor layer may have a layered structure that includes an SiC semiconductor substrate and an SiC epitaxial layer. The SiC semiconductor layer may have a single-layer structure constituted by the SiC semiconductor substrate.

The semiconductor layer 2 may be a compound semiconductor layer that contains compound semiconductor material as an example of a semiconductor material. The compound semiconductor layer may have a layered structure that includes a compound semiconductor substrate and a compound semiconductor epitaxial layer. The compound semiconductor layer may have a single-layer structure constituted by the compound semiconductor substrate.

The compound semiconductor material may be any of III-V group compound semiconductor materials. The semiconductor layer 2 may include at least one of AlN (aluminum nitride), InN (indium nitride), GaN (gallium nitride), and GaAs (gallium arsenide) as examples of III-V group compound semiconductor materials.

The semiconductor layer 2 is configured with a device forming region 6 and an outer region 7. The device forming region 6 is a region in which a functional device is formed. The functional device is formed in the semiconductor layer 2.

More specifically, the functional device is formed utilizing the first principal surface 3 of the semiconductor layer 2 and/or a surface layer portion of the first principal surface 3. The functional device may include at least one of a passive device, a semiconductor rectifying device, and a semiconductor switching device. The passive device may include a semiconductor passive device.

The passive device (semiconductor passive device) may include at least one of a resistor, a capacitor, and a coil. The semiconductor rectifying device may include at least one of a pn junction diode, a Zener diode, a Schottky barrier diode, and a fast recovery diode.

The semiconductor switching device may include at least one of a BJT (Bipolar Junction Transistor), a MISFET (Metal Insulator Field Effect Transistor), an IGBT (Insulated Gate Bipolar Junction Transistor), and a JFET (Junction Field Effect Transistor).

The functional device may include a circuit network in which any two or more of a passive device (semiconductor passive device), a semiconductor rectifying device, and a semiconductor switching device are selectively combined. The circuit network may form a part or a whole of an integrated circuit.

The integrated circuit may include an SSI (Small Scale Integration), an LSI (Large Scale Integration), an MSI (Medium Scale Integration), a VLSI (Very Large Scale Integration), or an ULSI (Ultra-Very Large Scale Integration).

The device forming region 6 is set with spacing inward from the side surfaces 5A to 5D of the semiconductor layer 2. In this configuration, the device forming region 6 is formed in an L shape in plan view. The planar shape of the device forming region 6 is arbitrary and is not restricted to the planar shape shown in FIG. 1.

The outer region 7 is a region on the outside of the device forming region 6. The outer region 7 is a region in which a functional device is not formed in the first principal surface 3 of the semiconductor layer 2. In this configuration, the outer region 7 is formed in a region between the side surfaces 5A to 5D of the semiconductor layer 2 and the device forming region 6. In this configuration, the outer region 7 is formed in a quadrilateral shape in plan view. The planar shape of the outer region 7 is arbitrary and is not restricted to the planar shape shown in FIG. 1. The outer region 7 may be formed in a central portion of the first principal surface 3 in plan view.

A resistance circuit 11, including a resistance layer 10 made of a metal thin film, is formed in the outer region 7 in a manner spaced from the first principal surface 3 of the semiconductor layer 2. That is, in this configuration, the resistance circuit 11 (resistance layer 10) is formed to avoid the device forming region 6 in plan view. The resistance circuit 11 (resistance layer 10) is electrically connected to the functional device.

By arranging the resistance circuit 11 (resistance layer 10) in the outer region 7, the electrical influence of the resistance circuit 11 on the device forming region 6 is suppressed and also the electrical influence of the device forming region 6 on the resistance circuit 11 is suppressed.

As an example, by arranging the resistance circuit 11 (resistance layer 10) in the outer region 7, the parasitic capacitance between the device forming region 6 and the resistance circuit 11 can be suppressed. That is, the Q value of the electronic circuit can be increased to reduce noise.

While this configuration illustrates an example in which the resistance circuit 11 includes the single resistance layer 10, the resistance circuit 11 may include multiple (two or more) resistance layers 10 instead. The resistance layer 10 (resistance circuit 11) shall now be described specifically with reference to FIGS. 2 to 5 in addition to FIG. 1.

Figure 2:
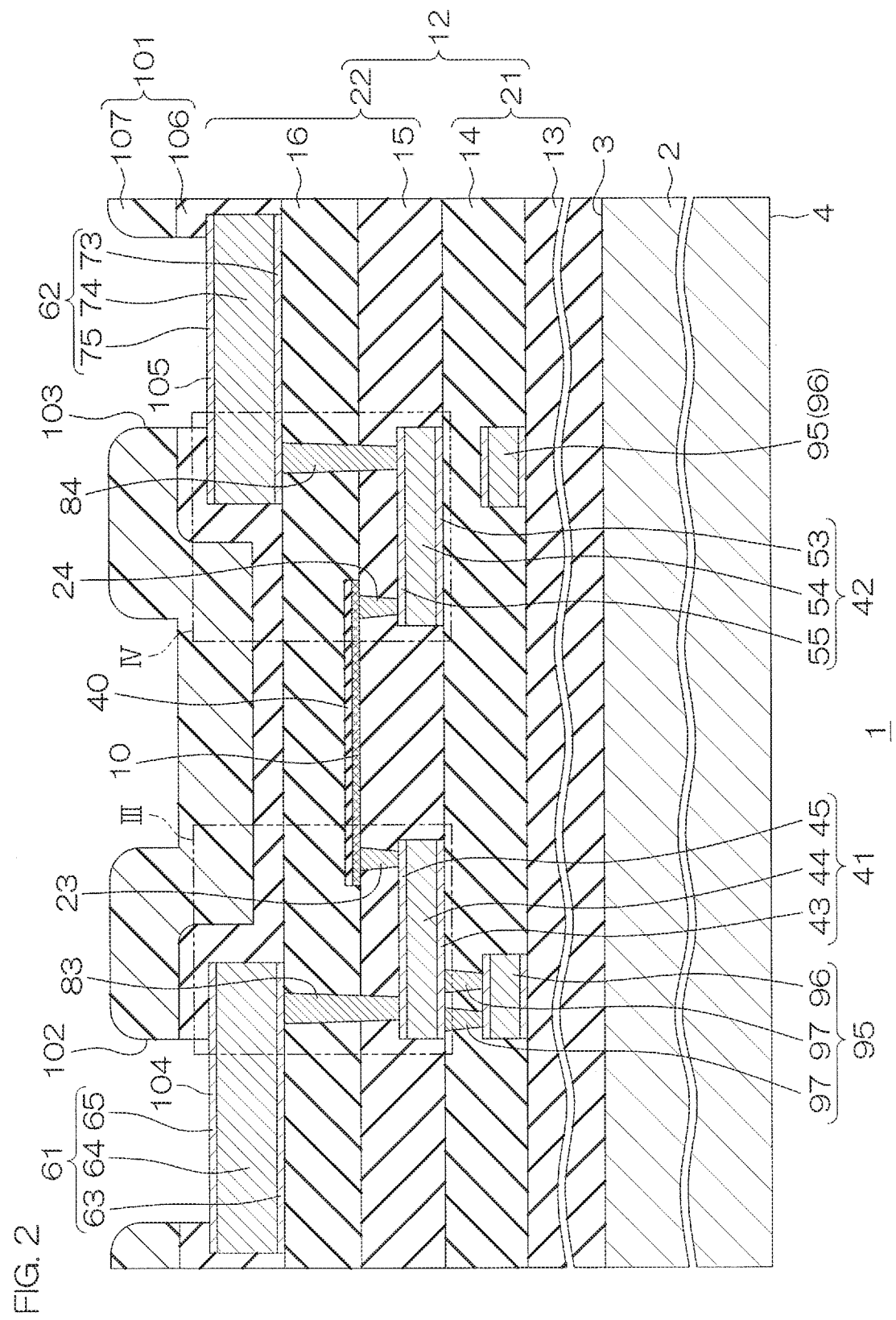
FIG. 2 is a sectional view taken along line II-II shown in FIG. 1.
Figure 3:
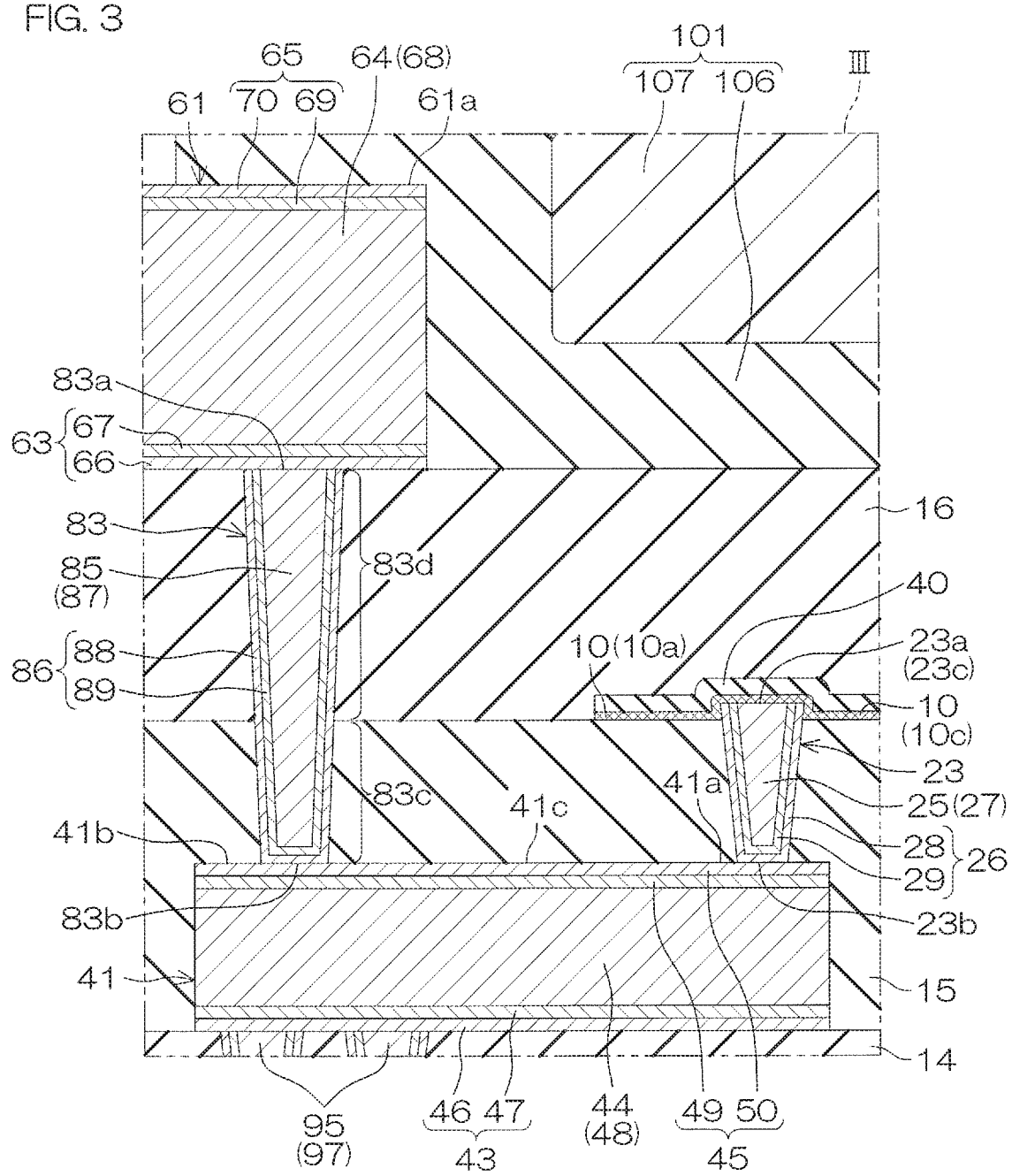
FIG. 3 is an enlarged view of a region III shown in FIG. 2.
Figure 4:
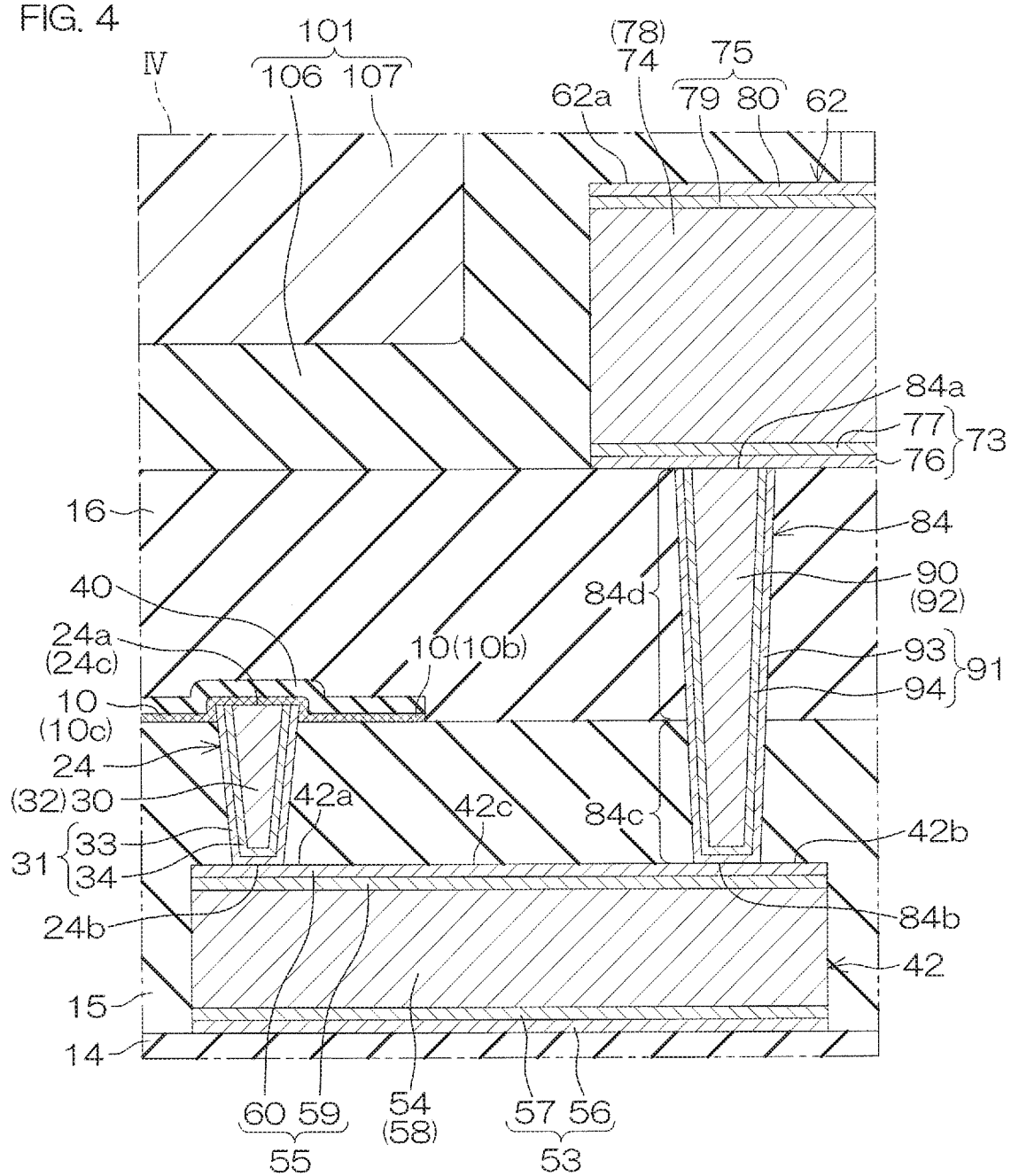
FIG. 4 is an enlarged view of a region IV shown in FIG. 2.
Figure 5:
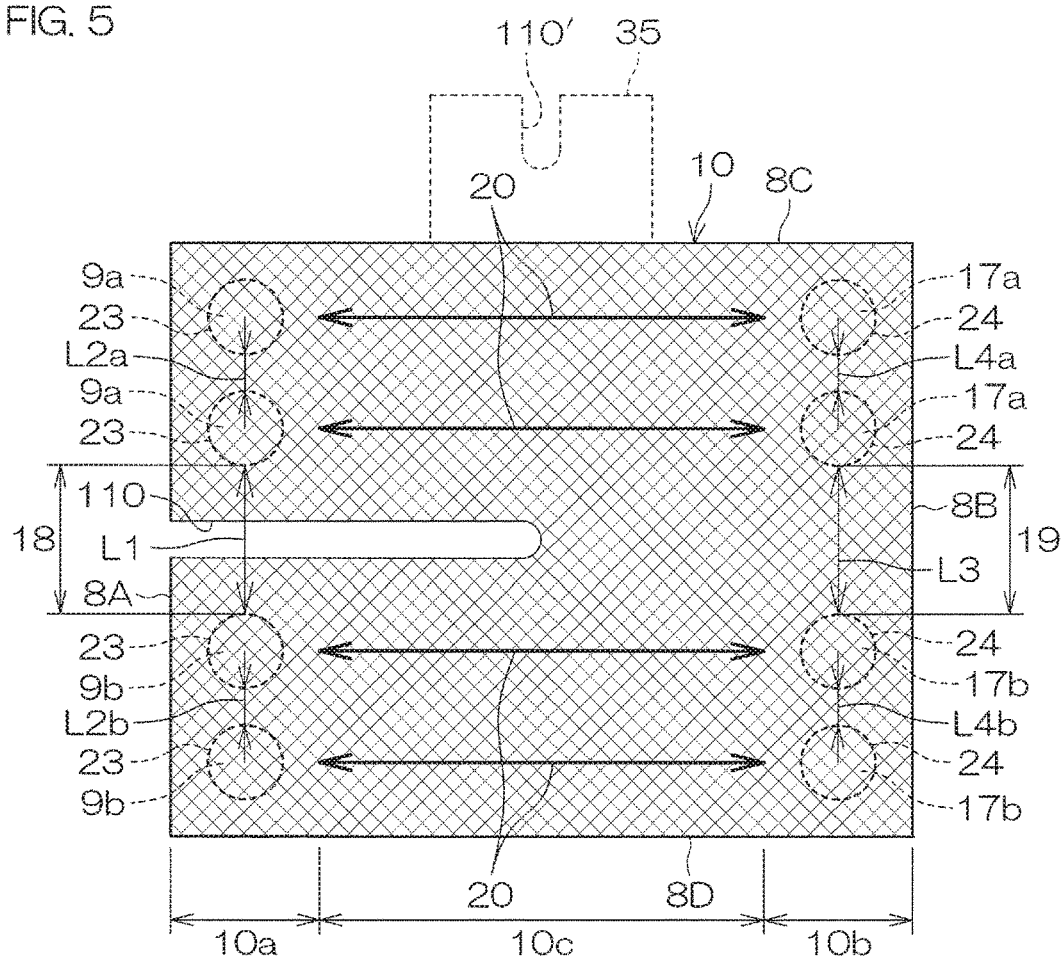
FIG. 5 is a plan view for illustrating a planar shape of the resistance layer.

FIG. 2 is a sectional view taken along line II-II shown in FIG. 1. FIG. 3 is an enlarged view of a region III shown in FIG. 2. FIG. 4 is an enlarged view of a region IV shown in FIG. 2. FIG. 5 is a plan view for illustrating a planar shape of the resistance layer 10.

Referring to FIGS. 2 to 4, in the device forming region 6 and the outer region 7, a multilayer wiring structure is formed on the first principal surface 3 of the semiconductor layer 2. The multilayer wiring structure 12 has a layered structure in which multiple insulating layers are layered and includes multiple wiring layers selectively formed within the multiple insulating layers.

In this configuration, the multilayer wiring structure 12 includes a first insulating layer 13, a second insulating layer 14, a third insulating layer 15 (an example of the first insulating layer of the present invention), and a fourth insulating layer 16 (an example of the second insulating layer of the present invention) that are layered in this order from the first principal surface 3 side of the semiconductor layer 2.

The number of laminations of the insulating layers in the multilayer wiring structure 12 is arbitrary and is not restricted to the number of laminations shown in FIG. 2. The multilayer wiring structure 12 may thus include less than four insulating layers or may include five or more insulating layers.

The first to fourth insulating layers 13 to 16 have their respective principal surfaces. The principal surfaces of the first to fourth insulating layers 13 to 16 are formed flatly. The principal surfaces of the first to fourth insulating layers 13 to 16 extend parallel to the first principal surface 3 of the semiconductor layer 2, respectively. The principal surfaces of the first to fourth insulating layers 13 to 16 may respectively be ground surfaces. That is, the principal surfaces of the first to fourth insulating layers 13 to 16 may each have a grinding mark.

The first to fourth insulating layers 13 to 16 may each have a layered structure that includes a silicon oxide film and a silicon nitride film. In this case, the silicon nitride film may be formed on the silicon oxide film or the silicon oxide film may be formed on the silicon nitride film.

The first to fourth insulating layers 13 to 16 may each have a single-layer structure that includes a silicon oxide film or a silicon nitride film. The first to fourth insulating layers 13 to 16 may be formed of the same type of insulating material or may be formed of different types of insulating materials. The first to fourth insulating layers 13 to 16 are preferably formed of the same type of insulating material. In this configuration, the first to fourth insulating layers 13 to 16 each have a single-layer structure made of a silicon oxide film.

The first to fourth insulating layers 13 to 16 may each have a thickness TI not less than 100 nm and not more than 3500 nm. The thickness TI may each be not less than 100 nm and not more than 500 nm, not less than 500 nm and not more than 1000 nm, not less than 1000 nm and not more than 1500 nm, not less than 1500 nm and not more than 2000 nm, not less than 2000 nm and not more than 2500 nm, not less than 2500 nm and not more than 3000 nm, or not less than 3000 nm and not more than 3500 nm. The thickness TI is preferably not less than 100 nm and not more than 1500 nm. The first to fourth insulating layers 13 to 16 may have the same thickness or may have their respective different thicknesses.

In this configuration, the multilayer wiring structure 12 includes a connection circuit forming layer 21 and a resistance circuit forming layer 22 that are formed in mutually different layers.

The connection circuit forming layer 21 is formed on the first principal surface 3 side of the semiconductor layer 2. The connection circuit forming layer 21 includes the first insulating layer 13 and the second insulating layer 14. The connection circuit forming layer 21 is intended for electrical connection between the device forming region 6 (functional device) and the outer region 7 (resistance circuit 11). The specific structure of the connection circuit forming layer 21 shall be discussed below.

The resistance circuit forming layer 22 is formed on the connection circuit forming layer 21. The resistance circuit forming layer 22 includes the third insulating layer 15 and the fourth insulating layer 16. The resistance circuit forming layer 22 is intended for formation of the resistance circuit 11 (resistance layer 10) in the outer region 7.

Referring to FIG. 2, the resistance circuit 11 includes a first via electrode 23 and a second via electrode 24. The first via electrode 23 is embedded in the third insulating layer 15 and exposed from the principal surface of the third insulating layer 15. The second via electrode 24 is embedded in the third insulating layer 15 in a manner spaced from the first via electrode 23 and exposed from the principal surface of the third insulating layer 15.

Referring to FIG. 1, in this configuration, the first via electrode 23 is formed in a circular shape in plan view. The planar shape of the first via electrode 23 is arbitrary. The first via electrode 23 may be formed in a polygonal shape, such as a triangular shape, a quadrilateral shape, or a hexagonal shape, etc., or in an elliptical shape in plan view instead of a circular shape.

Referring to FIG. 3, the first via electrode 23 includes a first end portion 23a on one side and a second end portion 23b on the other side in a direction normal to the principal surface of the third insulating layer 15. The first end portion 23a of the first via electrode 23 is exposed from the principal surface of the third insulating layer 15. The second end portion 23b of the first via electrode 23 is positioned within the third insulating layer 15. The first via electrode 23 is formed in a tapered shape with the width narrowed from the first end portion 23a toward the second end portion 23b in sectional view.

In this configuration, the first end portion 23a of the first via electrode 23 includes a first projecting portion 23c projecting from the principal surface of the third insulating layer 15 toward the fourth insulating layer 16. The first projecting portion 23c is formed by the principal surface and the side surfaces of the first via electrode 23.

The first via electrode 23 has a layered structure that includes a main body layer 25 and a barrier layer 26. The main body layer 25 is embedded in the third insulating layer 15. The main body layer 25 may contain tungsten (W) or copper (Cu). In this configuration, the main body layer 25 has a single-layer structure made of a tungsten layer 27.

The barrier layer 26 is interposed between the third insulating layer 15 and the main body layer 25. In this configuration, the barrier layer 26 has a layered structure in which multiple electrode layers are layered. In this configuration, the barrier layer 26 includes a Ti layer 28 and a TiN layer 29 that are formed in this order from the third insulating layer 15.

The Ti layer 28 is in contact with the third insulating layer 15. The TiN layer 29 is in contact with the main body layer 25. The barrier layer 26 may have a single-layer structure in which either the Ti layer 28 or the TiN layer 29 is included.

Referring to FIG. 1, in this configuration, the second via electrode 24 is formed in a circular shape in plan view. The planar shape of the second via electrode 24 is arbitrary. The second via electrode 24 may be formed in a polygonal shape, such as a triangular shape, a quadrilateral shape, or a hexagonal shape, etc., or in an elliptical shape in plan view instead of a circular shape.

Referring to FIG. 4, the second via electrode 24 includes a first end portion 24a on one side and a second end portion 24b on the other side in a direction normal to the principal surface of the third insulating layer 15. The first end portion 24a of the second via electrode 24 is exposed from the principal surface of the third insulating layer 15. The second end portion 24b of the second via electrode 24 is positioned within the third insulating layer 15. The second via electrode 24 is formed in a tapered shape with the width narrowed from the first end portion 24a toward the second end portion 24b in sectional view.

In this configuration, the first end portion 24a of the second via electrode 24 includes a second projecting portion 24c projecting from the principal surface of the third insulating layer 15 toward the fourth insulating layer 16. The second projecting portion 24c is formed by the principal surface and the side surfaces of the second via electrode 24.

The second via electrode 24 has a layered structure that includes a main body layer 30 and a barrier layer 31. The main body layer 30 is embedded in the third insulating layer 15. The main body layer 30 may contain tungsten (W) or copper (Cu). In this configuration, the main body layer 30 has a single-layer structure made of a tungsten layer 32.

The barrier layer 31 is interposed between the third insulating layer 15 and the main body layer 30. In this configuration, the barrier layer 31 has a layered structure in which multiple electrode layers are layered. In this configuration, the barrier layer 31 includes a Ti layer 33 and a TiN layer 34 that are formed in this order from the third insulating layer 15.

The Ti layer 33 is in contact with the third insulating layer 15. The TiN layer 34 is in contact with the main body layer 30. The barrier layer 31 may have a single-layer structure in which either the Ti layer 33 or the TiN layer 34 is included.

Referring to FIGS. 2 to 4, the resistance layer 10 of the resistance circuit 11 is interposed in the region between the third insulating layer 15 and the fourth insulating layer 16. More specifically, the resistance layer 10 is formed in a film shape on the principal surface of the third insulating layer 15.

The resistance layer 10 occupies the principal surface of the third insulating layer 15. No film-shaped (layered) wiring layer other than the resistance layer 10 is formed on the principal surface of the third insulating layer 15 in the device forming region 6 and in the outer region 7. The principal surface of the third insulating layer 15 is provided to form the resistance layer 10 thereon.

By arranging the resistance layer 10 in the outer region 7, the electrical influence of the resistance layer 10 on the device forming region 6 is suppressed and also the electrical influence of the device forming region 6 on the resistance layer 10 is suppressed.

As an example, by arranging the resistance layer 10 in the outer region 7, the parasitic capacitance between the device forming region 6 and the resistance layer 10 can be suppressed. That is, the Q value of the electronic circuit can be increased to reduce noise.

Referring to FIG. 5, the resistance layer 10 is formed so as to straddle the first via electrode 23 and the second via electrode 24 and electrically connected to the first via electrode 23 and the second via electrode 24.

In this configuration, the resistance layer 10 is formed in a quadrilateral shape (more specifically, a rectangular shape) having a first side 8A, a second side 8B, a third side 8C, and a fourth side 8D in plan view.

The resistance layer 10 includes a first end portion 10a on one side, a second end portion 10b on the other side, and a connection portion 10c that connects the first end portion 10a and the second end portion 10b. The first end portion 10a of the resistance layer 10 is formed by the first side 8A, the third side 8C, and the fourth side 8D and covers the first via electrode 23. More specifically, the first end portion 10a covers the first end portion 23a (first projecting portion 23c) of the first via electrode 23. The first end portion 10a is formed in a film shape along the principal surface and the side surface of the first via electrode 23.

The second end portion 10b of the resistance layer 10 is formed by the second side 8B, the third side 8C, and the fourth side 8D and covers the second via electrode 24. More specifically, the second end portion 10b covers the first end portion 24a (second projecting portion 24c) of the second via electrode 24. The second end portion 10b is formed in a film shape along the principal surface and the side surface of the second via electrode 24.

The connection portion 10c extends in a band shape through a region between the first end portion 10a and the second end portion 10b and covers a central portion of the resistance layer 10 in the direction in which the first end portion 10a and the second end portion 10b face each other. The connection portion 10c extends in a band shape along a straight line connecting the first end portion 10a and the second end portion 10b. In this configuration, the first end portion 10a, the second end portion 10b, and the connection portion 10c of the resistance layer 10 are each formed with a uniform width.

The first via electrode 23 is connected to the resistance layer 10 through multiple contact portions in the first end portion 10a. The multiple contact portions 9a, 9b includes a first contact portion 9a and a second contact portion 9b. In the present preferred embodiment, four first via electrodes 23 are provided, and contact portions of two first via electrodes 23 among four serve as the first contact portion 9a, while contact portions of the other two first via electrodes 23 serve as the second contact portion 9b.

The first contact portion 9a and the second contact portion 9b are arranged along the first side 8A in a manner spaced from each other. From the third side 8C toward the fourth side 8D, two first contact portions 9a are arranged and two second contact portions 9b are continuously arranged.

A distance L1 between the multiple first contact portions 9a and the multiple second contact portions 9b is greater than a distance L2a between the adjacent first contact portions 9a and a distance L2b between the adjacent second contact portions 9b. A region 18 between the multiple first contact portions 9a and the multiple second contact portions 9b may be referred to as a trimmed region 18 in which a notched portion is formed to adjust the resistance value of the resistance layer 10.

The second via electrode 24 is connected to the resistance layer 10 through multiple contact portions in the second end portion 10b. The multiple contact portions 17a, 17b includes a third contact portion 17a and a fourth contact portion 17b. In the present preferred embodiment, four second via electrodes 24 are provided, and contact portion of two second via electrodes 24 among four serve as the third contact portion 17a, while contact portions of the other two second via electrodes 24 serve as the fourth contact portion 17b.

The third contact portion 17a and the fourth contact portion 17b are arranged along the second side 8B in a manner spaced from each other. From the third side 8C toward the fourth side 8D, two third contact portions 17a are arranged and two fourth contact portions 17b are continuously arranged.

A distance L3 between the multiple third contact portions 17a and the multiple fourth contact portions 17b is greater than a distance L4a between the adjacent third contact portions 17a and a distance L4b between the adjacent fourth contact portions 17b. A region 19 between the multiple third contact portions 17a and the multiple fourth contact portions 17b may be referred to as a trimmed region 19 in which a notched portion is formed to adjust the resistance value of the resistance layer 10.

Also, the third contact portions 17a face the first contact portions 9a in a one-to-one relationship in the direction in which the first end portion 10a and the second end portion 10b face each other. On the other hand, the fourth contact portions 17b face the second contact portions 9b in a one-to-one relationship in the direction in which the first end portion 10a and the second end portion 10b face each other.

A notched portion 110 is formed in the resistance layer 10. In this example, the notched portion 110 extends linearly from the first side 8A to the second side 8B of the resistance layer 10 in the trimmed region 18. The notched portion 110 is opened at the end portion on the first side 8A, while being closed at the opposite end portion (leading end portion). The notched portion 110 is formed at least, for example, in the first end portion 10a of the resistance layer 10 and the leading end portion may reach the connection portion 10c, as shown in FIG. 5.

The notched portion 110 is a laser beam processing mark after a partial region of the resistance layer 10 is fusion cut by a laser beam irradiation method. The notched portion 110 reduces the area of the current path in the resistance layer 10. This causes the resistance layer 10 to have an increased resistance value. That is, the resistance value of the resistance layer 10 can be adjusted by forming the notched portion 110.

Particularly, according to this first configuration example, the notched portion 110 for adjusting the resistance value of the resistance layer 10 is formed in the trimmed region 18 between the multiple first contact portions 9a and the multiple second contact portions 9b. In the resistance layer 10, the principal path for the current flowing between the first via electrodes 23 and the second via electrodes 24 is in the direction from the multiple contact portions 9a, 9b toward the multiple contact portions 17a, 17b or in the direction from the multiple contact portions 17a, 17b toward the multiple contact portions 9a, 9b, as indicated by arrows 20 in FIG. 5. That is, the notched portion 110 is spaced away from the principal path 20 for the current flowing in the resistance layer 10. Therefore, the variation in the resistance value is reduced due to formation of the notched portion 110, and the resistance value of the resistance layer 10 can thereby be adjusted with a high degree of accuracy.

Further, in this example, since the notched portion 110 is formed in the first end portion 10a of the resistance layer 10 and in a portion (in the present preferred embodiment, the connection portion 10c) of the resistance layer 10 sandwiched between the first end portion 10a and the second end portion 10b, there is no need to separately form a region bypassing the principal path 20.

For example, it is also contemplated that a portion of the third side 8C of the resistance layer 10 is projected to provide a projecting portion 35 bypassing the principal path 20 and a notched portion 110' is formed in the projecting portion 35. Even with such an arrangement, the resistance value of the resistance layer 10 might be adjusted with a high degree of accuracy because the projecting portion 35 is spaced away from the principal path 20.

Such an arrangement in which the projecting portion 35 is provided, however, would require space to form the projecting portion 35, having an impact on the miniaturization of the device. On the other hand, according to this arrangement of the present preferred embodiment, since the notched portion 110 is formed in one of the existing portions of the resistance layer 10 that is considered to have a relatively low current density, the resistance value of the resistance layer 10 can be adjusted with a high degree of accuracy while efficiently utilizing the space.

The resistance layer 10 in which the notched portion 110 is formed may have a sheet resistance value not less than 100Ω/□ and not more than 50000Ω/□. The sheet resistance value of the resistance layer 10 may be not less than 100Ω/□ and not more than 5000Ω/□, not less than 5000Ω/□ and not more than 10000Ω/□, not less than 10000Ω/□ and not more than 15000Ω/□, not less than 15000Ω/□ and not more than 20000Ω/□, not less than 20000Ω/□ and not more than 25000Ω/□, not less than 25000Ω/□ and not more than 30000Ω/□, not less than 30000Ω/□ and not more than 35000Ω/□, not less than 35000Ω/□ and not more than 40000Ω/□, not less than 40000Ω/□ and not more than 45000Ω/□, or not less than 45000Ω/□ and not more than 50000 Ω/□.

The resistance layer 10 is preferably made of a metal thin film containing at least one of CrSi (chromium silicon alloy), TaN (tantalum nitride), and TiN (titanium nitride). In particular, the metal thin film preferably contains CrSi. The metal thin film may have a single-layer structure made of a CrSi film, a TaN film, or a TiN film. In this configuration, the metal thin film has a single-layer structure made of a CrSi film.

The metal thin film may have a layered structure that includes a CrSi film and a TaN film layered in any order. The metal thin film may have a layered structure that includes a CrSi film and a TiN film layered in any order.

The metal thin film may have a layered structure that includes a TaN film and a TiN film layered in any order. The metal thin film may have a layered structure that includes a CrSi film, a TaN film, and a TiN film layered in any order.

The Cr content with respect to the total weight of the resistance layer 10 may be not less than 5 wt % and not more than 50 wt %. The Cr content may be not less than 5 wt % and not more than 10 wt %, not less than 10 wt % and not more than 15 wt %, not less than 15 wt % and not more than 20 wt %, not less than 20 wt % and not more than 25 wt %, not less than 25 wt % and not more than 30 wt %, not less than 30 wt % and not more than 35 wt %, not less than 35 wt % and not more than 40 wt %, not less than 40 wt % and not more than 45 wt %, or not less than 45 wt % and not more than 50 wt %.

The resistance layer 10 has a thickness TR smaller than the thickness TI of the third insulating layer 15 (TR<TI). The ratio TR/TI of the thickness TR of the resistance layer 10 to the thickness TI of the third insulating layer 15 may be not less than 0.001 and not more than 0.01. The ratio TR/TI may be not less than 0.001 and not more than 0.002, not less than 0.002 and not more than 0.004, not less than 0.004 and not more than 0.006, not less than 0.006 and not more than 0.008, or not less than 0.008 and not more than 0.01.

The thickness TR may be not less than 0.1 nm and not more than 100 nm. It may be not less than 0.1 nm and not more than 10 nm, not less than 10 nm and not more than 20 nm, not less than 20 nm and not more than 30 nm, not less than 30 nm and not more than 40 nm, not less than 40 nm and not more than 50 nm, not less than 50 nm and not more than 60 nm, not less than 60 nm and not more than 70 nm, not less than 70 nm and not more than 80 nm, not less than 80 nm and not more than 90 nm, or not less than 90 nm and not more than 100 nm. The thickness TR is preferably not less than 1 nm and not more than 20 nm.

Figure 6:
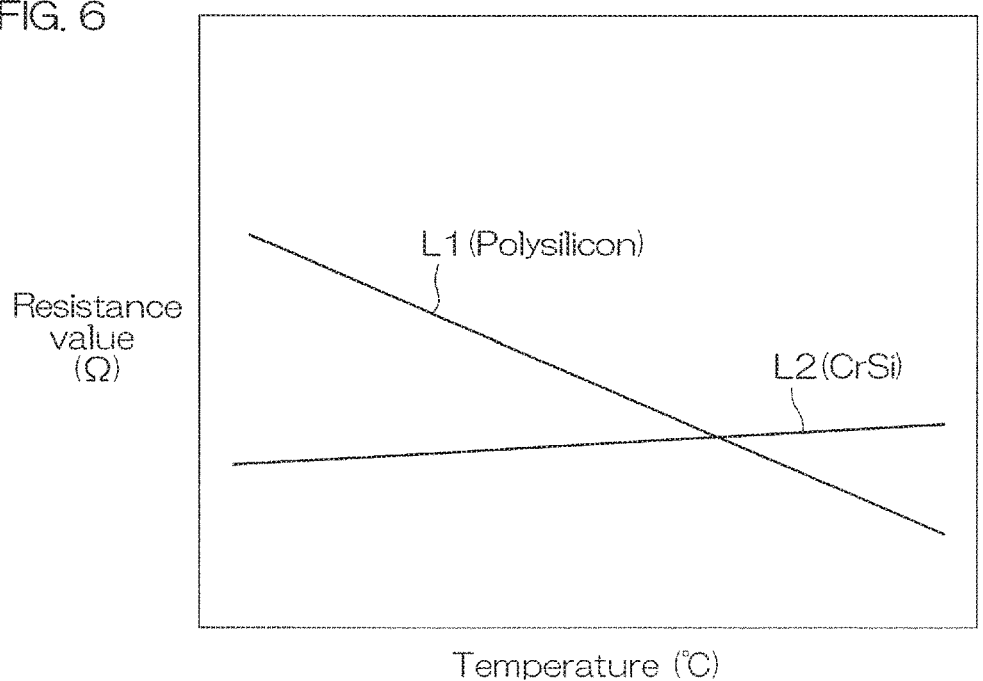
FIG. 6 is a graph for illustrating temperature characteristics of the resistance layer.

FIG. 6 is a graph for illustrating temperature characteristics of the resistance layer 10. In the graph of FIG. 6, the vertical axis represents the resistance value (Q), while the horizontal axis represents the temperature (° C.).

A first line L1 and a second line L2 are shown in FIG. 6. The first line L1 shows characteristics in a case where the resistance layer 10 contains conductive polysilicon. The second line L2 shows characteristics in a case where the resistance layer 10 contains CrSi.

Referring to the first line L1, in the case of the resistance layer 10 containing conductive polysilicon, the sheet resistance value monotonously decreased with temperature rise. It was found that the resistance layer 10 containing conductive polysilicon has a relatively high variability rate with respect to temperature rise. On the other hand, referring to the second line L2, in the case of the resistance layer 10 made of a metal thin film containing CrSi, it was found that the variability rate of the sheet resistance value with temperature rise is lower than the variability rate of the sheet resistance value of the first line L1.

That is, CrSi has a relatively small temperature dependence compared to polysilicon and has a sheet resistance value superior to the sheet resistance of polysilicon. Also, CrSi has a relatively small voltage dependence compared to polysilicon, although not shown.

Accordingly, by employing CrSi as the resistance layer 10, the planar area of the resistance layer 10 can be adequately reduced while adequately reducing the thickness of the resistance layer 10. It is thereby possible to adequately interpose the resistance layer 10 in the region between the third insulating layer 15 and the fourth insulating layer 16 while ensuring flatness.

In addition, since the planar area of the resistance layer 10 can be adequately reduced, design rules for the resistance layer 10 can also be eased. That is, the resistance layer 10 can be adequately arranged, not in the device forming region 6, but in the outer region 7. The mutual electrical influences between the resistance layer 10 and the device forming region 6 can thus be adequately suppressed. The same effects as above can be exhibited even when the resistance layer 10 contains TaN and/or TiN in addition to or in place of CrSi.

The resistance circuit 11 further includes a protective layer 40 that protects the resistance layer 10. The protective layer 40 is interposed in the region between the third insulating layer 15 and the fourth insulating layer 16 and covers the resistance layer 10. The protective layer 40 is formed in a film shape along the resistance layer 10.

The protective layer 40 has a planar shape matching the planar shape of the resistance layer 10. The protective layer 40 has side surfaces continuous with the side surfaces of the resistance layer 10. That is, the side surfaces of the protective layer 40 are formed flush with the side surfaces of the resistance layer 10.

The protective layer 40 may have a layered structure that includes a silicon oxide film and a silicon nitride film. In this case, the silicon nitride film may be formed on the silicon oxide film or the silicon oxide film may be formed on the silicon nitride film. The protective layer 40 may have a single-layer structure including a silicon oxide film or a silicon nitride film. In this configuration, the protective layer 40 has a single-layer structure made of a silicon oxide film.

The resistance circuit 11 further includes a first lower wiring layer 41 and a second lower wiring layer 42. The first lower wiring layer 41 is formed in a region of the third insulating layer 15 side with respect to the resistance layer 10. More specifically, the first lower wiring layer 41 is formed on the connection circuit forming layer 21 (second insulating layer 14) and covered with the third insulating layer 15. In other words, the first lower wiring layer 41 is embedded in the third insulating layer 15. The first lower wiring layer 41 is electrically connected to the resistance layer 10 through the first via electrode 23.

The second lower wiring layer 42 is formed in a region of the third insulating layer 15 side with respect to the resistance layer 10. More specifically, the second lower wiring layer 42 is formed on the connection circuit forming layer 21 (second insulating layer 14) and covered with the third insulating layer 15. In other words, the second lower wiring layer 42 is embedded in the third insulating layer 15. The second lower wiring layer 42 is formed in a manner spaced from the first lower wiring layer 41. The second lower wiring layer 42 is electrically connected to the resistance layer 10 through the second via electrode 24.

The resistance layer 10 is thus connected in series to the first lower wiring layer 41 and the second lower wiring layer 42. The connection portion 10c of the resistance layer 10 extends through a region between the first lower wiring layer 41 and the second lower wiring layer 42 in plan view.

The first lower wiring layer 41 and the second lower wiring layer 42 each have a first thickness TL1. The first thickness TL1 may be not less than 100 nm and not more than 3000 nm. The first thickness TL1 may be not less than 100 nm and not more than 500 nm, not less than 500 nm and not more than 1000 nm, not less than 1000 nm and not more than 1500 nm, not less than 1500 nm and not more than 2000 nm, not less than 2000 nm and not more than 2500 nm, or not less than 2500 nm and not more than 3000 nm.

The first thickness TL1 is preferably not less than 100 nm and not more than 1500 nm. The first thickness TL1 of the first lower wiring layer 41 and the first thickness TL1 of the second lower wiring layer 42 may differ from each other. The first thickness TL1 of the first lower wiring layer 41 and the first thickness TL1 of the second lower wiring layer 42 is preferably the same.

Referring to FIGS. 1 and 3, the first lower wiring layer 41 includes a first end portion 41a on one side, a second end portion 41b on the other side, and a connection portion 41c that connects the first end portion 41a and the second end portion 41b.

The first end portion 41a of the first lower wiring layer 41 overlaps the first end portion 10a of the resistance layer 10 in plan view. The first end portion 41a of the first lower wiring layer 41 is electrically connected to the first end portion 10a of the resistance layer 10 through the first via electrode 23.

The second end portion 41b of the first lower wiring layer 41 is positioned in a region outside the resistance layer 10 in plan view. In this configuration, the second end portion 41b of the first lower wiring layer 41 is positioned in the outer region 7.

The connection portion 41c of the first lower wiring layer 41 extends in a band shape through a region between the first end portion 41a and the second end portion 41b in plan view. In this configuration, the connection portion 41c of the first lower wiring layer 41 extends in a band shape along a straight line connecting the first end portion 41a and the second end portion 41b.

In this configuration, the first lower wiring layer 41 has a layered structure in which multiple electrode layers are layered. More specifically, the first lower wiring layer 41 includes a first barrier layer 43, a main body layer 44, and a second barrier layer 45 that are layered in this order from the top of the connection circuit forming layer 21 (second insulating layer 14).

In this configuration, the first barrier layer 43 has a layered structure including a Ti layer 46 and a TiN layer 47 that are layered in this order from the top of the connection circuit forming layer 21 (second insulating layer 14). The first barrier layer 43 may have a single-layer structure in which either the Ti layer 46 or the TiN layer 47 is included.

The main body layer 44 has a resistance value smaller than the resistance value of the first barrier layer 43 and the resistance value of the second barrier layer 45. The main body layer 44 has a thickness greater than the thickness of the first barrier layer 43 and the thickness of the second barrier layer 45.

The main body layer 44 may include at least one type of substance among aluminum (Al), copper (Cu), aluminum-silicon-copper alloy (Al—Si—Cu alloy), aluminum-silicon alloy (Al—Si alloy), and aluminum-copper alloy (Al—Cu alloy). In this configuration, the main body layer 44 has a single-layer structure made of an AlCu alloy layer 48.

In this configuration, the second barrier layer 45 has a layered structure including a Ti layer 49 and a TiN layer 50 that are layered in this order from the top of the main body layer 44. The second barrier layer 45 may have a single-layer structure in which either the Ti layer 49 or the TiN layer 50 is included.

Referring to FIGS. 1 and 4, the second lower wiring layer 42 includes a first end portion 42a on one side, a second end portion 42b on the other side, and a connection portion 42c that connects the first end portion 42a and the second end portion 42b.

The first end portion 42a of the second lower wiring layer 42 overlaps the second end portion 10b of the resistance layer 10 in plan view. The first end portion 42a of the second lower wiring layer 42 is electrically connected to the second end portion 10b of the resistance layer 10 through the second via electrode 24.

The second end portion 42b of the second lower wiring layer 42 is positioned in a region outside the resistance layer 10 in plan view. In this configuration, the second end portion 41b of the first lower wiring layer 41 is positioned in the outer region 7.

The connection portion 42c of the second lower wiring layer 42 extends in a band shape through a region between the first end portion 42a and the second end portion 42b in plan view. In this configuration, the connection portion 42c of the second lower wiring layer 42 extends in a band shape along a straight line connecting the first end portion 42a and the second end portion 42b.

In this configuration, the second lower wiring layer 42 has a layered structure in which multiple electrode layers are layered. More specifically, the second lower wiring layer 42 includes a first barrier layer 53, a main body layer 54, and a second barrier layer 55 that are layered in this order from the top of the connection circuit forming layer 21 (second insulating layer 14).

In this configuration, the first barrier layer 53 has a layered structure including a Ti layer 56 and a TiN layer 57 that are layered in this order from the top of the connection circuit forming layer 21 (second insulating layer 14). The first barrier layer 53 may have a single-layer structure in which either the Ti layer 56 or the TiN layer 57 is included.

The main body layer 54 has a resistance value smaller than the resistance value of the first barrier layer 53 and the resistance value of the second barrier layer 55. The main body layer 54 has a thickness greater than the thickness of the first barrier layer 53 and the thickness of the second barrier layer 55.

The main body layer 54 may include at least one type of substance among aluminum (Al), copper (Cu), aluminum-silicon-copper alloy (Al—Si—Cu alloy), aluminum-silicon alloy (Al—Si alloy), and aluminum-copper alloy (Al—Cu alloy). In this configuration, the main body layer 54 has a single-layer structure made of an AlCu alloy layer 58.

In this configuration, the second barrier layer 55 has a layered structure including a Ti layer 59 and a TiN layer 60 that are layered in this order from the top of the main body layer 54. The second barrier layer 55 may have a single-layer structure in which either the Ti layer 59 or the TiN layer 60 is included.

The resistance circuit 11 further includes a first upper wiring layer 61 and a second upper wiring layer 62. The first upper wiring layer 61 is formed on the third insulating layer 15. The first upper wiring layer 61 forms one of the uppermost wiring layers of the multilayer wiring structure 12. The first upper wiring layer 61 is electrically connected to the first lower wiring layer 41.

The second upper wiring layer 62 is formed on the third insulating layer 15 in a manner spaced from the first upper wiring layer 61. The second upper wiring layer 62 forms one of the uppermost wiring layers of the multilayer wiring structure 12. The second upper wiring layer 62 is electrically connected to the second lower wiring layer 42.

The resistance layer 10 is thus electrically connected to the first upper wiring layer 61 through the first lower wiring layer 41. The resistance layer 10 is also electrically connected to the second upper wiring layer 62 through the second lower wiring layer 42. The resistance layer 10 is connected in series to the first upper wiring layer 61 and the second upper wiring layer 62 through the first lower wiring layer 41 and the second lower wiring layer 42.

The first upper wiring layer 61 is formed in a manner spaced from the resistance layer 10 in plan view. The first upper wiring layer 61 does not overlap the resistance layer 10 in plan view. An entirety of the resistance layer 10 is exposed from the first upper wiring layer 61 in plan view.

The second upper wiring layer 62 is formed in a manner spaced from the resistance layer 10 in plan view. The second upper wiring layer 62 does not overlap the resistance layer 10 in plan view. The entirety of the resistance layer 10 is exposed from the second upper wiring layer 62 in plan view.

That is, the resistance layer 10 is formed in a region between the first upper wiring layer 61 and the second upper wiring layer 62 in plan view. It is thereby possible to suppress the parasitic capacitance in the region between the resistance layer 10 and the first upper wiring layer 61. Also, it is possible to suppress the parasitic capacitance in the region between the resistance layer 10 and the second upper wiring layer 62.

In this configuration, the resistance layer 10 is formed in a manner spaced from the first upper wiring layer 61 and the second upper wiring layer 62 in plan view. It is thereby possible to adequately suppress the parasitic capacitance in the region between the resistance layer 10 and the first upper wiring layer 61.

The first upper wiring layer 61 and the second upper wiring layer 62 each have a second thicknesses TL2. The second thickness TL2 is not less than the first thickness TL1 (TL1 TL2). More specifically, the second thickness TL2 is greater than the first thickness TL1 (TL1<TL2).

The second thickness TL2 may be not less than 100 nm and not more than 15000 nm. The second thickness TL2 may be not less than 100 nm and not more than 1500 nm, not less than 1500 nm and not more than 3000 nm, not less than 3000 nm and not more than 4500 nm, not less than 4500 nm and not more than 6000 nm, not less than 6000 nm and not more than 7500 nm, not less than 7500 nm and not more than 9000 nm, not less than 9000 nm and not more than 10500 nm, not less than 10500 nm and not more than 12000 nm, not less than 12000 nm and not more than 13500 nm, or not less than 13500 nm and not more than 15000 nm.

The second thickness TL2 of the first upper wiring layer 61 and the second thickness TL2 of the second upper wiring layer 62 may differ from each other. The second thickness TL2 of the first upper wiring layer 61 and the second thickness TL2 of the second upper wiring layer 62 is preferably the same.

Referring to FIGS. 1 and 3, the first upper wiring layer 61 includes a first end portion 61a on one side, a second end portion 61b on the other side, and a connection portion 61c that connects the first end portion 61a and the second end portion 61b.

The first end portion 61a of the first upper wiring layer 61 is positioned in a region overlapping the first end portion 41a of the first lower wiring layer 41 in plan view. The second end portion 61b of the first upper wiring layer 61 is positioned in a region outside the resistance layer 10 in plan view.

In this configuration, the second end portion 61b of the first upper wiring layer 61 is positioned in the device forming region 6 in plan view. As a matter of course, the second end portion 61b of the first upper wiring layer 61 may be positioned in the outer region 7.

The connection portion 61c of the first upper wiring layer 61 extends in a band shape through a region between the first end portion 61a and the second end portion 61b in plan view. In this configuration, the connection portion 61c of the first upper wiring layer 61 extends in a band shape along a straight line connecting the first end portion 61a and the second end portion 61b.

In this configuration, the first upper wiring layer 61 has a layered structure in which multiple electrode layers are layered. More specifically, the first upper wiring layer 61 includes a first barrier layer 63, a main body layer 64, and a second barrier layer 65 that are layered in this order from the top of the connection circuit forming layer 21 (second insulating layer 14).

In this configuration, the first barrier layer 63 has a layered structure including a Ti layer 66 and a TiN layer 67 that are layered in this order from the top of the connection circuit forming layer 21 (second insulating layer 14). The first barrier layer 63 may have a single-layer structure in which either the Ti layer 66 or the TiN layer 67 is included.

The main body layer 64 has a resistance value smaller than the resistance value of the first barrier layer 63 and the resistance value of the second barrier layer 65. The main body layer 64 has a thickness greater than the thickness of the first barrier layer 63 and the thickness of the second barrier layer 65.

The main body layer 64 may include at least one type of substance among aluminum (Al), copper (Cu), aluminum-silicon-copper alloy (Al—Si—Cu alloy), aluminum-silicon alloy (Al—Si alloy), and aluminum-copper alloy (Al—Cu alloy). In this configuration, the main body layer 64 has a single-layer structure made of an AlCu alloy layer 68.

In this configuration, the second barrier layer 65 has a layered structure including a Ti layer 69 and a TiN layer 70 that are layered in this order from the top of the main body layer 64. The second barrier layer 65 may have a single-layer structure in which either the Ti layer 69 or the TiN layer 70 is included.

Referring to FIGS. 1 and 4, the second upper wiring layer 62 includes a first end portion 62a on one side, a second end portion 62b on the other side, and a connection portion 62c that connects the first end portion 62a and the second end portion 62b.

The first end portion 62a of the second upper wiring layer 62 is positioned in a region overlapping the second end portion 42a of the second lower wiring layer 42 in plan view. The second end portion 62b of the second upper wiring layer 62 is positioned in a region outside the resistance layer 10 in plan view.

In this configuration, the second end portion 62b of the second upper wiring layer 62 is positioned in the device forming region 6 in plan view. As a matter of course, the second end portion 62b of the second upper wiring layer 62 may be positioned in the outer region 7 in plan view.

The connection portion 62c of the second upper wiring layer 62 extends in a band shape through a region between the first end portion 62a and the second end portion 62b in plan view. In this configuration, the connection portion 62c of the second upper wiring layer 62 extends in a band shape along a straight line connecting the first end portion 62a and the second end portion 62b.

In this configuration, the second upper wiring layer 62 has a layered structure in which multiple electrode layers are layered. More specifically, the second upper wiring layer 62 includes a first barrier layer 73, a main body layer 74, and a second barrier layer 75 that are layered in this order from the top of the connection circuit forming layer 21 (second insulating layer 14).

In this configuration, the first barrier layer 73 has a layered structure including a Ti layer 76 and a TiN layer 77 that are layered in this order from the top of the connection circuit forming layer 21 (second insulating layer 14). The first barrier layer 73 may have a single-layer structure in which either the Ti layer 76 or the TiN layer 77 is included.

The main body layer 74 has a resistance value smaller than the resistance value of the first barrier layer 73 and the resistance value of the second barrier layer 75. The main body layer 74 has a thickness greater than the thickness of the first barrier layer 73 and the thickness of the second barrier layer 75.

The main body layer 74 may include at least one type of substance among aluminum (Al), copper (Cu), aluminum-silicon-copper alloy (Al—Si—Cu alloy), aluminum-silicon alloy (Al—Si alloy), and aluminum-copper alloy (Al—Cu alloy). In this configuration, the main body layer 74 has a single-layer structure made of an AlCu alloy layer 78.

In this configuration, the second barrier layer 75 has a layered structure including a Ti layer 79 and a TiN layer 80 that are layered in this order from the top of the main body layer 74. The second barrier layer 75 may have a single-layer structure in which either the Ti layer 79 or the TiN layer 80 is included.

The resistance circuit 11 further includes a first long via electrode 83 and a second long via electrode 84. The first long via electrode 83 is formed at a side of the resistance layer 10. The first long via electrode 83 traverses the resistance layer 10 in the direction normal to the principal surface of the third insulating layer 15. The first long via electrode 83 penetrates through the third insulating layer 15 and the fourth insulating layer 16 to be embedded in the third insulating layer 15 and the fourth insulating layer 16 and is exposed from the principal surface of the fourth insulating layer 16.

The second long via electrode 84 is formed at a side of the resistance layer 10 in a manner spaced from the first long via electrode 83. The second long via electrode 84 traverses the resistance layer 10 in the direction normal to the principal surface of the third insulating layer 15. The second long via electrode 84 penetrates through the third insulating layer 15 and the fourth insulating layer 16 to be embedded in the third insulating layer 15 and the fourth insulating layer 16 and is exposed from the principal surface of the fourth insulating layer 16.

The first long via electrode 83 is electrically connected to the first lower wiring layer 41 and the first upper wiring layer 61. The second long via electrode 84 is electrically connected to the second lower wiring layer 42 and the second upper wiring layer 62.

That is, the resistance layer 10 is electrically connected to the first lower wiring layer 41 and the first upper wiring layer 61 through the first long via electrode 83. The resistance layer 10 is also electrically connected to the second lower wiring layer 42 and the second upper wiring layer 62 through the second long via electrode 84.

Referring to FIGS. 1 and 2, in this configuration, the first long via electrode 83 is positioned on a straight line connecting the first via electrode 23 and the second via electrode 24. In this configuration, the second long via electrode 84 faces the first long via electrode 83 with the resistance layer 10 therebetween. The second long via electrode 84 is positioned on a straight line connecting the first via electrode 23 and the second via electrode 24.

In this configuration, the resistance layer 10 is positioned on a straight line connecting the first long via electrode 83 and the second long via electrode 84. That is, the resistance layer 10, the first via electrode 23, the second via electrode 24, the first long via electrode 83, and the second long via electrode 84 are positioned on the same straight line. In this configuration, the resistance layer 10 extends along a straight line connecting the first long via electrode 83 and the second long via electrode 84.

Referring to FIG. 1, in this configuration, the first long via electrode 83 is formed in a circular shape in plan view. The planar shape of the first long via electrode 83 is arbitrary. The first long via electrode 83 may be formed in a polygonal shape, such as a triangular shape, a quadrilateral shape, or a hexagonal shape, etc., or in an elliptical shape in plan view instead of a circular shape.

Referring to FIG. 3, the first long via electrode 83 includes a first end portion 83a on one side and a second end portion 83b on the other side in a direction normal to the principal surface of the third insulating layer 15. The first end portion 83a of the first long via electrode 83 is exposed from the principal surface of the fourth insulating layer 16.

The second end portion 83b of the first long via electrode 83 is positioned within the third insulating layer 15. The first long via electrode 83 is formed in a tapered shape with the width narrowed from the first end portion 83a toward the second end portion 83b in sectional view.

The first end portion 83a of the first long via electrode 83 is electrically connected to the first end portion 61a of the first upper wiring layer 61. The second end portion 83b of the first long via electrode 83 is electrically connected to the second end portion 41b of the first lower wiring layer 41.

The first long via electrode 83 has a lower portion 83c positioned at the third insulating layer 15 side with respect to the resistance layer 10 and an upper portion 83d positioned at the fourth insulating layer 16 side with respect to the resistance layer 10. In the direction normal to the principal surface of the third insulating layer 15, the length of the upper portion 83d is not less than the length of the lower portion 83c. More specifically, the length of the upper portion 83d is greater than the length of the lower portion 83c.

The first long via electrode 83 has a layered structure that includes a main body layer 85 and a barrier layer 86. The main body layer 85 is embedded in the third insulating layer 15 and the fourth insulating layer 16. The main body layer 85 may contain tungsten (W) or copper (Cu). In this configuration, the first long via electrode 83 has a single-layer structure made of a tungsten layer 87.

The barrier layer 86 is interposed between the main body layer 85 and the third insulating layer 15 as well as between the main body layer 85 and the fourth insulating layer 16. In this configuration, the barrier layer 86 has a layered structure in which multiple electrode layers are layered. In this configuration, the barrier layer 86 includes a Ti layer 88 and a TiN layer 89 that are formed in this order from the third insulating layer 15.

The Ti layer 88 is in contact with the third insulating layer 15 and the fourth insulating layer 16. The TiN layer 89 is in contact with the main body layer 85. The barrier layer 86 may have a single-layer structure in which either the Ti layer 88 or the TiN layer 89 is included.

Referring to FIG. 1, in this configuration, the second long via electrode 84 is formed in a circular shape in plan view. The planar shape of the second long via electrode 84 is arbitrary. The second long via electrode 84 may be formed in a polygonal shape, such as a triangular shape, a quadrilateral shape, or a hexagonal shape, etc., or in an elliptical shape in plan view instead of a circular shape.

Referring to FIG. 4, the second long via electrode 84 includes a first end portion 84a on one side and a second end portion 84b on the other side in a direction normal to the principal surface of the third insulating layer 15. The first end portion 84a of the second long via electrode 84 is exposed from the principal surface of the fourth insulating layer 16.

The second end portion 84b of the second long via electrode 84 is positioned within the third insulating layer 15. The second long via electrode 84 is formed in a tapered shape with the width narrowed from the first end portion 84a toward the second end portion 84b in sectional view.

The first end portion 84a of the second long via electrode 84 is electrically connected to the first end portion 62a of the second upper wiring layer 62. The second end portion 84b of the second long via electrode 84 is electrically connected to the second end portion 42b of the second lower wiring layer 42.

The second long via electrode 84 has a lower portion 84c positioned at the third insulating layer 15 side with respect to the resistance layer 10 and an upper portion 84d positioned at the fourth insulating layer 16 side with respect to the resistance layer 10. In the direction normal to the principal surface of the third insulating layer 15, the length of the upper portion 84d is not less than the length of the lower portion 84c. More specifically, the length of the upper portion 84d is greater than the length of the lower portion 84c.

The second long via electrode 84 has a layered structure that includes a main body layer 90 and a barrier layer 91. The main body layer 90 is embedded in the third insulating layer 15 and the fourth insulating layer 16. The main body layer 90 may contain tungsten (W) or copper (Cu). In this configuration, the second long via electrode 84 has a single-layer structure made of a tungsten layer 92.

The barrier layer 91 is interposed between the main body layer 90 and the third insulating layer 15 as well as between the main body layer 90 and the fourth insulating layer 16. In this configuration, the barrier layer 91 has a layered structure in which multiple electrode layers are layered. In this configuration, the barrier layer 91 includes a Ti layer 93 and a TiN layer 94 that are formed in this order from the third insulating layer 15.

The Ti layer 93 is in contact with the third insulating layer 15 and the fourth insulating layer 16. The TiN layer 94 is in contact with the main body layer 90. The barrier layer 91 may have a single-layer structure in which either the Ti layer 93 or the TiN layer 94 is included.

Referring to FIG. 2, the connection circuit forming layer 21 includes a wiring 95 that electrically connects the functional device and the resistance layer 10. The wiring 95 is selectively formed within the first insulating layer 13 and the second insulating layer 14 and is routed from the device forming region 6 to the outer region 7.

More specifically, the wiring 95 includes one or more connection wiring layers 96 electrically connected to the functional device in the device forming region 6. The one or more connection wiring layers 96 are formed on either or both of the first insulating layer 13 and the second insulating layer 14. FIG. 2 shows an example in which two connection wiring layers 96 are formed on the first insulating layer 13.

The one or more connection wiring layers 96 are selectively routed from the device forming region 6 to the outer region 7. Each connection wiring layer 96 has the same layered structure as the first lower wiring layer 41 (second lower wiring layer 42) and the first upper wiring layer 61 (second upper wiring layer 62). A specific description of the connection wiring layer 96 shall be omitted.

The wiring 95 includes one or more connection via electrodes 97. The one or more connection via electrodes 97 connect the one or more connection wiring layers 96 to any first lower wiring layer 41 (second lower wiring layer 42) and/or any first upper wiring layer 61 (second upper wiring layer 62).

The one or more connection via electrodes 97 are formed on either or both of the first insulating layer 13 and the second insulating layer 14. FIG. 2 shows an example in which two connection via electrodes 97 connect one connection wiring layer 96 to the first lower wiring layer 41.

Each connection via electrode 97 has the same layered structure as the first via electrode 23 (second via electrode 24) and the first long via electrode 83 (second long via electrode 84). A specific description of the connection via electrodes 97 shall be omitted.

The second end portion 61b of the first upper wiring layer 61 may be connected to any connection wiring layer 96 through the connection via electrode 97. The second end portion 62b of the second upper wiring layer 62 may be connected to any connection wiring layer 96 through the connection via electrode 97.

Referring to FIG. 2, a top insulating layer 101 is formed on the multilayer wiring structure 12. The top insulating layer 101 selectively covers the first upper wiring layer 61 and the second upper wiring layer 62. More specifically, the top insulating layer 101 covers the connection portion between the first upper wiring layer 61 and the first long via electrode 83 as well as the connection portion between the second upper wiring layer 62 and the second long via electrode 84.

In the outer region 7, a first pad opening 102 and a second pad opening 103 are formed in the top insulating layer 101. The first pad opening 102 exposes a partial region of the first upper wiring layer 61 as a first pad region 104. More specifically, the first pad opening 102 exposes, as the first pad region 104, a region of the first upper wiring layer 61 besides the connection portion between the first upper wiring layer 61 and the first long via electrode 83.

The second pad opening 103 exposes a partial region of the second upper wiring layer 62 as a second pad region 105. More specifically, the second pad opening 103 exposes, as the second pad region 105, a region of the second upper wiring layer 62 besides the connection portion between the second upper wiring layer 62 and the second long via electrode 84.

In this configuration, the top insulating layer 101 has a layered structure that includes a passivation layer 106 and a resin layer 107. In FIG. 1, the resin layer 107 is shown with hatching for clarity.

The passivation layer 106 may have a layered structure that includes a silicon oxide film and a silicon nitride film. In this case, the silicon nitride film may be formed on the silicon oxide film or the silicon oxide film may be formed on the silicon nitride film.

The passivation layer 106 may have a single-layer structure that includes a silicon oxide film or a silicon nitride film. The passivation layer 106 is preferably formed of an insulating material that differs in type from the multilayer wiring structure 12. In this configuration, the passivation layer 106 has a single-layer structure made of a silicon nitride film.

The resin layer 107 may contain a photosensitive resin of positive type or negative type. In this configuration, the resin layer 107 contains polyimide as an example of a negative-type photosensitive resin. The resin layer 107 may contain polybenzoxazole as an example of a positive-type photosensitive resin instead.

The first via electrode 23, the first lower wiring layer 41, the first long via electrode 83, and the first upper wiring layer 61 form a first wiring connected to the resistance layer 10. One end of the first wiring (first via electrode 23) is connected to the resistance layer 10 within the multilayer wiring structure 12, while the other end of the first wiring (first upper wiring layer 61) serves as an external terminal exposed outside.

The second via electrode 24, the second lower wiring layer 42, the second long via electrode 84, and the second upper wiring layer 62 form a second wiring connected to the resistance layer 10. One end of the second wiring (second via electrode 24) is connected to the resistance layer 10 within the multilayer wiring structure 12, while the other end of the second wiring (second upper wiring layer 62) serves as an external terminal exposed outside. The first wiring may be applied with a high voltage, while the second wiring may be applied with a low voltage. The first wiring may be applied with a low voltage, while the second wiring may be applied with a high voltage.

As described above, according to the electronic component 1, the resistance layer 10 is made of a metal thin film and therefore the resistance layer 10 can be adequately incorporated in the multilayer wiring structure 12. That is, CrSi, TaN, or TiN that is employed as a metal material for the resistance layer 10 has a relatively low temperature dependence and voltage dependence, and has a sheet resistance value superior to the sheet resistance value of the sheet resistance of polysilicon.

Accordingly, by employing a metal thin film containing at least one of CrSi, Tan, and TiN as the resistance layer 10, the planar area of the resistance layer 10 can be adequately reduced while adequately reducing the thickness of the resistance layer 10.

It is thereby possible to adequately interpose the resistance layer 10 in the region between the third insulating layer 15 and the fourth insulating layer 16 while ensuring flatness. Also, because contacts with the resistance layer 10 can be formed by the first via electrode 23 and the second via electrode 24 that are embedded in the third electrode layer 15, it is possible to adequately increase the flatness of the upper layer of the resistance layer 10. That is, the flatness of the fourth insulating layer 16 can be adequately increased.

It is thereby possible to adequately form the first upper wiring layer 61 and the second upper wiring layer 62 on the fourth insulating layer 16 which is increased in flatness. As a result, it is possible to provide an electronic component in which the resistance layer 10 can be adequately incorporated in the multilayer wiring structure 12.

FIG. 7A is a plan view of a resistance layer 10 according to a second configuration example. In the following, structures corresponding to the structures described for the electronic component 1 shall be provided with the same reference symbols and description thereof shall be omitted.

In the resistance layer 10 according to the first configuration example, the multiple contact portions 9a, 9b and the multiple contact portions 17a, 17b face each other in the direction in which the first end portion 10a and the second end portion 10b face each other. In contrast, referring to FIG. 7A, in the resistance layer 10 according to the second configuration example, the multiple contact portions 17a do not face the multiple contact portions 9a, 9b in the direction in which the first end portion 10a and the second end portion 10b face each other. That is, the multiple contact portions 17a are arranged so as to be shifted with respect to the multiple contact portions 9a, 9b in a direction along the second side 8B. More specifically, the multiple contact portions 17a face the trimmed region 18 in the direction in which the first end portion 10a and the second end portion 10b face each other.

Even in such a case where the resistance layer 10 according to the second configuration example is formed, since the notched portion 110 is spaced away from the principal current path 20, the same effects can be exhibited as the case where the resistance layer 10 according to the first configuration example is formed.

Figure 7B:
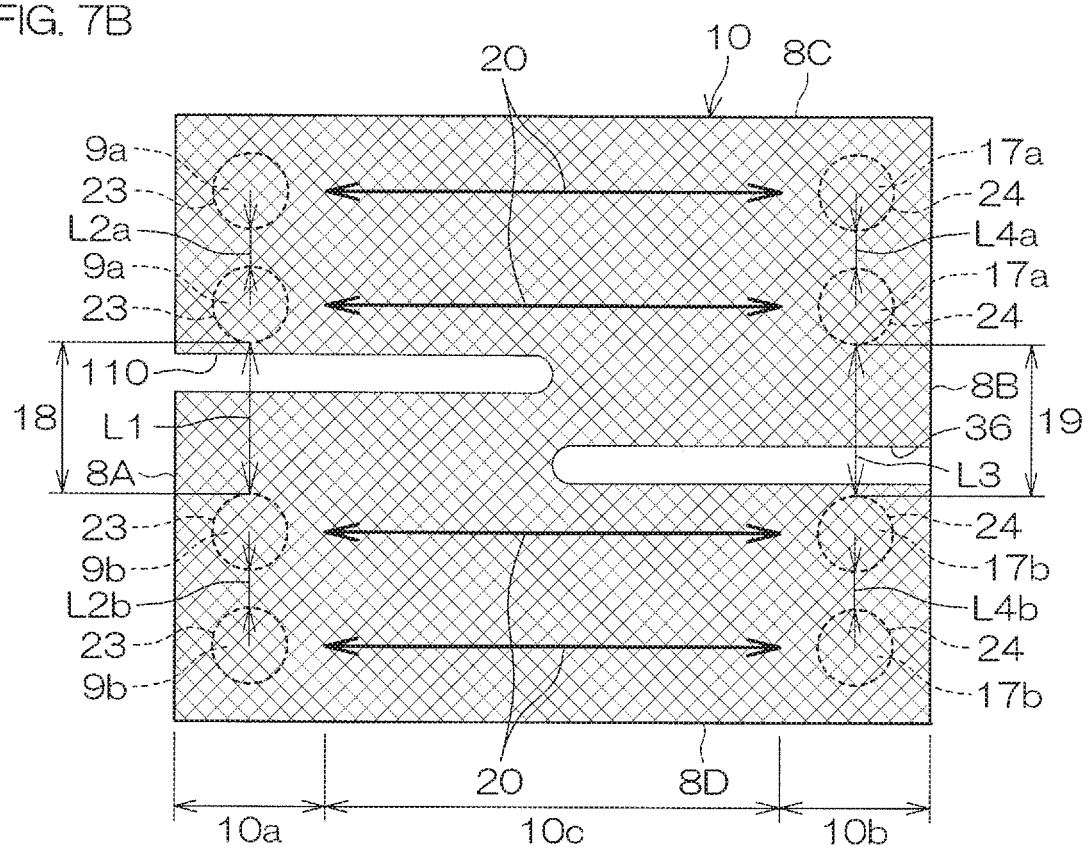
FIG. 7B is a plan view of a resistance layer according to a third configuration example.

FIG. 7B is a plan view of a resistance layer 10 according to a third configuration example. In the following, structures corresponding to the structures described for the electronic component 1 shall be provided with the same reference symbols and description thereof shall be omitted.

In the resistance layer 10 according to the first configuration example, the notched portion 110 is formed only in the trimmed region 18. In contrast, referring to FIG. 7B, in the resistance layer 10 according to the third configuration example, a second notched portion 36 is also formed in the trimmed region 19 in addition to the trimmed region 18. The second notched portion 36 extends linearly from the second side 8B toward the first side 8A of the resistance layer 10 in the trimmed region 19. The second notched portion 36 is formed at least, for example, in the second end portion 10b of the resistance layer 10 and the leading end portion may reach the connection portion 10c, as shown in FIG. 7B.

Even in such a case where the resistance layer 10 according to the third configuration example is formed, since the notched portion 110 and the second notched portion 36 are spaced away from the principal current path 20, the same effects can be exhibited as the case where the resistance layer 10 according to the first configuration example is formed.

FIG. 7C is a plan view of a resistance layer 10 according to a fourth configuration example. In the following, structures corresponding to the structures described for the electronic component 1 shall be provided with the same reference symbols and description thereof shall be omitted.

The resistance layer 10 according to the first configuration example is formed in a quadrilateral shape in plan view, in which a band-shaped region along the first side 8A is set as the first end portion 10a, while a band-shaped region along the second side 8B is set as the second end portion 10b. In contrast, in the resistance layer 10 according to the fourth configuration example, the first end portion 10a includes not only a band-shaped region 37 but also a pair of extension portions 38a, 38b that extend from the respective end portions of the band-shaped region 37.

The extension portion 38a protrudes outside from the third side 8C of the resistance layer 10 to be formed in an L shape in plan view. The first contact portion 9a is arranged in the extension portion 38a. On the other hand, the extension portion 38b protrudes outside from the fourth side 8D of the resistance layer 10 to be formed in an L shape in plan view. The second contact portion 9b is arranged in the extension portion 38b.

The notched portion 110 is formed in the band-shaped region 37 of the first end portion 10a. That is, the fourth configuration example is common to the first configuration example in that the notched portion 110 is formed in a portion between the first contact portion 9a and the second contact portion 9b in the first end portion 10a. On the other hand, it differs from the first configuration example in that the first contact portion 9a and the second contact portion 9b are arranged in the extension portions 38a, 38b that are different from the band-shaped region 37, while the notched portion 110 is formed in the band-shaped region 37 of the first end portion 10a.

Even in such a case where the resistance layer 10 according to the fourth configuration example is formed, since the notched portion 110 is spaced away from the principal current path 20, the same effects can be exhibited as the case where the resistance layer 10 according to the first configuration example is formed.

FIG. 7D is a plan view of a resistance layer 10 according to a fifth configuration example. In the following, structures corresponding to the structures described for the electronic component 1 shall be provided with the same reference symbols and description thereof shall be omitted.

In the resistance layer 10 according to the first configuration example, the notched portion 110 extends linearly from the first side 8A to the second side 8B of the resistance layer 10. In contrast, in the resistance layer 10 according to the fifth configuration example, the notched portion 110 extends in an L shape in plan view from the first side 8A to the second side 8B of the resistance layer 10. That is, as long as the shape of the notched portion 110 does not significantly inhibit the principal current path 20, the shape does not need to be linear, and may be an L shape as shown in FIG. 7D. As a matter of course, the shape may be other than linear or L-shaped.

Even in such a case where the resistance layer 10 according to the fifth configuration example is formed, since the notched portion 110 is spaced away from the principal current path 20, the same effects can be exhibited as the case where the resistance layer 10 according to the first configuration example is formed.

The features of the resistance layers 10 according to the first configuration example, the second configuration example, the third configuration example, the fourth configuration example, and the fifth configuration example can be combined with each other in any mode and any configuration.

That is, there may be employed a resistance layer 10 having a configuration in which at least two of the features of the resistance layers 10 according to the first to fifth configuration examples are combined.

Figure 8C:
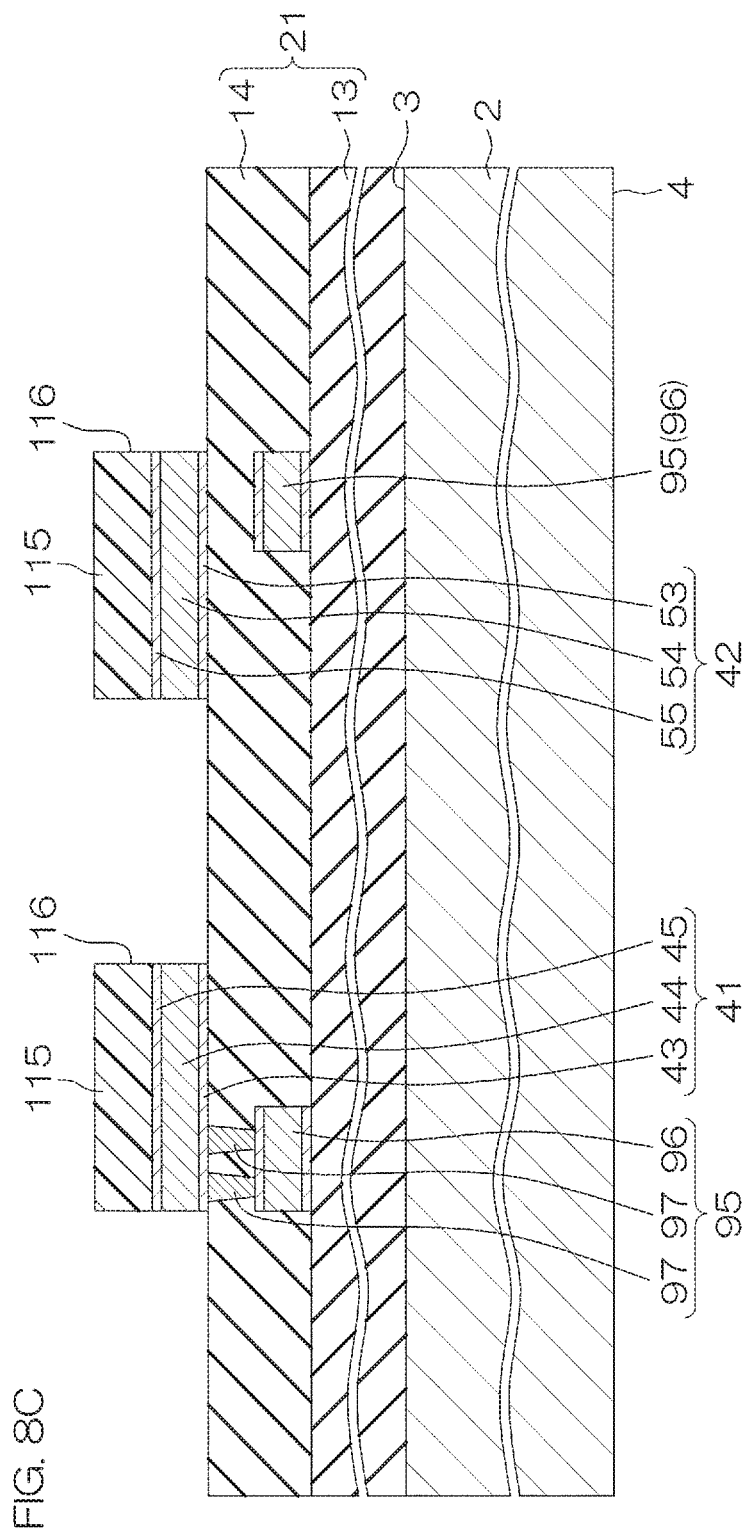
FIGS. 8A to 8S are sectional views of a portion corresponding to FIG. 2, illustrating an example of a method for manufacturing the electronic component shown in FIG. 1.
Figure 8D:
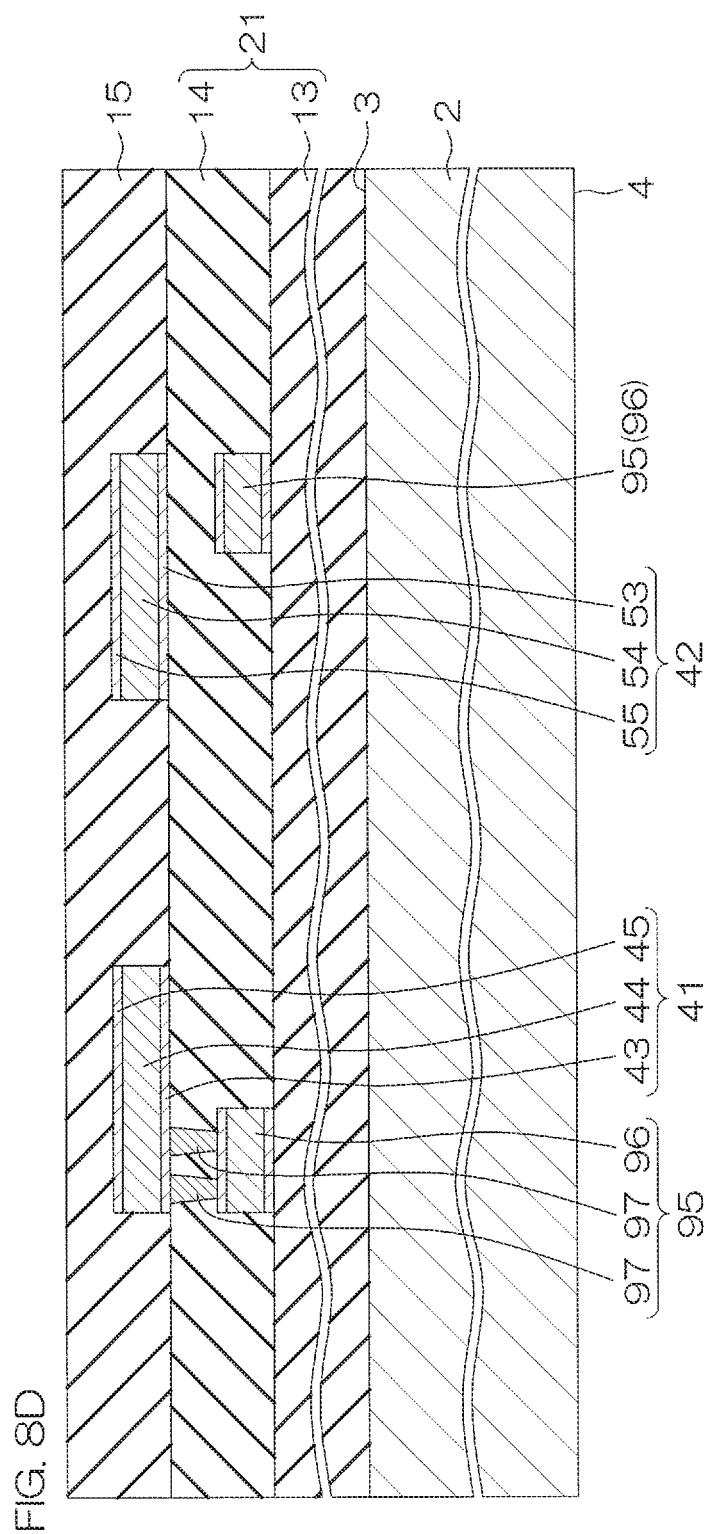
Figure 8E:
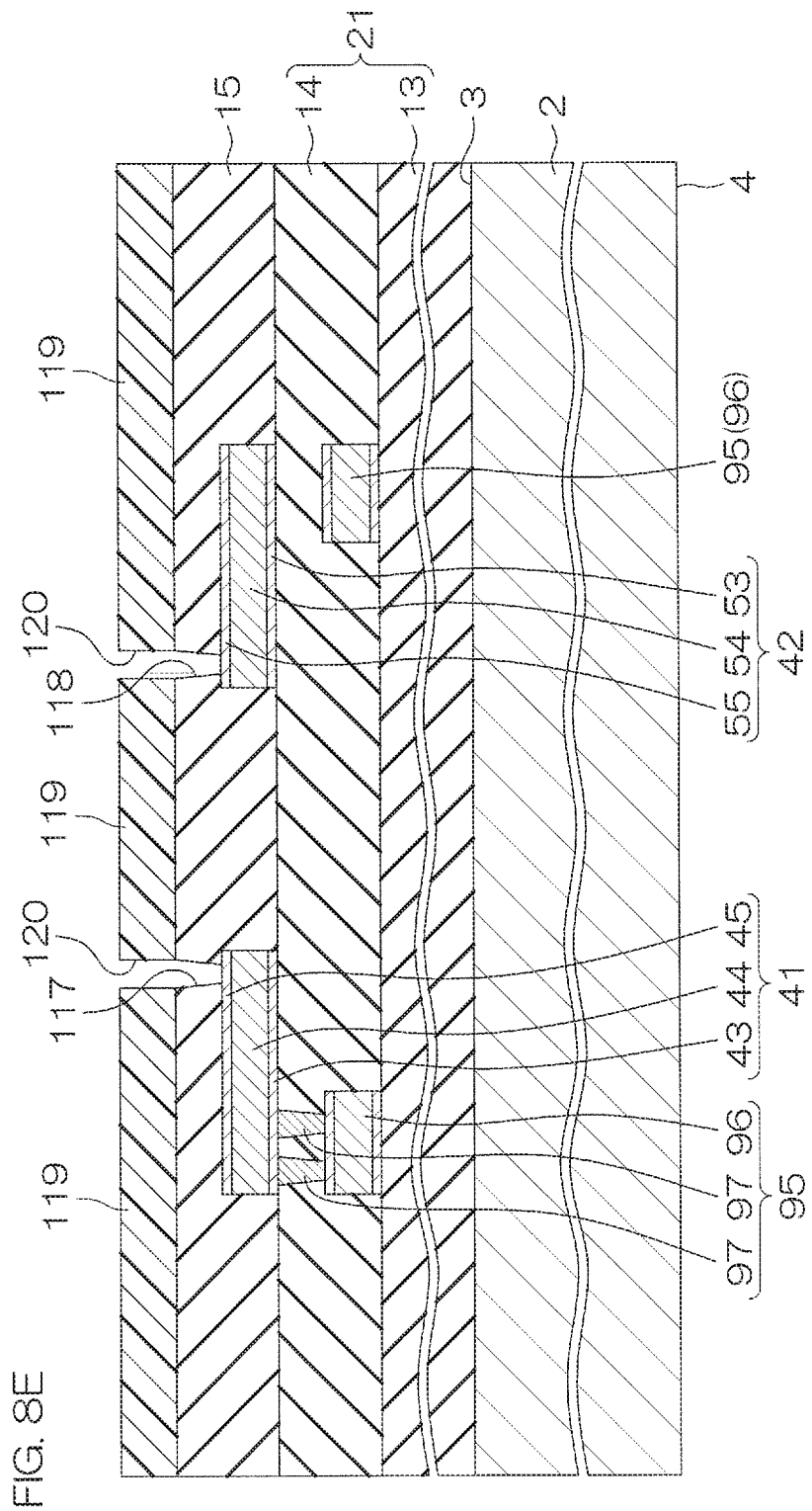
Figure 8F:
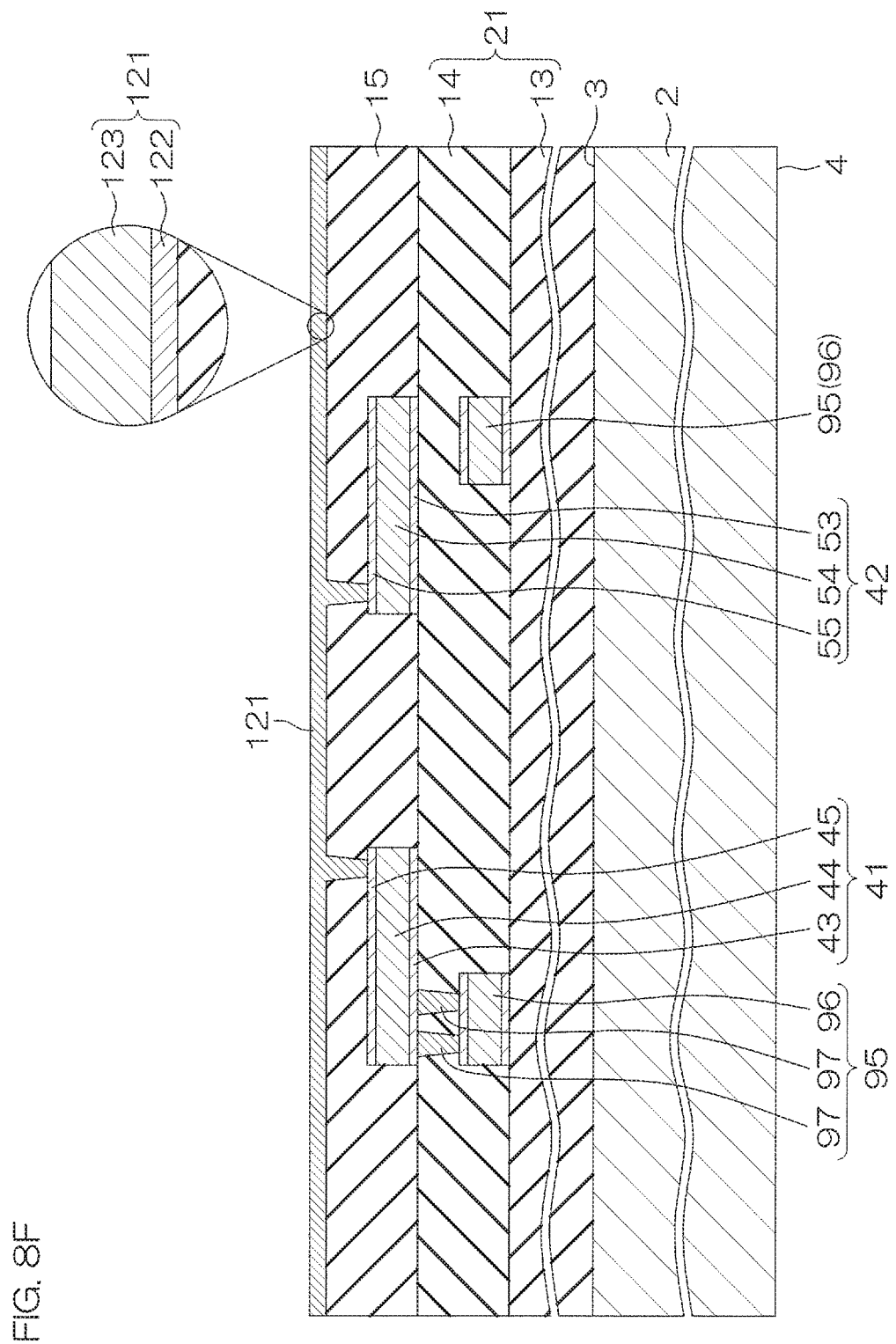
Figure 8G:
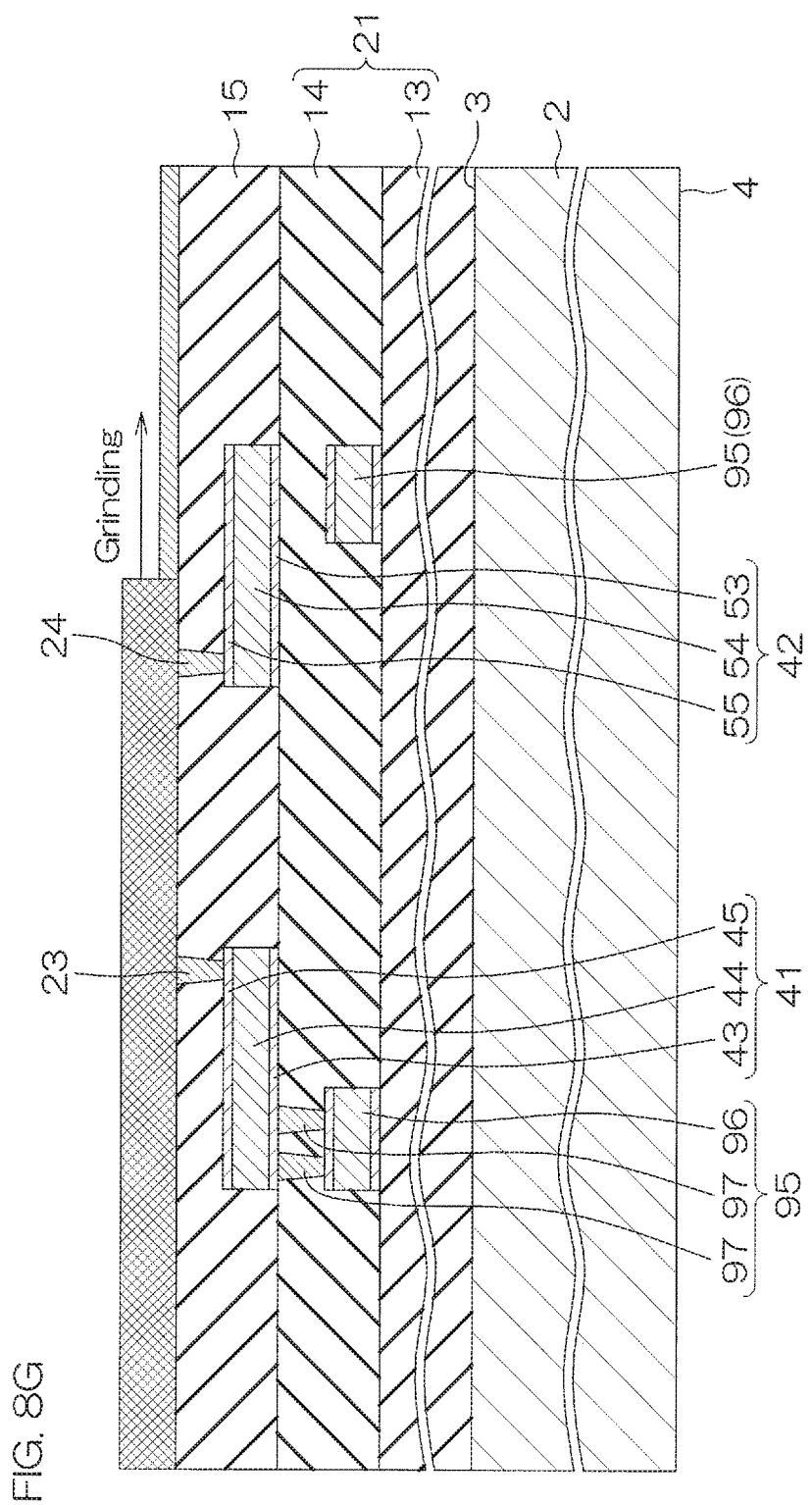
Figure 8I:
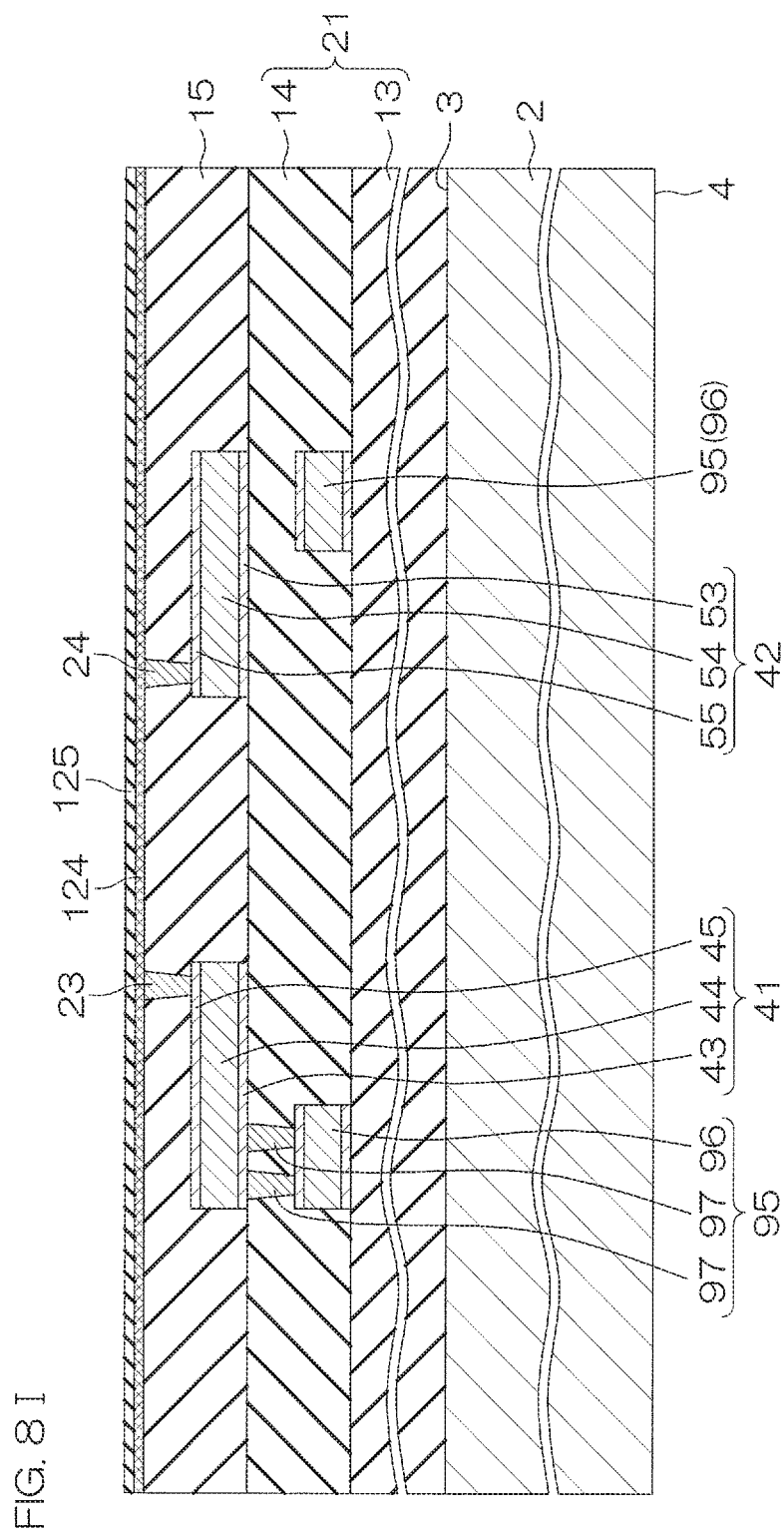
Figure 8J:
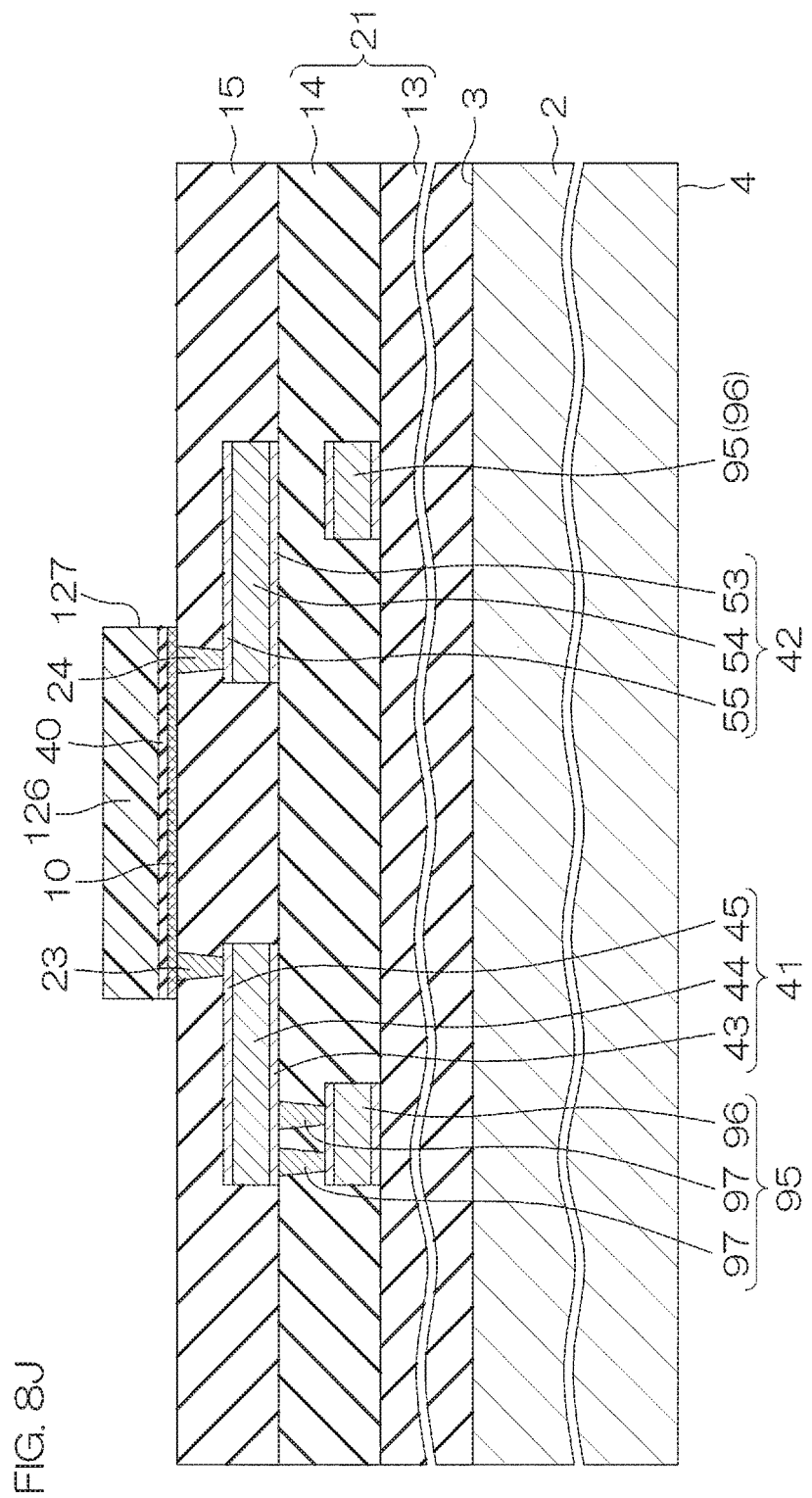
Figure 8K:
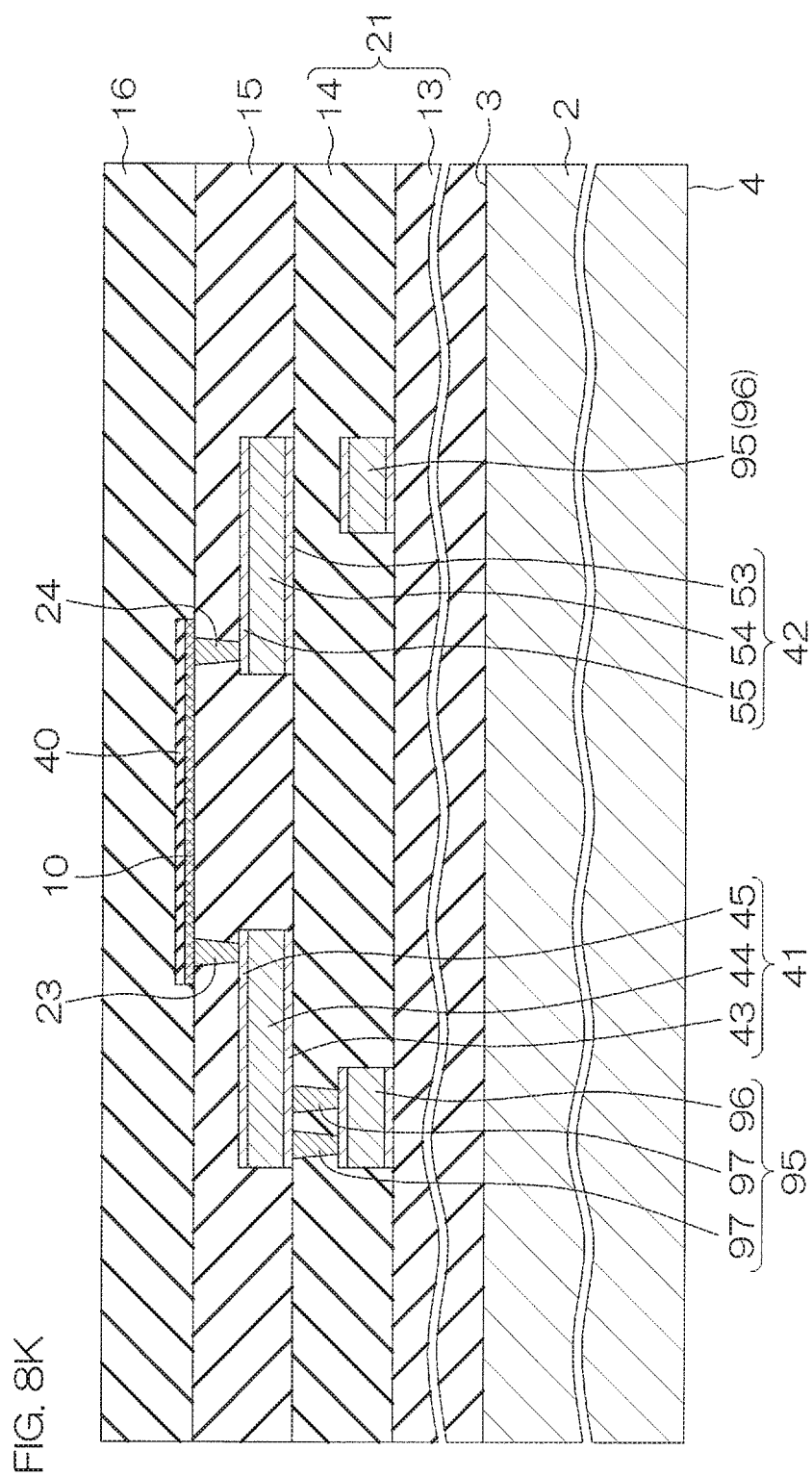
Figure 8L:
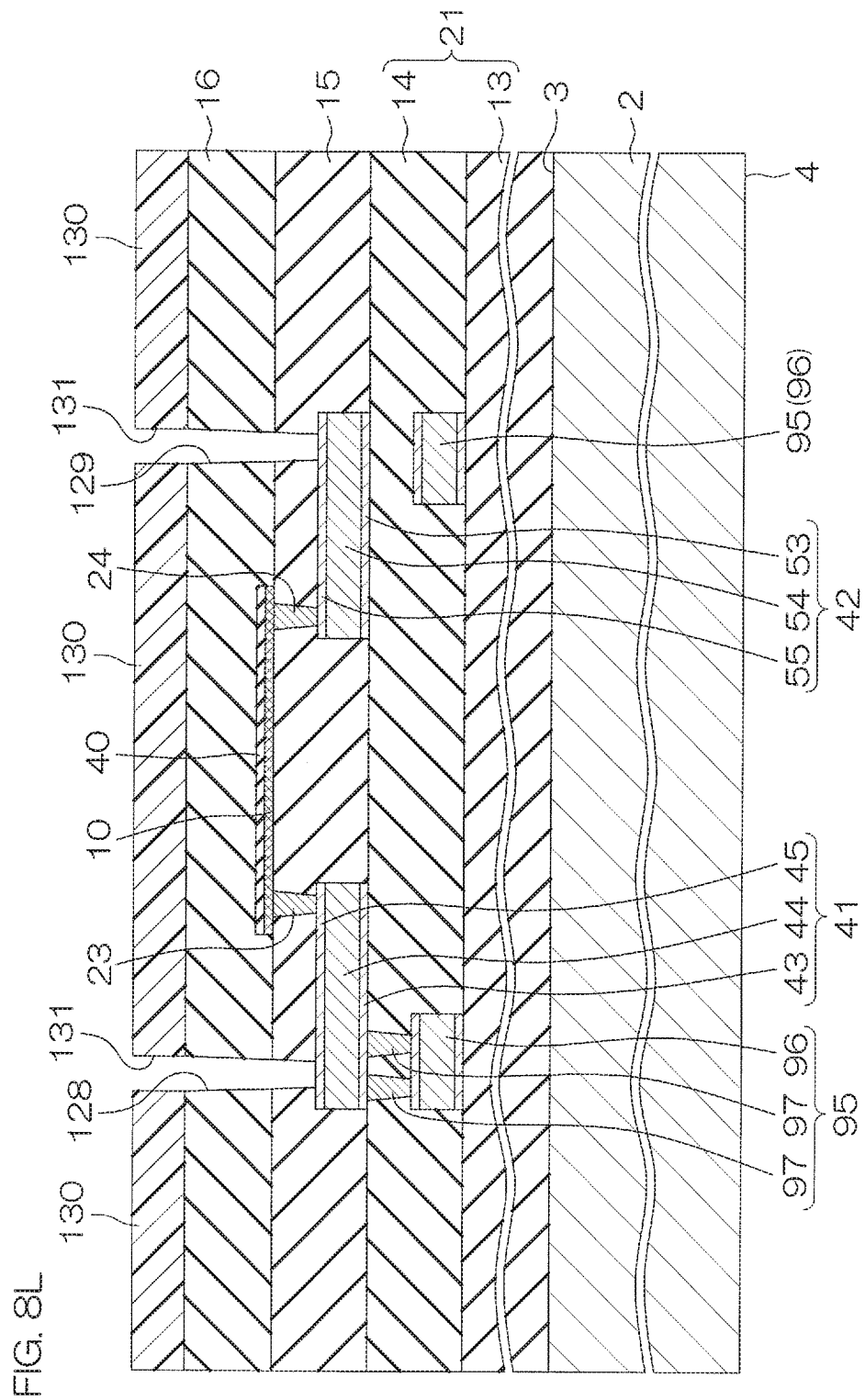
Figure 8M:
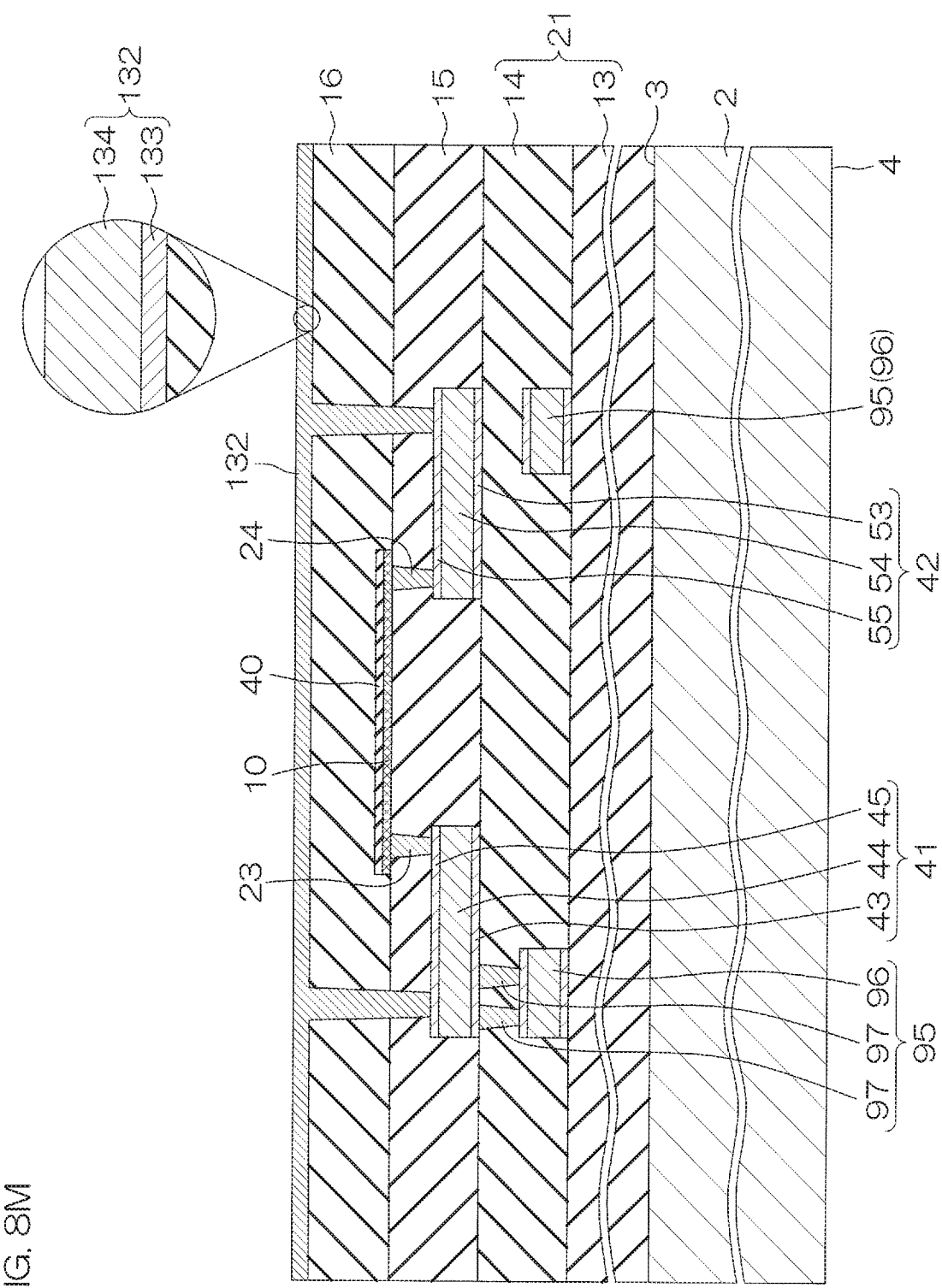
Figure 8N:
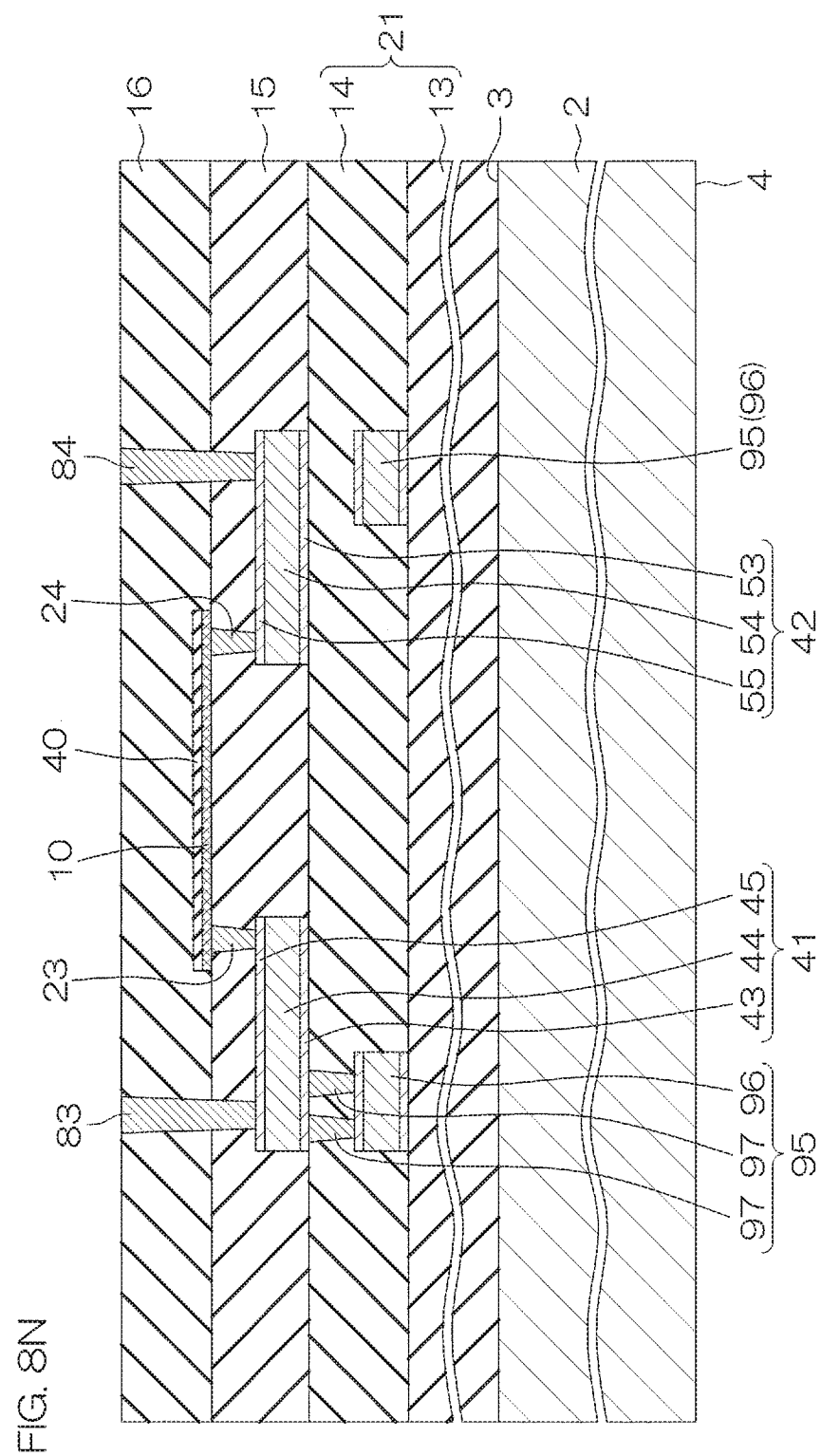
Figure 8P:
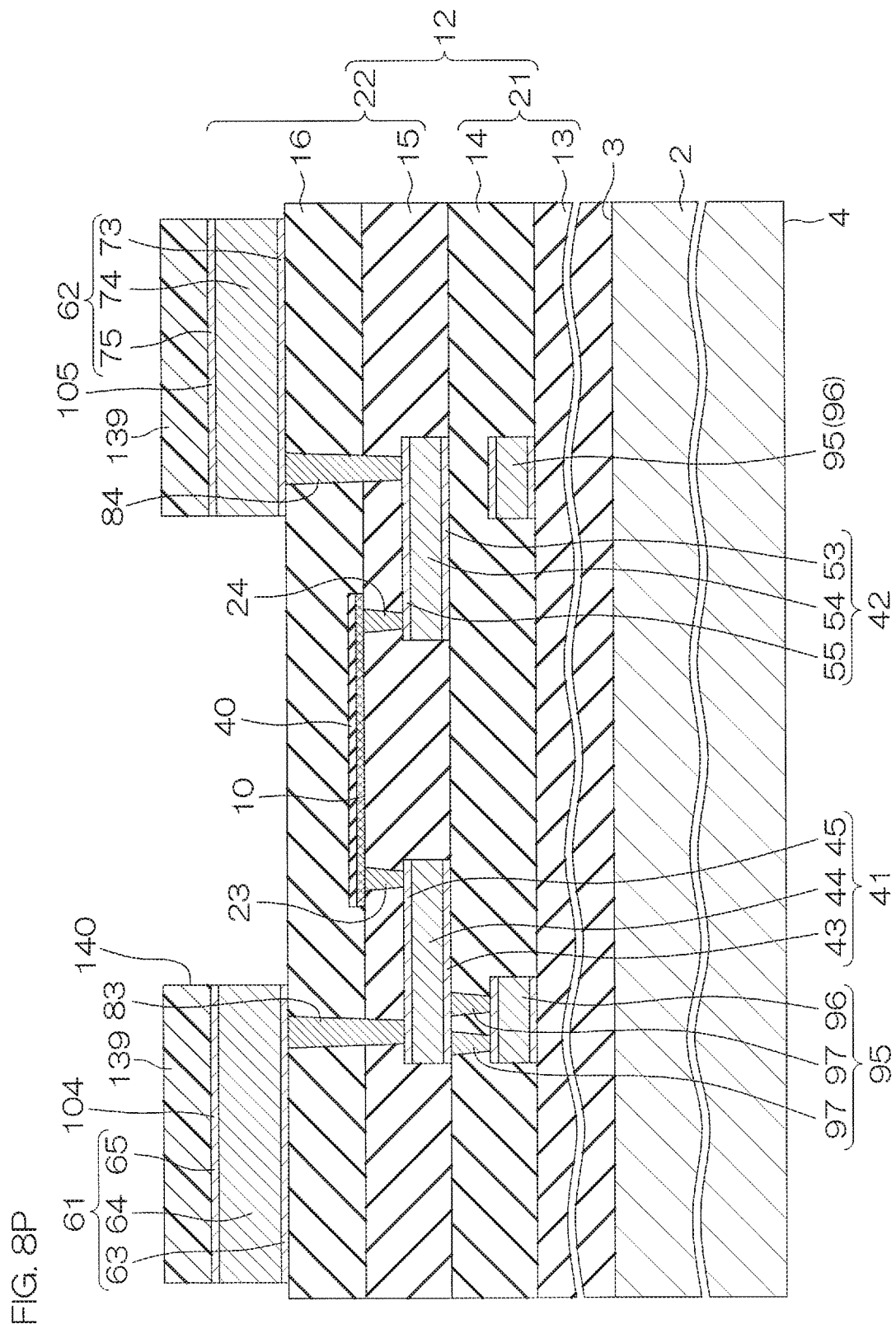
Figure 8Q:
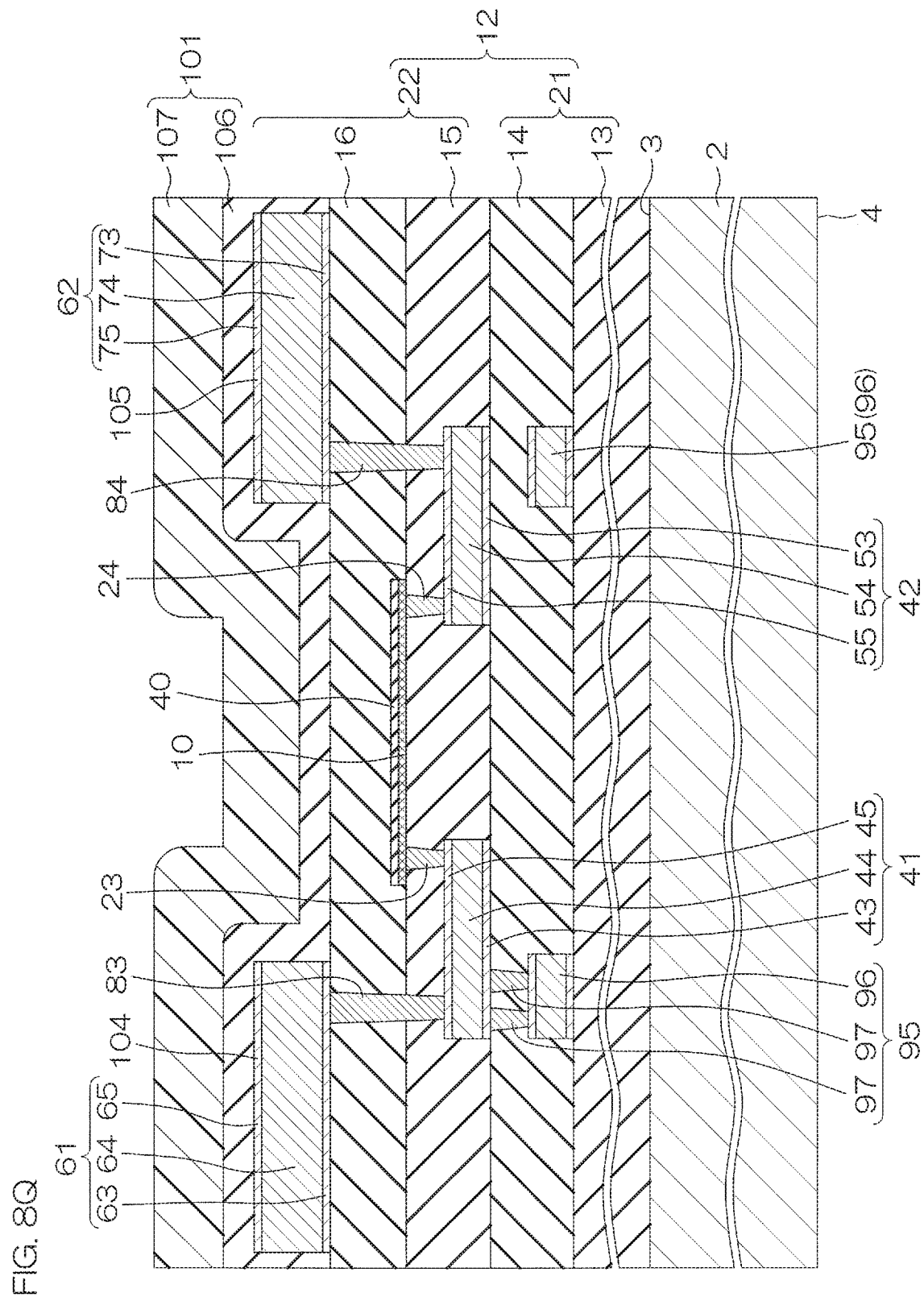
Figure 8R:
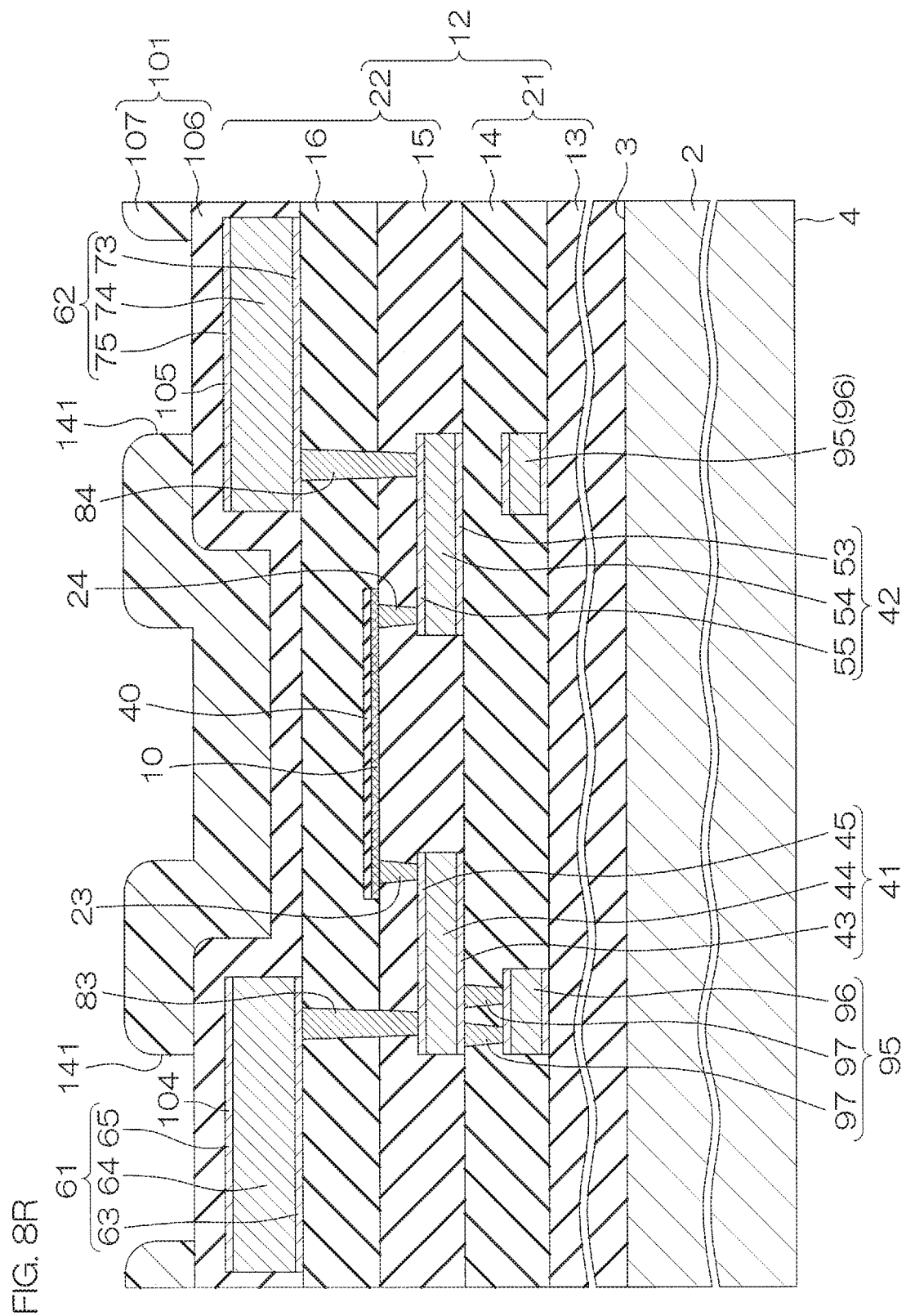
Figure 8S:
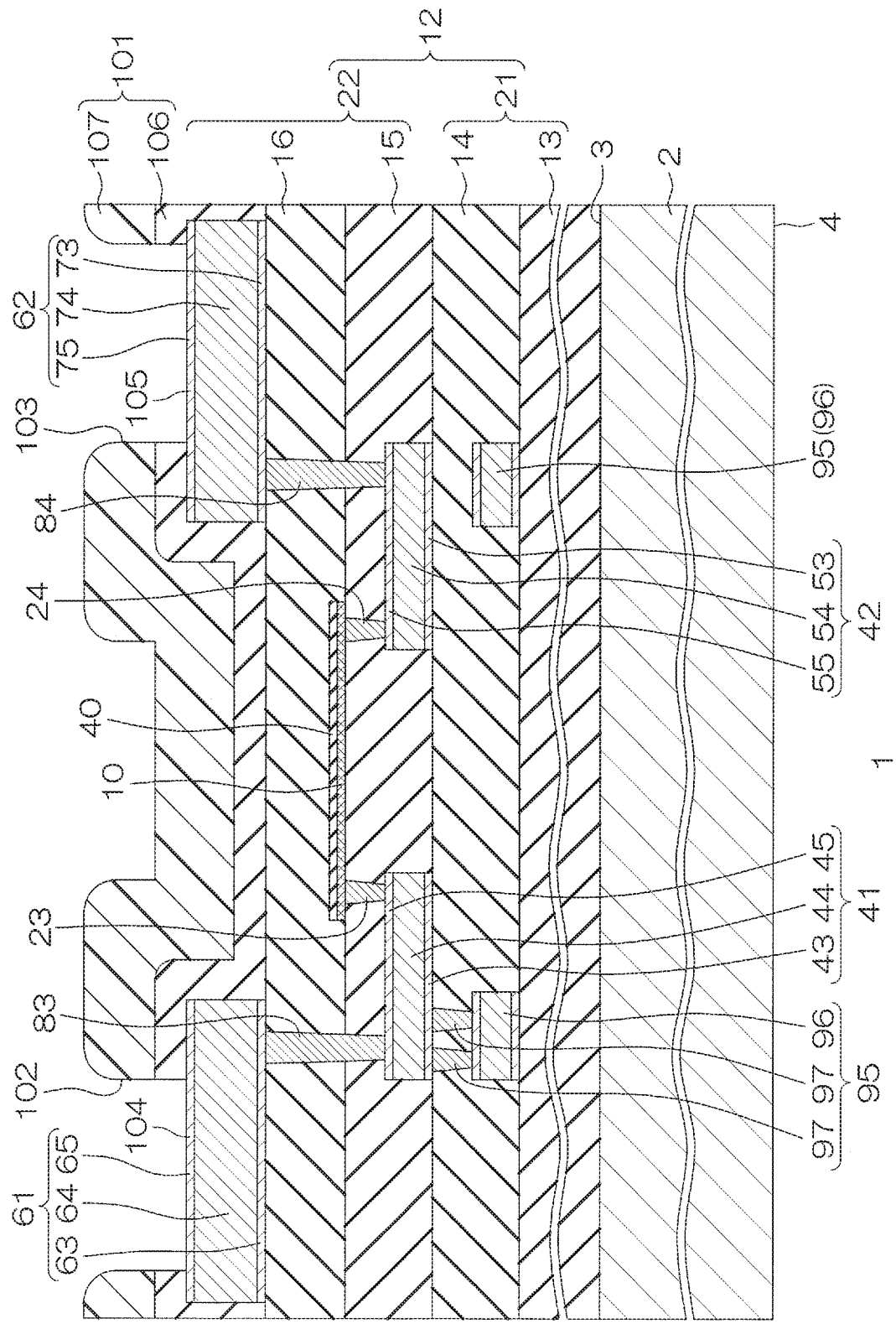

FIGS. 8A to 8S are sectional views for illustrating an example of a method for manufacturing the electronic component 1 shown in FIG. 1. FIGS. 8A to 8S are sectional views of a portion corresponding to FIG. 2.

Referring to FIG. 8A, in manufacturing the electronic component 1, first, a semiconductor layer 2 is prepared in which a device forming region 6 and an outer region 7 are formed. Next, a connection circuit forming layer 21 of a multilayer wiring structure 12 is formed on the first principal surface 3 of the semiconductor layer 2.

The connection circuit forming layer 21 includes a first insulating layer 13, a second insulating layer 14, one or more connection wiring layers 96, and one or more connection via electrodes 97. A description of the step of forming the connection circuit forming layer 21 shall be omitted.

Next, referring to FIG. 8B, a first base wiring layer 111 to serve as a base for a first lower wiring layer 41 and a second lower wiring layer 42 is formed on the connection circuit forming layer 21. The step of forming the first base wiring layer 111 includes the steps of forming a first barrier layer 112, a main body layer 113, and a second barrier layer 114 in this order from the top of the connection circuit forming layer 21.

The step of forming the first barrier layer 112 includes the steps of forming a Ti layer and a TiN layer in this order from the top of the connection circuit forming layer 21. The Ti layer and the TiN layer may each be formed by a sputtering method. The step of forming the main body layer 113 includes the step of forming an AlCu alloy layer on the first barrier layer 112. The AlCu alloy layer may be formed by a sputtering method.

The step of forming the second barrier layer 114 includes the steps of forming a Ti layer and a TiN layer in this order from the top of the main body layer 113. The Ti layer and the TiN layer may each be formed by a sputtering method.

Next, referring to FIG. 8C, a mask 115 having a predetermined pattern is formed on the first base wiring layer 111. The mask 115 covers regions of the first base wiring layer 111 in which the first lower wiring layer 41 and the second lower wiring layer 42 are to be formed and has an opening 116 that exposes other regions.

Next, unnecessary portions of the first base wiring layer 111 are removed by an etching method via the mask 115. The first base wiring layer 111 is thus divided into the first lower wiring layer 41 and the second lower wiring layer 42. The mask 115 is thereafter removed.

Next, referring to FIG. 8D, a third insulating layer 15 that covers the first lower wiring layer 41 and the second lower wiring layer 42 is formed on the connection circuit forming layer 21. The third insulating layer 15 may be formed by a CVD (Chemical Vapor Deposition) method.

Next, referring to FIG. 8E, a first via hole 117 that exposes the first lower wiring layer 41 and a second via hole 118 that exposes the second lower wiring layer 42 are formed in the third insulating layer 15.

In this step, first, a mask 119 having a predetermined pattern is formed on the third insulating layer 15. The mask 119 has multiple openings 120 that expose regions of the third insulating layer 15 in which the first via hole 117 and the second via hole 118 are to be formed.

Next, unnecessary portions of the third insulating layer 15 are removed by an etching method via the mask 119. The first via hole 117 and the second via hole 118 are thus formed in the third insulating layer 15. The mask 119 is thereafter removed.

Next, referring to FIG. 8F, a base electrode layer 121 to serve as a base for the first via electrode 23 and the second via electrode 24 is formed on the third insulating layer 15. The step of forming the base electrode layer 121 includes the steps of forming a barrier layer 122 and a main body layer 123 in this order from the top of the third insulating layer 15.

The step of forming the barrier layer 122 includes the steps of forming a Ti layer and a TiN layer in this order from the top of the third insulating layer 15. The Ti layer and the TiN layer may each be formed by a sputtering method. The step of forming the main body layer 123 includes the step of forming a tungsten layer on the barrier layer 122. The tungsten layer may be formed by a CVD method.

Next, referring to FIG. 8G, the step of removing the base electrode layer 121 is performed. The base electrode layer 121 is removed until the third insulating layer 15 is exposed. The step of removing the base electrode layer 121 may include the step of removing the base electrode layer 121 by grinding.

In this configuration, the step of grinding the base electrode layer 121 is performed by a CMP (Chemical Mechanical Polishing) method using polishing agent (abrasive grains). The step of grinding the base electrode layer 121 may include the step of flattening the principal surface of the third insulating layer 15. The first via electrode 23 and the second via electrode 24 are thus formed, respectively, within the first via hole 117 and the second via hole 118.

Next, referring to FIG. 8H, the polishing agent (abrasive grains) attached to the principal surface of the third insulating layer 15 is removed by cleaning using a chemical liquid. In this step, a portion of the third insulating layer 15 is removed together with the polishing agent (abrasive grains) by the chemical liquid.

A portion of the first via electrode 23 is thus formed as a first projecting portion 23c projecting from the third insulating layer 15. A portion of the second via electrode 24 is also formed as a second projecting portion 24c projecting from the third insulating layer 15.

Next, referring to FIG. 8I, a base resistance layer 124 to serve as a base for the resistance layer 10 is formed on the principal surface of the third insulating layer 15. The base resistance layer 124 contains chromium silicide. The base resistance layer 124 may include at least one type of substance among CrSi, $CrSi_2$, CrSiN, and CrSiO as an example of chromium silicide. In the present preferred embodiment, the base resistance layer 124 contains CrSi. The base resistance layer 124 may be formed by a sputtering method.

Next, a base protective layer 125 to serve as a base for the protective layer 40 is formed on the base resistance layer 124. The base protective layer 125 contains silicon oxide. The base protective layer 125 may be formed by a CVD method.

Next, the base resistance layer 124 (CrSi) is crystallized. The step of crystallizing the base resistance layer 124 includes the step of performing annealing at a temperature and for a time at and until which the base resistance layer 124 (CrSi) is crystallized. The base resistance layer 124 may be heated at a temperature not less than 400° C. and not more than 600° C. for not less than 60 minutes and not more than 120 minutes. The step of crystallizing the base resistance layer 124 may be performed prior to the step of forming the protective layer 40 after the step of forming the base resistance layer 124.

Next, referring to FIG. 8J, a mask 126 having a predetermined pattern is formed on the base protective layer 125. The mask 126 covers a region of the base protective layer 125 in which the protective layer 40 is to be formed and has an opening 127 that exposes other regions.

Next, unnecessary portions of the base protective layer 125 are removed by an etching method via the mask 126. The protective layer 40 is thus formed.

Next, unnecessary portions of the base resistance layer 124 are removed by an etching method using the mask 126 and the protective layer 40 as masks. The resistance layer 10 is thus formed. The mask 126 is thereafter removed. The mask 126 may be removed prior to forming the resistance layer 10 after forming the protective layer 40.

Next, referring to FIG. 8K, a fourth insulating layer 16 that covers the protective layer 40 and the resistance layer 10 is formed on the third insulating layer 15. The fourth insulating layer 16 may be formed by a CVD method.

Next, referring to FIG. 8L, a first via hole 128 that exposes the first lower wiring layer 41 and a second via hole 129 that exposes the second lower wiring layer 42 are formed in the third insulating layer 15 and the fourth insulating layer 16.

In this step, first, a mask 130 having a predetermined pattern is formed on the fourth insulating layer 16. The mask 130 has multiple openings 131 that expose regions of the fourth insulating layer 16 in which the first via hole 128 and the second via hole 129 are to be formed.

Next, unnecessary portions of the third insulating layer 15 and the fourth insulating layer 16 are removed by an etching method via the mask 130. The first via hole 128 and the second via hole 129 are thus formed in the third insulating layer 15 and the fourth insulating layer 16. The mask 130 is thereafter removed.

Next, referring to FIG. 8M, a base electrode layer 132 to serve as a base for a first long via electrode 83 and a second long via electrode 84 is formed on the fourth insulating layer 16. The step of forming the base electrode layer 132 includes the steps of forming a barrier layer 133 and a main body layer 134 in this order from the top of the fourth insulating layer 16.

The step of forming the barrier layer 133 includes the steps of forming a Ti layer and a TiN layer in this order from the top of the fourth insulating layer 16. The Ti layer and the TiN layer may each be formed by a sputtering method. The step of forming the main body layer 134 includes the step of forming a tungsten layer on the barrier layer 133. The tungsten layer may be formed by a CVD method.

Next, referring to FIG. 8N, the step of removing the base electrode layer 132 is performed. The base electrode layer 132 is removed until the fourth insulating layer 16 is exposed. The step of removing the base electrode layer 132 may include the step of removing the base electrode layer 132 by grinding.

In this configuration, the step of grinding the base electrode layer 132 is performed by a CMP method using polishing agent (abrasive grains). The step of grinding the base electrode layer 132 may include the step of flattening the principal surface of the fourth insulating layer 16. The first long via electrode 83 and the second long via electrode 84 are thus formed, respectively, within the first via hole 128 and the second via hole 129.

After the step of grinding the base electrode layer 132, the polishing agent (abrasive grains) attached to the principal surface of the fourth insulating layer 16 may be removed by cleaning using a chemical liquid. A portion of the fourth insulating layer 16 may be removed together with the polishing agent (abrasive grains) by the chemical liquid.

In this case, a portion of the first long via electrode 83 may be formed as a projecting portion projecting from the fourth insulating layer 16. A portion of the second long via electrode 84 may also be formed as a projecting portion projecting from the fourth insulating layer 16.

Next, referring to FIG. 8O, a second base wiring layer 135 to serve as a base for a first upper wiring layer 61 and a second upper wiring layer 62 is formed on the fourth insulating layer 16. The step of forming the second base wiring layer 135 includes the steps of forming a first barrier layer 136, a main body layer 137, and a second barrier layer 138 in this order from the top of the fourth insulating layer 16.

The step of forming the first barrier layer 136 includes the steps of forming a Ti layer and a TiN layer in this order from the top of the fourth insulating layer 16. The Ti layer and the TiN layer may each be formed by a sputtering method. The step of forming the main body layer 137 includes the step of forming an AlCu alloy layer on the first barrier layer 136. The AlCu alloy layer may be formed by a sputtering method.

The step of forming the second barrier layer 138 includes the steps of forming a Ti layer and a TiN layer in this order from the top of the main body layer 137. The Ti layer and the TiN layer may each be formed by a sputtering method.

Next, referring to FIG. 8P, a mask 139 having a predetermined pattern is formed on the second base wiring layer 135. The mask 139 covers regions of the second base wiring layer 135 in the outer region 7 in which the first upper wiring layer 61 and the second upper wiring layer 62 are to be formed and has an opening 140 that exposes other regions.

Next, unnecessary portions of the second base wiring layer 135 are removed by an etching method via the mask 139. The second base wiring layer 135 is thus divided into the first upper wiring layer 61 and the second upper wiring layer 62. In addition, the multilayer wiring structure 12, which includes the connection circuit forming layer 21 and the resistance circuit forming layer 22, is thus formed on the first principal surface 3 of the semiconductor layer 2. The mask 139 is thereafter removed.

Next, referring to FIG. 8Q, a passivation layer 106 is formed on the multilayer wiring structure 12. The passivation layer 106 contains silicon nitride. The passivation layer 106 may be formed by a CVD method.

Next, a resin layer 107 is applied onto the passivation layer 106. The resin layer 107 may contain polyimide as an example of a negative-type photosensitive resin.

Next, referring to FIG. 8R, the resin layer 107 is selectively exposed and thereafter developed. Multiple openings 141 to serve as bases for a first pad opening 102 and a second pad opening 103 are thus formed in the resin layer 107.

Next, referring to FIG. 8S, unnecessary portions of the passivation layer 106 are removed by an etching method via the resin layer 107. The first pad opening 102 and the second pad opening 103 are thus formed to, respectively, expose the first upper wiring layer 61 and the second upper wiring layer 62.

Subsequently, the resistance layer 10 is partially removed (trimmed) by a laser beam irradiation method and a notched portion 110 is formed in the resistance layer 10. Thereby, a resistance value of the resistance layer 10 is adjusted to a desired value. The electronic component 1 is thus manufactured through the process including the foregoing steps.

Figure 9:
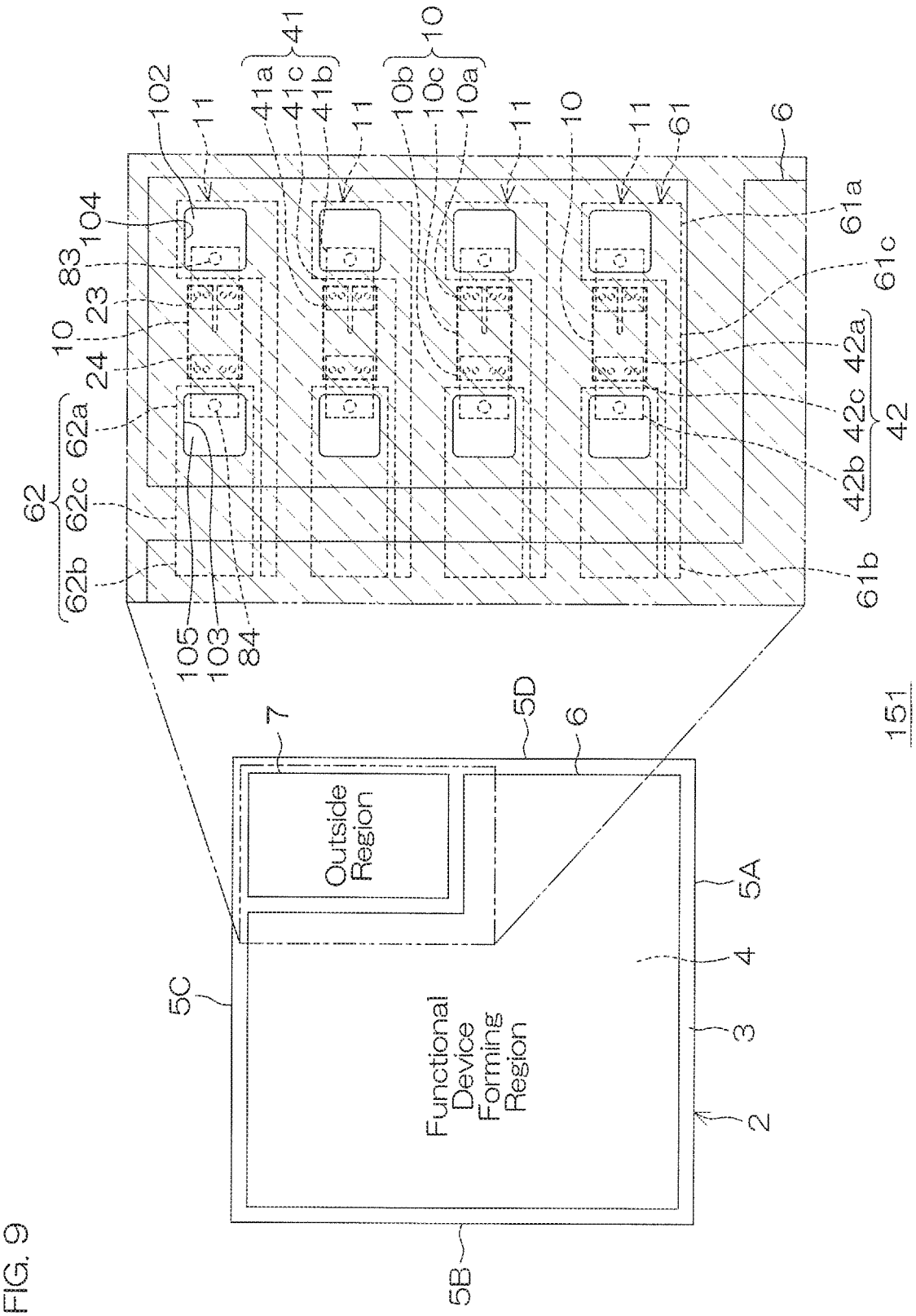
FIG. 9 is a schematic plan view of an electronic component according to a second preferred embodiment of the present invention, showing a configuration in which a resistance layer according to a first configuration example is incorporated.

FIG. 9 is a schematic plan view of an electronic component 151 according to a second preferred embodiment of the present invention, showing a configuration in which a resistance layer 10 according to a first configuration example is incorporated. In the following, structures corresponding to the structures described for the electronic component 1 shall be provided with the same reference symbols and description thereof shall be omitted.

The electronic component 1 includes the single resistance circuit 11 (resistance layer 10) formed in the outer region 7. In contrast, referring to FIG. 9, the electronic component 151 includes multiple (two or more; four in this configuration) resistance circuits 11 (resistance layers 10) formed in the outer region 7. The number of resistance circuits 11 (resistance layers 10) is arbitrary and five or more may be formed in accordance with the configuration of the functional device.

The multiple resistance circuits 11 (resistance layers 10) are electrically connected to the device forming region 6 (functional device) through the connection circuit forming layer 21. The multiple resistance circuits 11 (resistance layers 10) may be electrically connected to the device forming region 6 independently of each other. At least two of the multiple resistance circuits 11 (resistance layers 10) may be connected to each other in parallel or in series.

As described above, the same effects as those described for the electronic component 1 can be exhibited as well by the electronic component 151.

In this configuration, an example has been described in which the resistance layer 10 according to the first configuration example is applied. However, the multiple resistance layers 10 according to the second configuration example, the third configuration example, the fourth configuration example, or the fifth configuration example may be employed in place of or in addition to the resistance layer 10 according to the first configuration example. There may also be employed multiple resistance layers 10 having a configuration in which at least two of the features of the resistance layers 10 according to the first to fifth configuration examples are combined.

Figure 10:
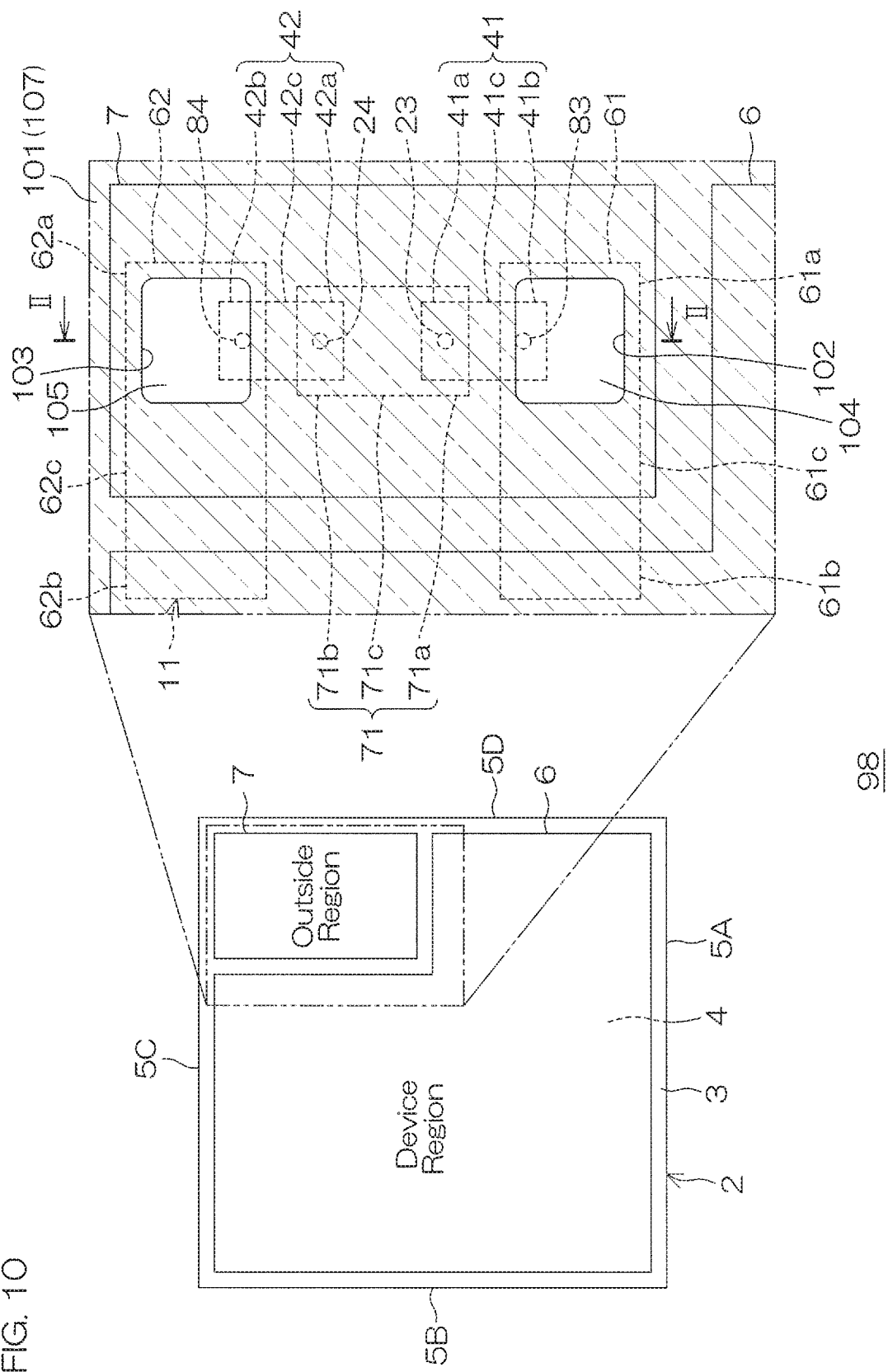
FIG. 10 is a schematic plan view of an electronic component according to a third preferred embodiment of the present invention, showing a configuration in which a thin-film resistance according to a first configuration example is incorporated.
Figure 11:
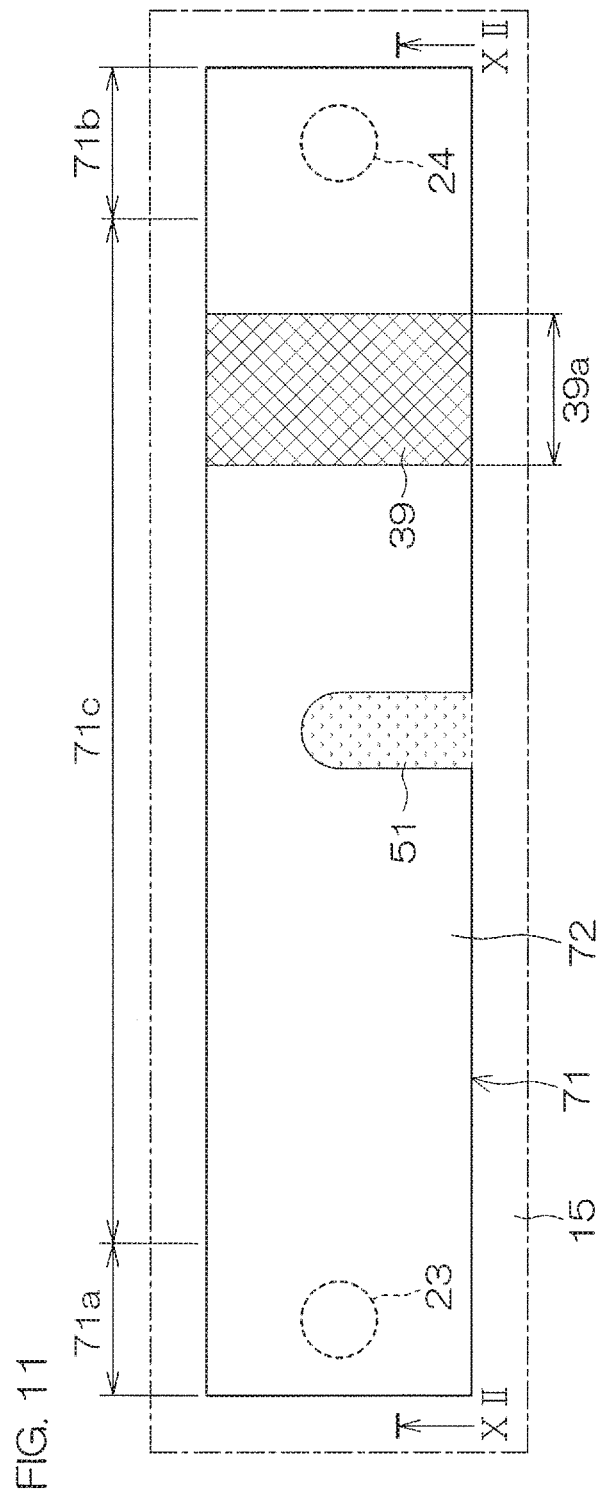
FIG. 11 is a plan view of the thin-film resistance shown in FIG. 10.
Figure 12:
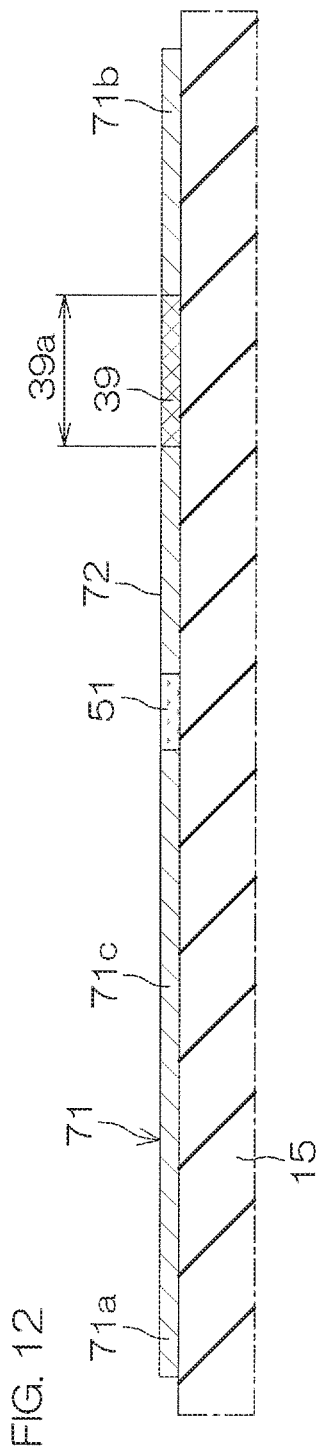
FIG. 12 is a sectional view taken along line XII-XII shown in FIG. 11.
Figure 13:
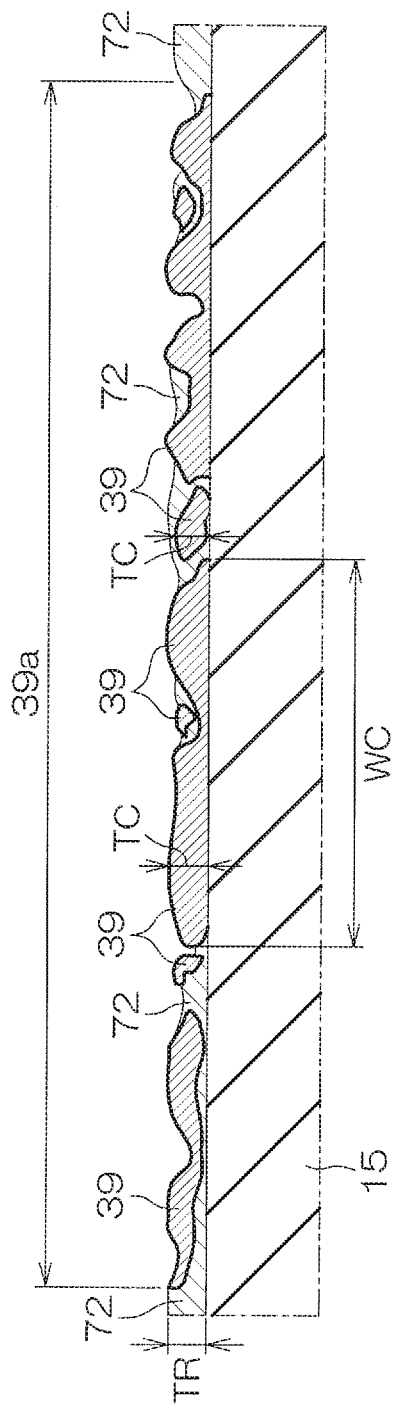
FIG. 13 is a schematic enlarged sectional view of a region in which chromium aggregates are formed.

FIG. 10 is a schematic plan view of an electronic component 98 according to a third preferred embodiment of the present invention, showing a configuration in which a thin-film resistance 71 according to a first configuration example is incorporated. FIG. 11 is a plan view of the thin-film resistance 71 shown in FIG. 10. FIG. 12 is a sectional view taken along line XII-XII shown in FIG. 11. FIG. 13 is a schematic enlarged sectional view of a region in which chromium aggregates 39 are formed. FIG. 14 is a schematic enlarged sectional view of a region in which a trimming mark 51 is formed.

It is noted that in FIGS. 10 to 14, components identical to those in FIGS. 1 to 7 (FIGS. 7A to 7D) shall be provided with the common reference symbols and description thereof shall be omitted.

Referring to FIGS. 11 and 12, the thin-film resistance 71 is formed so as to straddle the first via electrode 23 and the second via electrode 24. The thin-film resistance 71 is thus electrically connected to the first via electrode 23 and the second via electrode 24. In this configuration, the thin-film resistance 71 is formed in a quadrilateral shape (more specifically, a rectangular shape) in plan view. The planar shape of the thin-film resistance 71 is arbitrary and is not restricted to a quadrilateral shape. That is, in the present preferred embodiment, the thin-film resistance 71 is provided in place of the above-described resistance layer 10.

The thin-film resistance 71 includes a first end portion 71a on one side, a second end portion 71b on the other side, and a connection portion 71c that connects the first end portion 71a and the second end portion 71b. The first end portion 71a covers the first via electrode 23. More specifically, the first end portion 71a covers the first end portion 23a (first projecting portion 23c) of the first via electrode 23. The first end portion 71a is formed in a film shape along the principal surface and the side surface of the first via electrode 23.

The second end portion 71b covers the second via electrode 24. More specifically, the second end portion 71b covers the first end portion 24a (second projecting portion 24c) of the second via electrode 24. The second end portion 71b is formed in a film shape along the principal surface and the side surface of the second via electrode 24.

The connection portion 71c extends in a band shape through a region between the first end portion 71a and the second end portion 71b. In this configuration, the connection portion 71c extends in a band shape along a straight line connecting the first end portion 71a and the second end portion 71b. In this configuration, the first end portion 71a, the second end portion 71b, and the connection portion 71c are each formed with a uniform width.

The thin-film resistance 71 includes a resistance layer 72 containing chromium silicide and chromium aggregates 39 made of chromium agglomeration and formed in the resistance layer 72. In this configuration, the resistance layer 72 contains crystalized chromium silicide. The resistance layer 72 is a so-called metal silicide thin-film resistance. With the resistance layer 72 made of a metal silicide thin-film resistance, the thickness and the planar area of the thin film can be adequately reduced unlike conductive polysilicon or the like.

It is thereby possible to adequately interpose the resistance layer 72 in the region between the third insulating layer 15 and the fourth insulating layer 16 while ensuring flatness. Since the planar area of the resistance layer 72 can be adequately reduced, design rules can also be eased. It is thereby possible to adequately arrange the resistance layer 72 in the outer region 7. The mutual electrical influences between the resistance layer 72 and the device forming region 6 can thus be adequately suppressed.

The resistance layer 72 may include at least one type of substance among CrSi, $CrSi_2$, CrSiN, and CrSiO as an example of chromium silicide. CrSiN is also chromium nitride. CrSiO is also chromium oxide. In this configuration, the resistance layer 72 is made of CrSi.

The resistance layer 72 has a thickness TR not more than 1 μm. The thickness TR is preferably not more than 500 nm. The thickness TR is more preferably not less than 0.1 nm and not more than 100 nm. The thickness TR may be not less than 0.1 nm and not more than 5 nm, not less than 5 nm and not more than 10 nm, not less than 10 nm and not more than 20 nm, not less than 20 nm and not more than 40 nm, not less than 40 nm and not more than 60 nm, not less than 60 nm and not more than 80 nm, or not less than 80 nm and not more than 100 nm. The thickness TR is most preferably not less than 1 nm and not more than 5 nm.

The resistance layer 72 may have a sheet resistance value RT not less than 100Ω/□ and not more than 50000Ω/□. The sheet resistance value RT may be not less than 100Ω/□ and not more than 5000Ω/□, not less than 5000Ω/□ and not more than 10000Ω/□, not less than 10000Ω/□ and not more than 15000Ω/□, not less than 15000Ω/□ and not more than 20000Ω/□, not less than 20000Ω/□ and not more than 25000Ω/□, not less than 25000Ω/□ and not more than 30000Ω/□, not less than 30000Ω/□ and not more than 35000Ω/□, not less than 35000Ω/□ and not more than 40000Ω/□, not less than 40000Ω/□ and not more than 45000Ω/□, or not less than 45000Ω/□ and not more than 50000 Ω/□.

The chromium content with respect to the total weight of the resistance layer 72 may be not less than 5 wt % and not more than 50 wt %. The Cr content may be not less than 5 wt % and not more than 10 wt %, not less than 10 wt % and not more than 20 wt %, not less than 20 wt % and not more than 30 wt %, not less than 30 wt % and not more than 40 wt %, or not less than 40 wt % and not more than 50 wt %.

Referring to FIGS. 11 to 13, the chromium aggregates 39 are irregularly formed in any region of the resistance layer 72. In FIGS. 11 and 12, the region in which the chromium aggregates 39 are formed is shown with cross-hatching. The chromium aggregates 39 are made of chromium. The chromium aggregates 39 may contain a trace of silicon. The chromium aggregates 39 have a specific resistance ρ2 smaller than a specific resistance ρ1 of the resistance layer 72 (ρ2<ρ1).

The chromium aggregates 39 are electrically connected to the resistance layer 72. The chromium aggregates 39 may be connected in series to the resistance layer 72 or may be connected in parallel to the resistance layer 72. The chromium aggregates 39 may be connected directly to each other or may be electrically connected to each other through the resistance layer 72. The chromium aggregates 39 are electrically connected to each other to collectively form, within the resistance layer 72, a low-resistance region 39a having a resistance value smaller than the resistance value of the resistance layer 72.

The resistance value of the resistance layer 72 is reduced by the chromium aggregates 39. The resistance value of the resistance layer 72 is adjusted in a decreasing direction by adjusting the percentage of the chromium aggregates 39 within the resistance layer 72. The resistance value of the resistance layer 72 can be brought close to the resistance value of chromium by increasing the percentage of the chromium aggregates 39 within the resistance layer 72. In contrast thereto, the resistance value of the resistance layer 72 can be brought close to the resistance value of chromium silicide by decreasing the percentage of the chromium aggregates 39 within the resistance layer 72.

The chromium aggregates 39 are formed by melting and re-curing chromium silicide, during which chromium contained in the chromium silicide is aggregated. In this configuration, the chromium aggregates 39 are formed by irradiating the resistance layer 72 with a laser beam to aggregate chromium in a portion irradiated with the laser beam within the resistance layer 72.

The planar area and the thickness TR of the resistance layer 72 hardly change before and after laser beam irradiation. With the laser irradiation method, it is possible to form the chromium aggregates 39 while maintaining the size of the resistance layer 72. Also, with the laser irradiation method, it is possible to adequately control the percentage of the chromium aggregates 39 within the resistance layer 72. It is thereby possible to flexibly adjust the resistance value of the resistance layer in a decreasing direction.

The multiple chromium aggregates 39 may be formed in the entire resistance layer 72 or may be formed in a partial region of the resistance layer 72. However, in the case of forming the chromium aggregates 39 in the entire resistance layer 72, since it is necessary to irradiate the entire resistance layer 72 with a laser beam, the manufacturing time is increased. Also, in the case of forming the multiple chromium aggregates 39 in the entire resistance layer 72, it is more reasonable to form a thin-film resistance 71 made of chromium. It is therefore preferred that the multiple chromium aggregates 39 are formed in a mode in which part of the resistance layer 72 remains without the chromium aggregates 39 formed therein.

As an example, the multiple chromium aggregates 39 are preferably formed in a region greater than 0% and not more than 50% of the resistance layer 72. The multiple chromium aggregates 39 may be formed in a region greater than 0% and not more than 5%, not less than 5% and not more than 10%, not less than 10% and not more than 15%, not less than 15% and not more than 20%, not less than 20% and not more than 30%, not less than 30% and not more than 40%, or not less than 40% and not more than 50% of the resistance layer 72. In these cases, the resistance value of the resistance layer 72 can be adequately fine-adjusted in a decreasing direction while suppressing manufacturing delay.

As another example, the multiple chromium aggregates 39 may be formed such that the resistance value of the resistance layer 72 decreases within a range of greater than 0% and not more than 50%. The multiple chromium aggregates 39 may be formed such that the resistance value of the resistance layer 72 decreases within a range of greater than 0% and not more than 5%, not less than 5% and not more than 10%, not less than 10% and not more than 15%, not less than 15% and not more than 20%, not less than 20% and not more than 30%, not less than 30% and not more than 40%, or not less than 40% and not more than 50%. In these cases, the resistance value of the resistance layer 72 can be adequately fine-adjusted in a decreasing direction while suppressing manufacturing delay.

The thin-film resistance 71 contains one or more chromium aggregates 39 formed as grains or layers (films). The thin-film resistance 71 may contain one or more layers (films) of chromium aggregates 39 in which chromium aggregates 39 are continuous with each other. The thin-film resistance 71 contains one or more chromium aggregates 39 having a width WC greater than the thickness TR of the resistance layer 72 (TR<TC).

The thin-film resistance 71 may contain one or more chromium aggregates 39 having a thickness TC smaller than the thickness TR of the resistance layer 72 (TC<TR). The thin-film resistance 71 may contain one or more chromium aggregates 39 having a thickness TC greater than the thickness TR of the resistance layer 72 (TR<TC).

The thin-film resistance 71 may contain one or more chromium aggregates 39 exposed from the lower surface and the upper surface of the resistance layer 72. The thin-film resistance 71 may contain one or more chromium aggregates 39 partially exposed from the lower surface or the upper surface of the resistance layer 72. The thin-film resistance 71 may contain one or more chromium aggregates 39 entirely covered with the resistance layer 72.

Referring to FIGS. 11, 12, and 14, the thin-film resistance 71 includes a trimming mark 51 formed in the resistance layer 72. In FIGS. 11 and 12, the trimming mark 51 is shown with dot-hatching.

The trimming mark 51 is a region in which the resistance layer 72 (chromium silicide) partially disappeared. More specifically, the trimming mark 51 is a laser processing mark in which the resistance layer 72 (chromium silicide) partially disappeared by a laser irradiation method.

In this configuration, the trimming mark 51 is formed in a manner spaced from the region (low-resistance region 39a) of the resistance layer 72 (connection portion 71c) in which the chromium aggregates 39 are formed. The trimming mark 51 may be formed in either or both of the first end portion 71a and the second end portion 71b.

The trimming mark 51 extends in a direction intersecting with the direction in which the resistance layer 72 extends. In this configuration, the trimming mark 51 extends in a direction orthogonal to the direction in which the resistance layer 72 extends. The trimming mark 51 may extend in a direction in which the resistance layer 72 extends.

The trimming mark 51 contains multiple conductive residues 52a irregularly formed in a manner spaced from the resistance layer 72. The multiple conductive residues 52a are portions separated from the resistance layer 72. More specifically, the multiple conductive residues 52a are portions detached from the resistance layer 72 by a laser irradiation method. The multiple conductive residues 52a are electrically isolated from the resistance layer 72.

The trimming mark 51 contains insulator 52b that covers the multiple conductive residues 52a. The insulator 52b is interposed between the resistance layer 72 and the conductive residues 52a. The insulator 52b is interposed between the multiple conductive residues 52a.

In this configuration, the insulator 52b contains silicon oxide. The insulator 52b may contain silicon oxide formed due to silicon of chromium silicide or may contain a portion of the protective layer 40. The insulator 52b increases the insulation property between the resistance layer 72 and the multiple conductive residues 52a.

The resistance value of the resistance layer 72 is adjusted in an increasing direction by the number, shape, length, arrangement, etc., of the trimming marks 51. The resistance value of the resistance layer 72 is adjusted to both in a decreasing direction and an increasing direction by the combination of the chromium aggregates 39 and the trimming mark 51. It is thereby possible to adequately adjust the resistance value of the thin-film resistance 71. The trimming mark 51 is not necessarily required to be formed. A resistance layer 72 without a trimming mark 51 may thus be formed.

The thin-film resistance 71 may take on various configurations. Other configuration examples of the thin-film resistance 71 shall now be described with reference to FIGS. 15A to 15F.

Figure 15A:
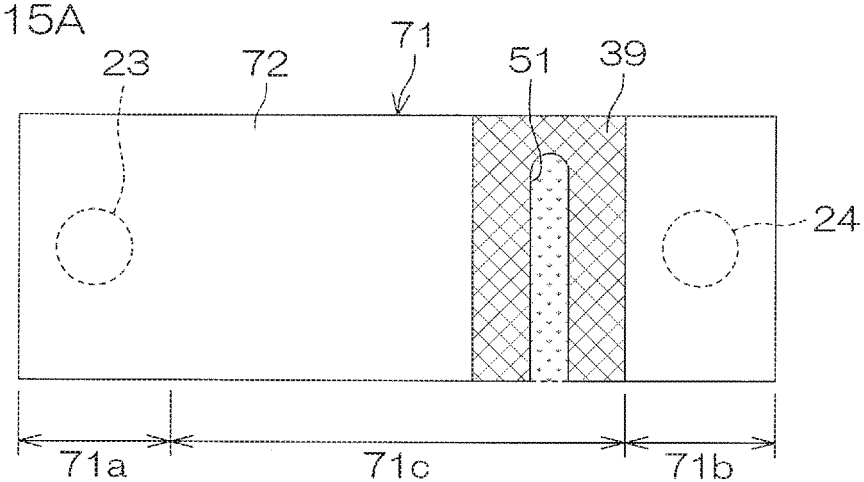
FIG. 15A is a plan view of a second configuration example of the thin-film resistance shown in FIG. 10.

FIG. 15A is a plan view of a thin-film resistance 71 according to a second configuration example. In the following, structures corresponding to the structures described in FIGS. 1 to 14 shall be provided with the same reference symbols and description thereof shall be omitted. Referring to FIG. 15A, the thin-film resistance 71 may have a trimming mark 51 that overlaps the region (low-resistance region 39a) of the resistance layer 72 including the chromium aggregates 39 in plan view.

In this configuration, the entire trimming mark 51 is formed in the region (low-resistance region 39a) including the chromium aggregates 39. The trimming mark 51 may be partially positioned in the region (low-resistance region 39a) including the chromium aggregates 39. That is, the trimming mark 51 which crosses the region (low-resistance region 39a) including the chromium aggregates 39 may be formed.

Figure 15B:
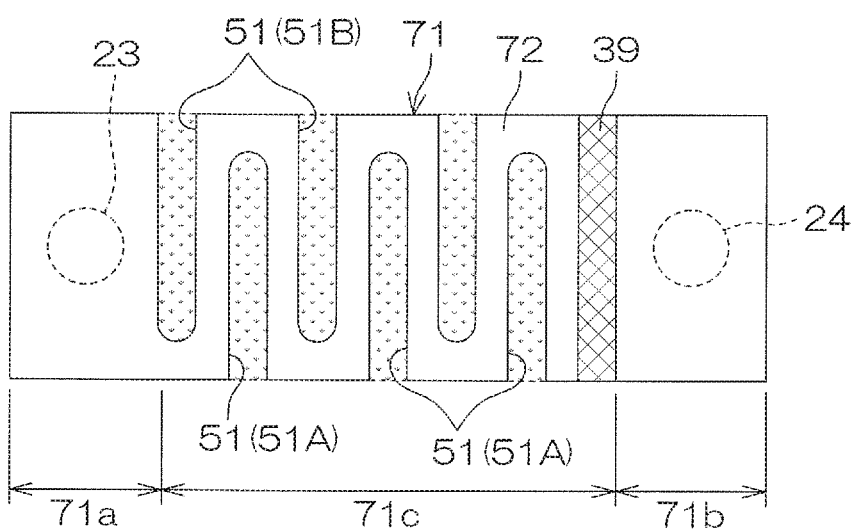
FIG. 15B is a plan view of a third configuration example of the thin-film resistance shown in FIG. 10.

FIG. 15B is a plan view of a thin-film resistance 71 according to a third configuration example. In the following, structures corresponding to the structures described in FIGS. 1 to 14 shall be provided with the same reference symbols and description thereof shall be omitted. Referring to FIG. 15B, the thin-film resistance 71 which includes multiple trimming marks 51 may be formed.

The multiple trimming marks 51 extend in a direction intersecting with the direction in which the connection portion 71c extends. In this configuration, the multiple trimming marks 51 extend in a direction orthogonal to the direction in which the connection portion 71c extends. In this configuration, the multiple trimming marks 51 include one or more (three in this configuration) first trimming marks 51A and one or more (three in this configuration) second trimming marks 51B.

The multiple first trimming marks 51A are formed so as to be spaced from one of the sides extending in the longitudinal direction in the connection portion 71c. The multiple second trimming marks 51B are formed so as to be spaced from the other of the sides extending in the longitudinal direction in the connection portion 71c. The multiple second trimming marks 51B are formed alternately with the multiple first trimming marks 51A in the longitudinal direction. The thin-film resistance 71 is thus formed in a meandering shape as a whole in plan view.

Figure 15C:
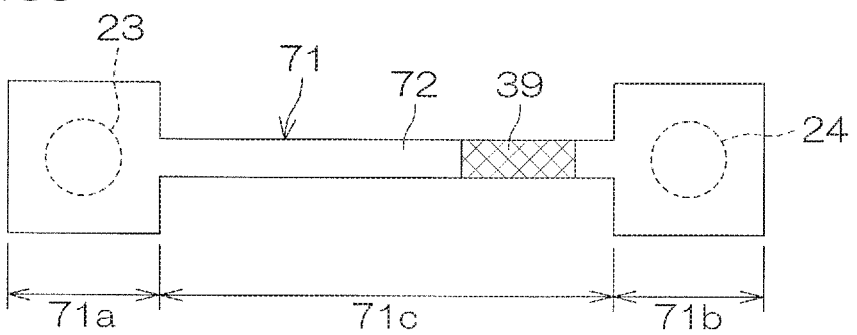
FIG. 15C is a plan view of a fourth configuration example of the thin-film resistance shown in FIG. 10.

FIG. 15C is a plan view of a thin-film resistance 71 according to a fourth configuration example. In the following, structures corresponding to the structures described in FIGS. 1 to 14 shall be provided with the same reference symbols and description thereof shall be omitted. Referring to FIG. 15C, the thin-film resistance 71 which includes a first end portion 71a, a second end portion 71b, and a connection portion 71c each having different width may be formed.

More specifically, the first end portion 71a is formed to have a width different from that of the connection portion 71c. The second end portion 71b is formed to have a width different from that of the connection portion 71c. In this configuration, the second end portion 71b is formed to have a width equal to that of the first end portion 71a. The second end portion 71b may be formed to have a width different from that of the first end portion 71a. The connection portion 71c has a width narrower than those of the first end portion 71a and the second end portion 71b.

In this configuration, the first end portion 71a is formed in a quadrilateral shape (square shape in this configuration) in plan view. The planar shape of the first end portion 71a is arbitrary. The first end portion 71a may be formed in a polygonal shape such as a triangular shape or a hexagonal shape, etc., in plan view. The first end portion 71a may be formed in a circular shape or an elliptical shape in plan view.

The second end portion 71b is formed in a quadrilateral shape (square shape in this configuration) in plan view. The planar shape of the second end portion 71b is arbitrary. The second end portion 71b may be formed in a polygonal shape such as a triangular shape or a hexagonal shape, etc., in plan view. The second end portion 71b may be formed in a circular shape or an elliptical shape in plan view.

Figure 15D:
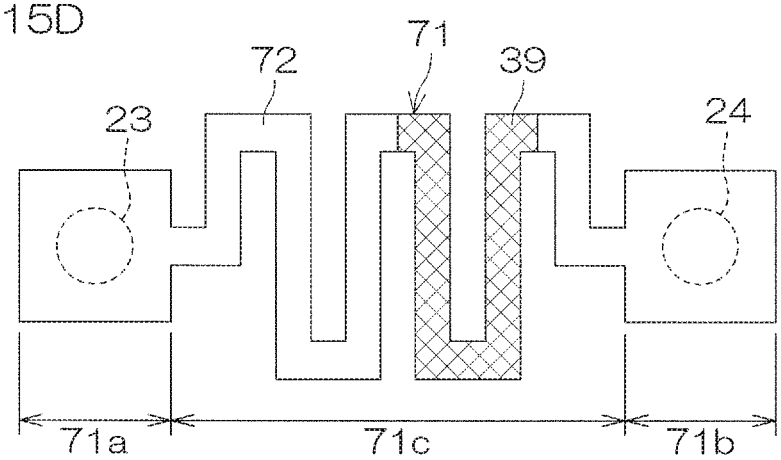
FIG. 15D is a plan view of a fifth configuration example of the thin-film resistance shown in FIG. 10.

FIG. 15D is a plan view of a thin-film resistance 71 according to a fifth configuration example. In the following, structures corresponding to the structures described in FIGS. 1 to 14 shall be provided with the same reference symbols and description thereof shall be omitted. Referring to FIG. 15D, the thin-film resistance 71 which includes a first end portion 71a, a second end portion 71b, and a connection portion 71c each having different width may be formed.

The first end portion 71a is formed to have a width different from that of the connection portion 71c. The second end portion 71b is formed to have a width different from that of the connection portion 71c. In this configuration, the second end portion 71b is formed to have a width equal to that of the first end portion 71a. The second end portion 71b may be formed to have a width different from that of the first end portion 71a.

The connection portion 71c has a width narrower than those of the first end portion 71a and the second end portion 71b. In this configuration, the connection portion 71c extends in a meandering shape through a region between the first end portion 71a and the second end portion 71b in plan view.

In this configuration, the first end portion 71a is formed in a quadrilateral shape (square shape in this configuration) in plan view. The planar shape of the first end portion 71a is arbitrary. The first end portion 71a may be formed in a polygonal shape such as a triangular shape or a hexagonal shape, etc., in plan view. The first end portion 71a may be formed in a circular shape or an elliptical shape in plan view.

The second end portion 71b is formed in a quadrilateral shape (square shape in this configuration) in plan view. The planar shape of the second end portion 71b is arbitrary. The second end portion 71b may be formed in a polygonal shape such as a triangular shape or a hexagonal shape, etc., in plan view. The second end portion 71b may be formed in a circular shape or an elliptical shape in plan view.

Figure 15E:
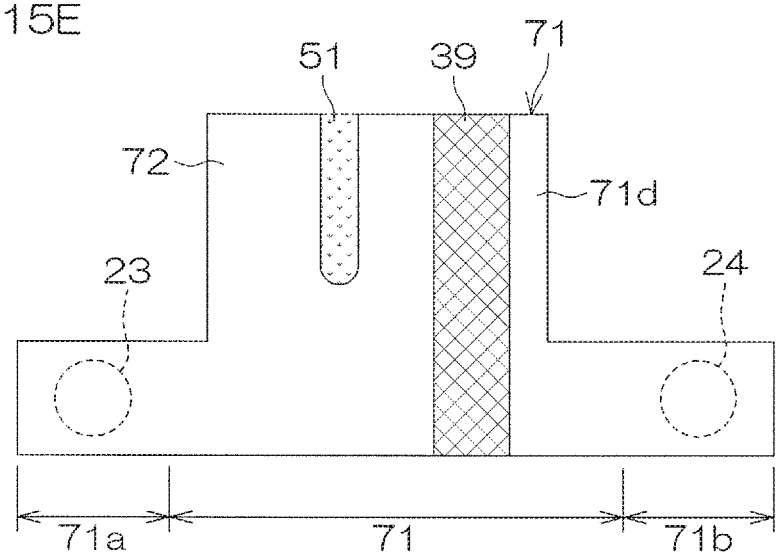
FIG. 15E is a plan view of a sixth configuration example of the thin-film resistance shown in FIG. 10.

FIG. 15E is a plan view of a thin-film resistance 71 according to a sixth configuration example. In the following, structures corresponding to the structures described in FIGS. 1 to 14 shall be provided with the same reference symbols and description thereof shall be omitted. Referring to FIG. 15E, the thin-film resistance 71 which includes a lead-out portion 71d in addition to a first end portion 71a, a second end portion 71b, and a connection portion 71c may be formed.

The lead-out portion 71d is led out from the connection portion 71c in a direction intersecting with the direction in which the connection portion 71c extends. More specifically, the lead-out portion 71d is led out in a direction orthogonal to the direction in which the connection portion 71c extends. In this configuration, the lead-out portion 71d is formed in a quadrilateral shape in plan view.

The lead-out portion 71d is a region in which the trimming mark 51 is formed. In this configuration, one trimming mark 51 is formed in the lead-out portion 71d. Multiple trimming marks 51 may be formed in the lead-out portion 71d. The lead-out portion 71d without a trimming mark 51 may be formed.

The chromium aggregates 39 may be formed in the connection portion 71c and/or the lead-out portion 71d. FIG. 15E shows an example in which the chromium aggregates 39 are formed in the connection portion 71c and the lead-out portion 71d.

Figure 15F:
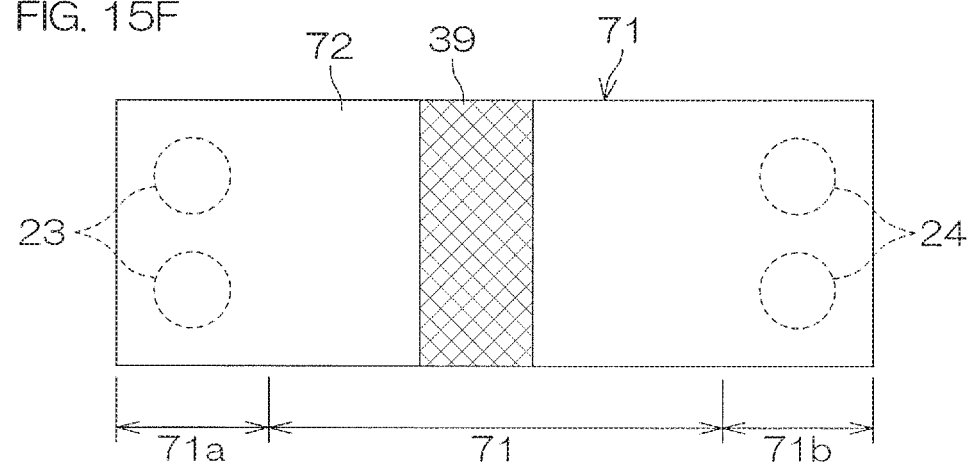
FIG. 15F is a plan view of a seventh configuration example of the thin-film resistance shown in FIG. 10.

FIG. 15F is a plan view of a thin-film resistance 71 according to a seventh configuration example. In the following, structures corresponding to the structures described in FIGS. 1 to 14 shall be provided with the same reference symbols and description thereof shall be omitted. Referring to FIG. 15F, the thin-film resistance 71 which is electrically connected to the multiple (two in this configuration) first via electrodes 23 and multiple (two in this configuration) second via electrodes 24 may be formed. That is, the resistance circuit 11 may include multiple first via electrodes 23 and multiple second via electrodes 24.

The number of the first via electrodes 23 and the second via electrodes 24 is arbitrary. The number of the first via electrodes 23 may differ from the number of the second via electrodes 24. The number of the first via electrodes 23 may be smaller than the number of the second via electrodes 24.

The number of the first via electrodes 23 may be greater than the number of the second via electrodes 24. It may be arranged such that one first via electrode 23 is formed, while multiple second via electrodes 24 are formed. It may be arranged such that multiple first via electrodes 23 are formed, while one second via electrode 24 is formed.

The features of the thin-film resistances 71 according to the first configuration example, the second configuration example, the third configuration example, the fourth configuration example, the fifth configuration example, the sixth configuration example, and the seventh configuration example can be combined with each other in any mode and any configuration. There may be employed a thin-film resistance 71 having a configuration in which at least two of the features of the thin-film resistances 71 according to the first to seventh configuration examples are combined. For example, the features of the thin-film resistance 71 according to the seventh configuration example may be incorporated in the thin-film resistances 71 according to the first to sixth configuration examples.

The above-described protective layer 40 covers the thin-film resistance 71. The protective layer 40 is interposed in the region between the third insulating layer 15 and the fourth insulating layer 16 and covers the thin-film resistance 71. More specifically, the protective layer 40 is formed in a film shape along the exposed surface of the resistance layer 72 and the exposed surface of the chromium aggregates 39. That is, it is only required to replace the resistance layer 10, the first end portion 10a, the second end portion 10b, and the connection portion 10c in FIGS. 2 to 4 with the thin-film resistance 71, the first end portion 71a, the second end portion 71b, and the connection portion 71c.

The protective layer 40 further covers the trimming mark 51. The protective layer 40 may cover the conductive residues 52a in the trimming mark 51. The protective layer 40 may form a part or a whole of the insulator 52b in the trimming mark 51.

The protective layer 40 has a planar shape matching the planar shape of the resistance layer 72 (thin-film resistance 71). The protective layer 40 may have side surfaces continuous with the side surfaces of the resistance layer 72. The side surfaces of the protective layer 40 may be formed flush with the side surfaces of the resistance layer 72.

The protective layer 40 may have a layered structure that includes a silicon oxide layer and a silicon nitride layer. In this case, the silicon nitride layer may be formed on the silicon oxide layer or the silicon oxide layer may be formed on the silicon nitride layer. The protective layer 40 may have a single-layer structure made of a silicon oxide layer or a silicon nitride layer. In this configuration, the protective layer 40 has a single-layer structure made of a silicon oxide layer.

The protective layer 40 may have a thickness not less than 1 nm and not more than 5 µm. The thickness of the protective layer 40 may be not less than 1 nm and not more than 10 nm, not less than 10 nm and not more than 50 nm, not less than 50 nm and not more than 100 nm, not less than 100 nm and not more than 200 nm, not less than 200 nm and not more than 400 nm, not less than 400 nm and not more than 600 nm, not less than 600 nm and not more than 800 nm, or not less than 800 nm and not more than 1 µm.

The thickness of the protective layer 40 may be not less than 1 µm and not more than 1.5 µm, not less than 1.5 µm and not more than 2 µm, not less than 2 µm and not more than 2.5 µm, not less than 2.5 µm and not more than 3 µm, not less than 3 µm and not more than 3.5 µm, not less than 3.5 µm and not more than 4 µm, not less than 4 µm and not more than 4.5 µm, or not less than 4.5 µm and not more than 5 µm.

The thickness of the protective layer 40 is preferably not less than the thickness TR of the resistance layer 72. With the protective layer 40 having a thickness not less than the thickness TR of the resistance layer 72, it is possible to adequately smooth out bulges formed on the resistance layer 72.

Then, the above-described steps shown in FIGS. 8A to 8P, for example, are first performed to manufacture the electronic component 98.

Next, referring to FIG. 16A, a passivation layer 106 is formed on the multilayer wiring structure 12. The passivation layer 106 contains silicon nitride. The passivation layer 106 may be formed by a CVD method.

Figure 16B:
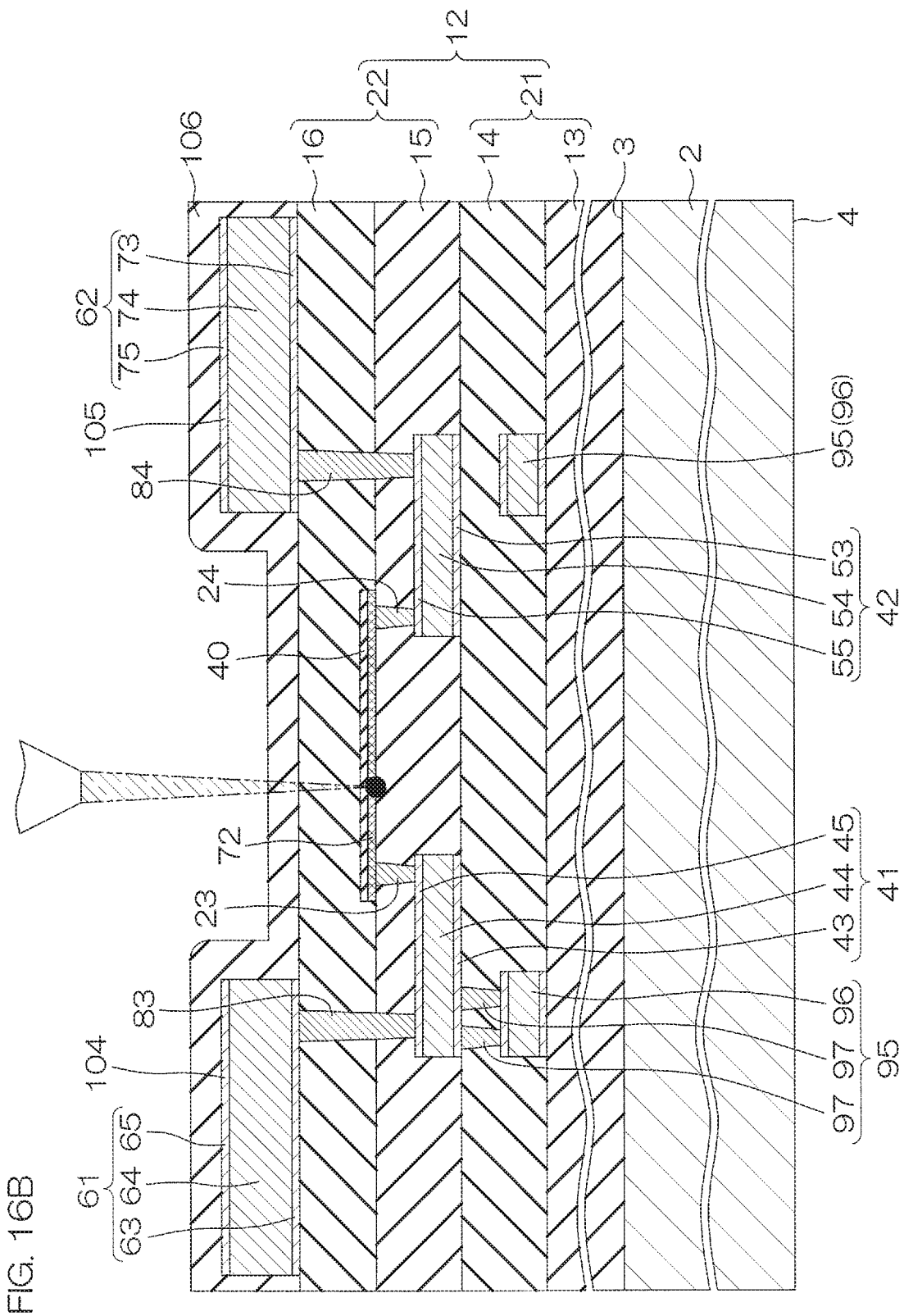

Next, referring to FIG. 16B, a trimming mark 51 is formed in a predetermined region of the resistance layer 72 (see FIGS. 11, 12, and 14). In this step, a laser beam irradiation step is performed in which the resistance layer 72 is irradiated with a laser beam. In this step, the resistance layer 72 is focused on and irradiated with a laser beam having energy with which the resistance layer 72 can be blocked.

The energy of the laser beam is adjusted to an extent where chromium silicide in a portion irradiated with the laser beam disappears such that multiple conductive residues 52a detached from the resistance layer 72 are formed. The trimming mark 51 is thus formed in the resistance layer 72. In this step, insulator 52b that covers the multiple conductive residues 52a is also formed.

The insulator 52b is interposed between the resistance layer 72 and the conductive residues 52a. The insulator 52b is interposed between the multiple conductive residues 52a. The insulator 52b may contain $SiO_2$ formed due to silicon of chromium silicide or may contain a melted portion of the protective layer 40. The insulator 52b increases the insulation property between the resistance layer 72 and the multiple conductive residues 52a.

The step of forming the trimming mark 51 includes the step of adjusting the resistance value of the resistance layer 72 in an increasing direction. Thereby, a resistance value of the resistance layer 72 is adjusted to a desired value. The resistance value of the resistance layer 72 is adjusted in an increasing direction by the number, shape, length, arrangement, etc., of the trimming marks 51.

Also, referring to FIG. 16C, chromium aggregates 39 are formed in a predetermined region of the resistance layer 72 (see FIGS. 11 to 13). In this step, a laser beam irradiation step is performed in which the resistance layer 72 is irradiated with a laser beam. In a portion irradiated with the laser beam in the resistance layer 72, chromium silicide is melted and chromium contained in the chromium silicide aggregates in an agglomerated manner. The chromium aggregates 39 are thus formed in the resistance layer 72. The chromium aggregates 39 may contain a trace of silicon. The multiple chromium aggregates 39 are formed in the portions of laser beam irradiation.

The energy of the laser beam is adjusted to an extent where chromium silicide in the portion irradiated with the laser beam does not entirely disappear such that the resistance layer 72 (chromium silicide) and the chromium aggregates 39 remain connected. In this step, the resistance layer 72 is irradiated with a laser beam having energy that can block the resistance layer 72 while being defocused from the resistance layer 72.

The chromium aggregates 39 can thus be formed using the same laser irradiator as in the step of forming the trimming mark 51. That is, the step of forming the chromium aggregates 39 can be performed without using a new laser irradiator.

The focus of the laser beam may be shifted downward (toward the semiconductor layer 2 side) with respect to the resistance layer 72 or may be shifted upward (toward the fourth insulating layer 16 side) with respect to the resistance layer 72. The multiple chromium aggregates 39 are thus formed in the resistance layer 72.

The step of forming the chromic aggregates 39 includes the step of adjusting the resistance value of the resistance layer 72 in a decreasing direction. Thereby, a resistance value of the resistance layer 72 is adjusted to a desired value. The resistance value of the resistance layer 72 is adjusted in a decreasing direction in accordance with the percentage of the chromium aggregates 39 within the resistance layer 72. The percentage of the chromium aggregates 39 within the resistance layer 72 can be adjusted by moving the portion irradiated with the laser beam with respect to the resistance layer 72.

The resistance value of the resistance layer 72 can be brought close to the resistance value of chromium by increasing the percentage of the chromium aggregates 39 within the resistance layer 72. In contrast thereto, the resistance value of the resistance layer 72 can be brought close to the resistance value of chromium silicide by decreasing the percentage of the chromium aggregates 39 within the resistance layer 72.

The planar area and the thickness TR of the resistance layer 72 hardly change before and after laser beam irradiation. Therefore, with the laser irradiation method, it is possible to form the chromium aggregates 39 while suppressing the increase in the size and thickness of the resistance layer 72. Also, with the laser irradiation method, it is possible to adequately control the percentage of the chromium aggregates 39 within the resistance layer 72. It is thereby possible to flexibly adjust the resistance value of the resistance layer in a decreasing direction.

The multiple chromium aggregates 39 may be formed in the entire resistance layer 72 or may be formed in a partial region of the resistance layer 72. However, in the case of forming the chromium aggregates 39 in the entire resistance layer 72, since it is necessary to irradiate the entire resistance layer 72 with a laser beam, the manufacturing time is increased. Also, in the case of forming the multiple chromium aggregates 39 in the entire resistance layer 72, it is more reasonable to form a thin-film resistance 71 made of chromium. It is therefore preferred that the chromium aggregates 39 are formed in a mode in which part of the resistance layer 72 remains without the chromium aggregates 39 formed therein.

The step of forming the trimming mark 51 (see FIG. 16B) and the step of forming the chromium aggregates 39 (see FIG. 16C) may be performed in any order. The step of forming the chromium aggregates 39 may be performed after the step of forming the trimming mark 51. In this case, the step of forming the chromium aggregates 39 may include the step of adjusting (fine-adjusting) the resistance value, that has increased in the step of forming the trimming mark 51, in a decreasing direction.

The step of forming the trimming mark 51 may be performed after the step of forming the chromium aggregates 39. In this case, the step of forming the trimming mark 51 may include the step of adjusting (fine-adjusting) the resistance value, that has decreased in the step of forming the chromium aggregates 39, in an increasing direction.

The step of forming the trimming mark 51 and the step of forming the chromium aggregates 39 may be performed alternately, multiple times, and in any order. The step of forming the chromium aggregates 39 may be performed multiple times after the step of forming the trimming mark 51 is performed multiple times. The step of forming the trimming mark 51 may be performed multiple times after the step of forming the chromium aggregates 39 is performed multiple times.

Thereafter, the electronic component 98 is manufactured by performing the steps shown in FIGS. 8P to 8S, etc.

As described above, the electronic component 98 includes the thin-film resistance 71. The thin-film resistance 71 includes the resistance layer 72 containing chromium silicide and chromium aggregates 39 made of chromium agglomeration and formed in the resistance layer 72. In this thin-film resistance 71, the chromium aggregates 39 having a specific resistance $\rho 2$ smaller than a specific resistance $\rho 1$ of chromium silicide ($\rho 2 < \rho 1$) are formed in the resistance layer 72. It is thereby possible to provide the thin-film resistance 71 which includes the resistance layer 72 containing chromium silicide, while having a resistance value smaller than the resistance value of the resistance layer 72, as well as the electronic component 98 which includes the thin-film resistance 71.

The resistance value of the resistance layer 72 can be adjusted in a decreasing direction in accordance with the percentage of the chromium aggregates 39 within the resistance layer 72. The resistance value of the resistance layer 72 is adjusted in a decreasing direction by adjusting the percentage of the chromium aggregates 39 within the resistance layer 72.

In contrast thereto, the resistance value of the resistance layer 72 can be brought close to the resistance value of chromium silicide by decreasing the percentage of the chromium aggregates 39 within the resistance layer 72. The resistance value of the resistance layer 72 can therefore be adjusted in a decreasing direction by forming the chromium aggregates 39 in a partial region of the resistance layer 72.

The resistance layer 72 in the thin-film resistance 71 may have a trimming mark 51 from which chromium silicide has disappeared. With the trimming mark 51, the resistance value of the resistance layer 72 can be adjusted in an increasing direction. The resistance value of the resistance layer 72 can therefore be adjusted in a decreasing direction and an increase direction by forming both the chromium aggregates 39 and the trimming mark 51. It is thereby possible to adequately fine-adjust the resistance value of the resistance layer 72.

Figure 17:
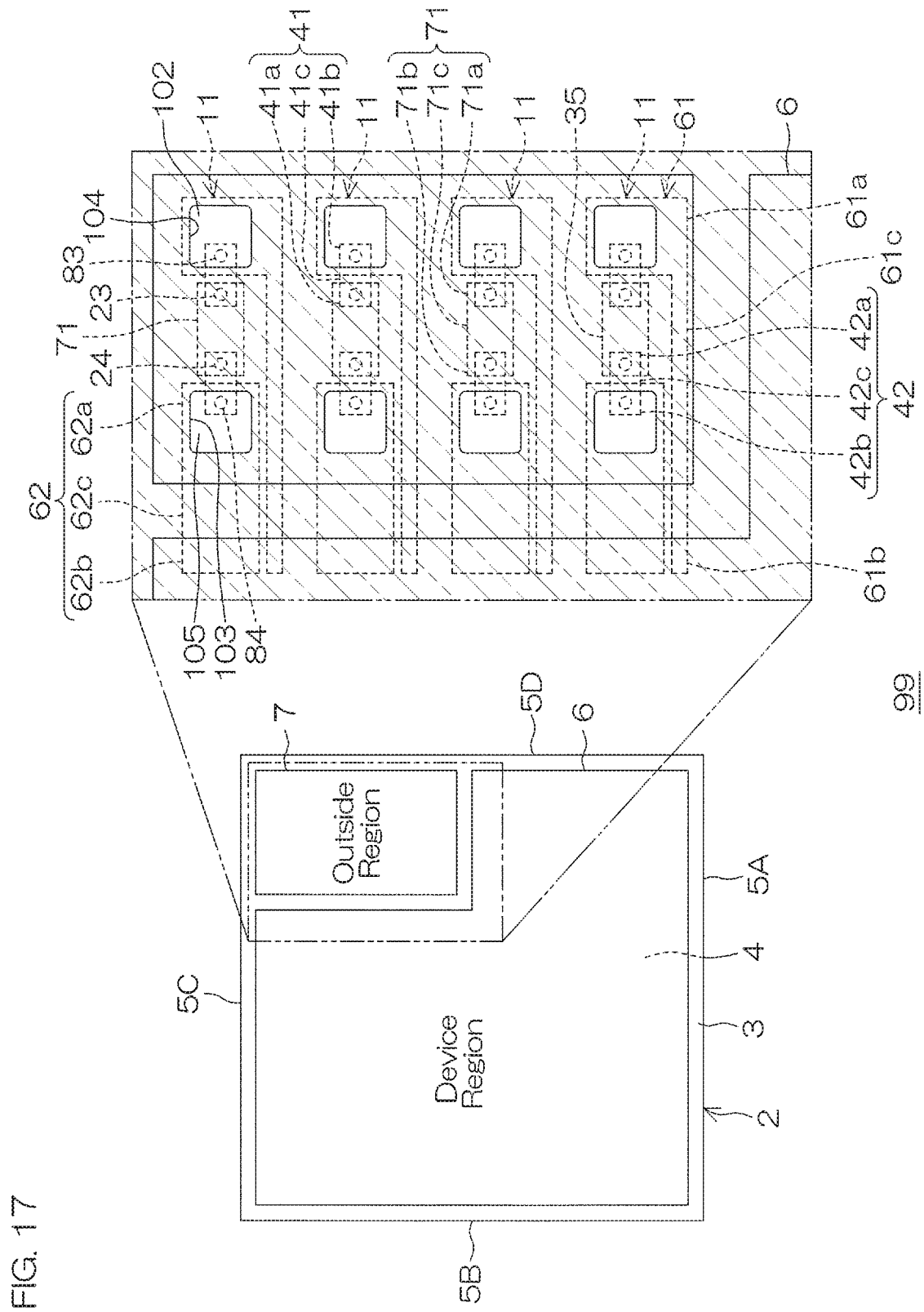
FIG. 17 is a schematic plan view of an electronic component according to a fourth preferred embodiment of the present invention, showing a configuration in which a resistance layer according to a first configuration example is incorporated.

FIG. 17 is a schematic plan view of an electronic component 99 according to a fourth preferred embodiment of the present invention, showing a configuration in which a thin-film resistance 71 according to a first configuration example is incorporated. In the following, structures corresponding to the structures described for the electronic components 1, 151, 98 shall be provided with the same reference symbols and description thereof shall be omitted.

The electronic component 98 includes the single resistance circuit 11 (thin-film resistance 71) formed in the outer region 7. In contrast, referring to FIG. 17, the electronic component 99 includes multiple (two or more; four in this configuration) resistance circuits 11 (thin-film resistances 71) formed in the outer region 7. The number of resistance circuits 11 (resistance layers 71) is arbitrary and five or more may be formed in accordance with the configuration of the functional device.

The multiple resistance circuits 11 (thin-film resistances 71) are electrically connected to the device forming region 6 (functional device) through the connection circuit forming layer 21. The multiple resistance circuits 11 (thin-film resistances 71) may be electrically connected to the device forming region 6 independently of each other. At least two of the multiple resistance circuits 11 (thin-film resistances 71) may be connected to each other in parallel or in series.

In this configuration, the multiple resistance circuits 11 include thin-film resistances 71 according to the first configuration example, respectively. However, the multiple resistance circuits 11 may each include one of the thin-film resistances 71 according to the first to seventh configuration examples.

At least two of the multiple resistance circuits 11 may each include a thin-film resistance 71 according to the same configuration example. The multiple resistance circuits 11 may include thin-film resistances 71 according to different configuration examples. The multiple resistance circuits 11 may each include a thin-film resistance 71 having a configuration in which at least two of the features of the thin-film resistances 71 according to the first to seventh configuration examples are combined.

As described above, the same effects as those described for the electronic component 1 can be exhibited as well by the electronic component 99.

Figure 18:
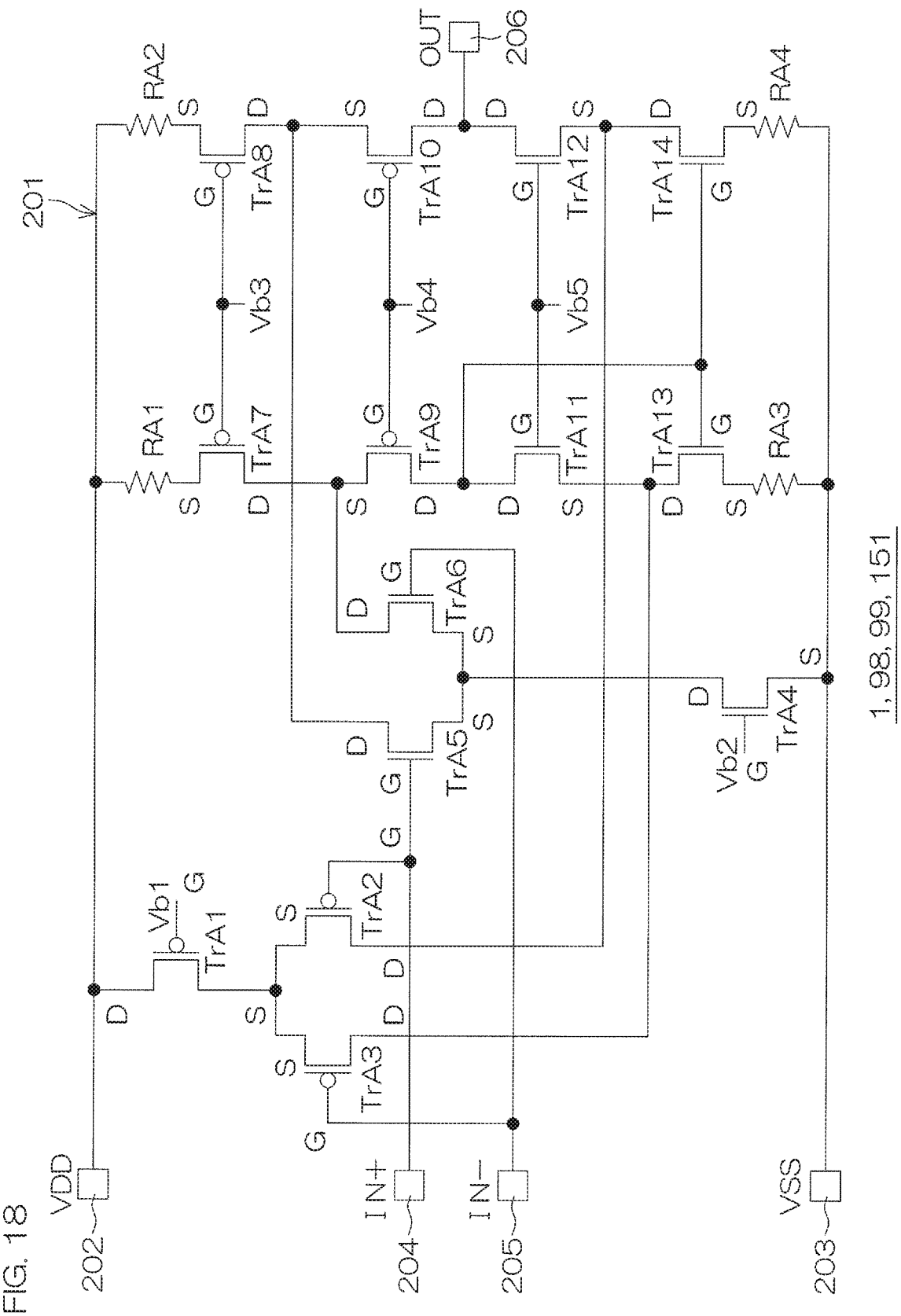
FIG. 18 is a circuit diagram showing an electrical configuration according to a first configuration example of the electronic component.

The above-described electronic components 1, 98, 99, 151 may each have an electrical configuration shown in FIG. 18. FIG. 18 is a circuit diagram showing an electrical configuration according to a first configuration example of the electronic components 1, 98, 99, 151.

Referring to FIG. 18, the electronic components 1, 98, 99, and 151 each include an operational amplifier circuit 201. The operational amplifier circuit 201 includes a positive supply terminal 202, a negative supply terminal 203, a non-inverted positive supply terminal 204, an inverted positive supply terminal 205, an output terminal 206, transistors TrA1 to TrA14 (semiconductor switching devices), and resistors RA1 to RA4 (passive devices).

A supply voltage VDD is input to the positive supply terminal 202. A reference voltage VSS is input to the negative supply terminal 203. The reference voltage VSS may be a ground voltage. A non-inverted voltage VIN+ is input to the non-inverted positive supply terminal 204. An inverted voltage VIN− is input to the inverted positive supply terminal 205. The operational amplifier circuit 201 amplifies and outputs the differential voltage between the non-inverted voltage VIN+ and the inverted voltage VIN− from the output terminal 206. That is, the operational amplifier circuit 201 is a differential operational amplifier circuit.

The transistors TrA1 to TrA3, TrA7 to TrA10 are each formed by a p type MISFET. The transistors TrA4 to TrA6, TrA11 to TrA14 are each formed by an n type MISFET. The resistors RA1 to RA4 are each formed by the resistance layer 10 (CrSi). The resistors RA1 to RA4 each form a current value setting resistance and form a current amplification factor.

The transistors TrA1 to TrA14 are formed in the device forming region 6 within the semiconductor layer 2. That is, the functional device formed in the device forming region 6 includes a circuit network formed by the transistors TrA1 to TrA14.

On the other hand, the resistors RA1 to RA4 are formed in the outer region 7 within the semiconductor layer 2. The resistors RA1 to RA4 are selectively connected to the circuit network formed by the transistors TrA1 to TrA14 through the connection circuit forming layer 21 (the connection wiring layers 96 and the connection via electrodes 97).

A bias voltage Vb1 is input to the gate of the transistor TrA1. The drain of the transistor TrA1 is connected to the positive supply terminal 202. The source of the transistor TrA1 is connected to the source of the transistor TrA2 and the source of the transistor TrA3. The gate of the transistor TrA2 is connected to the non-inverted positive supply terminal 204. The gate of the transistor TrA3 is connected to the inverted positive supply terminal 205.

A bias voltage Vb2 is input to the gate of the transistor TrA4. The drain of the transistor TrA4 is connected to the source of the transistor TrA5 and the source of the transistor TrA6.

The source of the transistor TrA4 is connected to the negative supply terminal 203. The gate of the transistor TrA5 is connected to the non-inverted positive supply terminal 204. The gate of the transistor TrA6 is connected to the inverted positive supply terminal 205.

The gate of the transistor TrA7 is connected to the gate of the transistor TrA8. A bias voltage Vb3 is input to the gate of the transistor TrA7 and the gate of the transistor TrA8. The source of the transistor TrA7 is connected to the positive supply terminal 202 through the resistor RA1.

The drain of the transistor TrA7 is connected to the source of the transistor TrA9. The source of the transistor TrA8 is connected to the positive supply terminal 202 through the resistor RA2. The drain of the transistor TrA8 is connected to the source of the transistor TrA10.

The gate of the transistor TrA9 is connected to the gate of the transistor TrA10. A bias voltage Vb4 is input to the gate of the transistor TrA9 and the gate of the transistor TrA10.

The drain of the transistor TrA9 is connected to the drain of the transistor TrA11. The drain of the transistor TrA10 is connected to the drain of the transistor TrA12.

The drain of the transistor TrA6 is connected to the connection portion between the drain of the transistor TrA7 and the source of the transistor TrA9. The drain of the transistor TrA5 is connected to the connection portion between the drain of the transistor TrA8 and the source of the transistor TrA10.

The gate of the transistor TrA11 is connected to the gate of the transistor TrA12. A bias voltage Vb5 is input to the gate of the transistor TrA11 and the gate of the transistor TrA12.

The source of the transistor TrA11 is connected to the drain of the transistor TrA13. The source of the transistor TrA12 is connected to the drain of the transistor TrA14.

The gate of the transistor TrA13 is connected to the gate of the transistor TrA14. The gate of the transistor TrA13 and the gate of the transistor TrA14 are connected to the drain of the transistor TrA11.

The source of the transistor TrA13 is connected to the negative supply terminal 203 through the resistor RA3. The source of the transistor TrA14 is connected to the negative supply terminal 203 through the resistor RA4.

In this configuration, an example has been described in which the operational amplifier circuit 201 includes the transistors TrA1 to TrA6. However, the operational amplifier circuit 201 not including the transistors TrA1 to TrA3 may be employed or the operational amplifier circuit 201 not including the transistors TrA4 to TrA6 may be employed.

Figure 19:
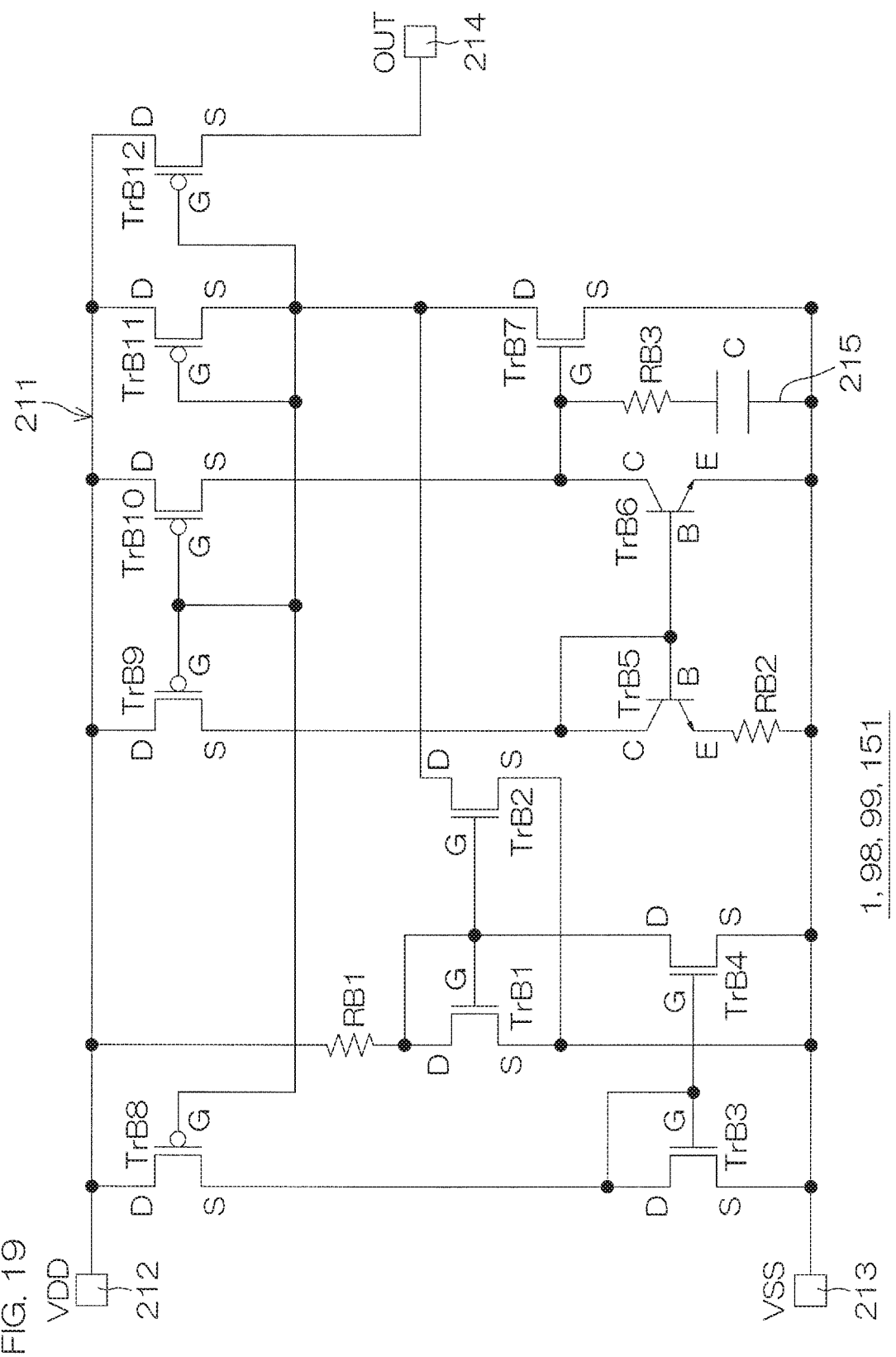
FIG. 19 is a circuit diagram showing an electrical configuration according to a second configuration example of the electronic component.

The electronic components 1, 98, 99, 151 may each have an electrical configuration shown in FIG. 19. FIG. 19 is a circuit diagram showing an electrical configuration according to a second configuration example of the electronic components 1, 98, 99, 151.

Referring to FIG. 19, the electronic components 1, 98, 99, and 151 each include a current amplifier-type constant voltage regulator 211. The constant voltage regulator 211 includes a positive supply terminal 212, a negative supply terminal 213, an output terminal 214, transistors TrB1 to TrB12 (semiconductor switching devices), resistors RB1 to RB3 (passive devices), and a capacitor C (passive device).

A supply voltage VDD is input to the positive supply terminal 212. A reference voltage VSS is input to the negative supply terminal 213. The reference voltage VSS may be a ground voltage. The constant voltage regulator 211 outputs a constant current according to the potential difference between the supply voltage VDD and the reference voltage VSS from the output terminal 214.

The transistors TrB1 to TrB4, TrB7 are each formed by an n type MISFET. The transistors TrB5, TrB6 are each formed by an npn type BJT. The transistors TrB8 to TrB12 are each formed by a p type MISFET.

The resistors RB1, RB3 may each be formed by a polysilicon resistance. The resistor RB2 is formed by the resistance layer 10 (CrSi). The resistor RB2 forms a current value setting resistance and forms a current amplification factor.

The transistors TrB1 to TrB12, the resistors RB1, RB3, and the capacitor C are formed in the device forming region 6 within the semiconductor layer 2, respectively. That is, the functional device formed in the device forming region 6 includes a circuit network formed by the transistors TrB1 to TrB12, the resistors RB1, RB3, and the capacitor C.

On the other hand, the resistor RB2 is formed in the outer region 7 within the semiconductor layer 2. The resistor RB2 is selectively connected to the circuit network formed by the transistors TrB1 to TrB12, the resistors RB1, RB3, and the capacitor C through the connection circuit forming layer 21 (the connection wiring layers 96 and the connection via electrodes 97).

The gate of the transistor TrB1 is connected to the gate of the transistor TrB2. The gate of the transistor TrB1 and the gate of the transistor TrB2 are connected to the drain of the transistor TrB1.

The drain of the transistor TrB1 is connected to the positive supply terminal 212 through the resistor RB1. The source of the transistor TrB1 is connected to the negative supply terminal 213. The source of the transistor TrB2 is connected to the source of the transistor TrB1.

The gate of the transistor TrB3 is connected to the gate of the transistor TrB4. The gate of the transistor TrB3 and the gate of the transistor TrB4 are connected to the drain of the transistor TrB3.

The source of the transistor TrB3 is connected to the negative supply terminal 213. The drain of the transistor TrB2 is connected to the gate of the transistor TrB1 and the gate of the transistor TrB2. The source of the transistor TrB4 is connected to the negative supply terminal 213.

The base of the transistor TrB5 is connected to the base of the transistor TrB6. The base of the transistor TrB5 and the base of the transistor TrB6 are connected to the collector of the transistor TrB5. The emitter of the transistor TrB5 is connected to the negative supply terminal 213 through the resistor RB2. The emitter of the transistor TrB6 is connected to the negative supply terminal 213.

The gate of the transistor TrB7 is connected to the collector of the transistor TrB6. The drain of the transistor TrB7 is connected to the drain of the transistor TrB2. The source of the transistor TrB7 is connected to the negative supply terminal 213.

The resistor RB3 forms an RC series circuit 215 together with the capacitor C. The RC series circuit 215 is connected between the gate of the transistor TrB7 and the negative supply terminal 213.

The gates of the transistors TrB8 to TrB12 are connected to each other. The gates of the transistors TrB8 to TrB12 are connected to the drain of the transistor TrB7. The drains of the transistors TrB8 to TrB12 are connected to the positive supply terminal 212.

The source of the transistor TrB8 is connected to the drain of the transistor TrB3. The source of the transistor TrB9 is connected to the collector of the transistor TrB5. The source of the transistor TrB10 is connected to the collector of the transistor TrB6, respectively.

The source of the transistor TrB11 is connected to the gates of the transistors TrB8, TrB9, TrB10, TrB12 and the drain of the transistor TrB7. The source of the transistor TrB12 is connected to the output terminal 214.

Although the preferred embodiments of the present invention have been described, the preferred embodiments of the present invention can also be implemented in yet other modes.

In the respective preferred embodiments described above, examples have been described in which one or more resistance circuits 11 (resistance layer 10, thin-film resistance 71) are formed in the outer region 7. However, in the respective preferred embodiments described above, one or more resistance circuits 11 (resistance layer 10, thin-film resistance 71) may be formed in the device forming region 6.

Also, in the respective preferred embodiments described above, one or more resistance circuits 11 (resistance layer 10, thin-film resistance 71) may be formed, respectively, in the device forming region 6 and the outer region 7. Also, one or more resistance circuits 11 (resistance layer 10, thin-film resistance 71) may be formed only in the device forming region 6, instead of being formed in the outer region 7.

In the respective preferred embodiments described above, examples have been described in which the first upper wiring layer 61 and the second upper wiring layer 62 form the uppermost wiring layer of the multilayer wiring structure 12. However, the first upper wiring layer 61 and the second upper wiring layer 62 do not necessarily have to form the uppermost wiring layer of the multilayer wiring structure 12.

In the case above, insulating layers having the same structure as the first to fourth insulating layers 13 to 16 and wiring layers having the same structure as the first lower wiring layer 41 (second lower wiring layer 42) and the first upper wiring layer 61 (second upper wiring layer 62) are layered on the fourth insulating layer 16 in any mode and at any cycle.

In the respective preferred embodiments described above, examples have been described in which the resistance layer 10 occupies the principal surface of the third insulating layer 15. However, in the respective preferred embodiments described above, wiring layers having the same structure as the first lower wiring layer 41 (second lower wiring layer 42) and the first upper wiring layer 61 (second upper wiring layer 62) may be formed on the principal surface of the third insulating layer 15. However, with such a structure, there is concern about an increase in manufacturing workload and increased difficulty in securing flatness, and it can thus be said that the structure in which the resistance layer 10 occupies the principal surface of the third insulating layer 15 is preferable.

Examples of features extracted from the present specification and drawings are indicated below.

[Item 1] An electronic component including a semiconductor layer that includes a device forming region in which a functional device is formed and an outer region outside the device forming region and has a principal surface and a multilayer wiring structure including multiple insulating layers layered on the principal surface of the semiconductor layer, the multilayer wiring structure including a connection circuit forming layer that includes a wiring layer selectively formed within a plurality the insulating layers so as to be routed from the device forming region to the outer region and electrically connected to the functional device and a resistance circuit forming layer that includes a resistance layer made of a metal thin film and selectively formed, in the outer region, within a plurality of the insulating layers different from those for the connection circuit forming layer so as to be electrically connected to the functional device through the wiring layer of the connection circuit forming layer.

According to this electronic component above, the resistance layer is made of a metal thin film. With the metal thin film, the planar area of the resistance layer can be reduced while reducing the thickness of the resistance layer. It is thereby possible to adequately interpose the resistance layer within the multilayer wiring structure while ensuring flatness. In particular, with the electronic component, the resistance layer is formed in the outer region. It is thereby possible to suppress the electrical influence of the resistance layer on the device forming region and also suppress the electrical influence of the device forming region on the resistance layer. Accordingly, the resistance layer can be adequately incorporated in the multilayer wiring structure.

[Item 2] The electronic component according to Item 1, in which the functional device includes at least one of a passive device, a semiconductor rectifying device, and a semiconductor switching device.

[Item 3] The electronic component according to Item 1, in which the functional device includes a circuit network in which any two or more of a passive device, a semiconductor rectifying device, and a semiconductor switching device are selectively combined.

[Item 4] The electronic component according to Item 2 or 3, in which the passive devices includes at least one of a resistor, capacitor, and a coil.

[Item 5] The electronic component according to Item 2 or 3, in which the semiconductor rectifying device includes at least one of a pn junction diode, a Zener diode, a Schottky barrier diode, and a fast recovery diode.

[Item 6] The electronic component according to Item 2 or 3, in which the semiconductor switching device includes at least one of a BJT (Bipolar Junction Transistor), a MISFET (Metal Insulator Field Effect Transistor), an IGBT (Insulated Gate Bipolar Junction Transistor), and a JFET (Junction Field Effect Transistor).

[Item 7] The electronic component according to Item 1, including an amplifier circuit formed by the functional device and the resistance layer.

[Item 8] The electronic component according to Item 1, including a differential operational amplifier circuit formed by the functional device and the resistance layer.

[Item 9] The electronic component according to Item 1, including a constant voltage regulator circuit formed by the functional device and the resistance layer.

[Item 10] The electronic component according to any one of Items 1 to 9, in which the resistance layer is made of a metal thin film containing at least one of CrSi, TaN, and TiN.

[Item 11] A thin-film resistance including
a resistance layer containing chromium silicide, and
a chromium aggregate including chromium agglomeration and formed in the resistance layer.

In this thin-film resistance, the chromium aggregate having a specific resistance smaller than the specific resistance of chromium silicide is formed in the resistance layer. It is thereby possible to provide a thin-film resistance which includes the resistance layer containing chromium silicide, while having a resistance value smaller than the resistance value of the resistance layer.

[Item 12] The thin-film resistance according to Item 11, in which the chromium aggregate is formed in a partial region of the resistance layer.

[Item 13] The thin-film resistance according to Item 11 or 12, in which multiple chromium aggregates are formed.

[Item 14] The thin-film resistance according to any one of Items 11 to 13, in which the chromium aggregate is formed as grains or layers.

[Item 15] The thin-film resistance according to any one of Items 11 to 14, in which the resistance layer has a trimming mark from which the chromium silicide has disappeared.

[Item 16] The thin-film resistance according to any one of Items 11 to 15, in which the chromium aggregate has a width greater than the thickness of the resistance layer.

[Item 17] The thin-film resistance according to any one of Items 11 to 16, in which the resistance layer has a thickness not more than 1 µm.

[Item 18] A method of manufacturing a thin-film resistance, including the steps of
preparing a resistance layer containing chromium silicide, and
forming a chromium aggregate including chromium agglomeration in the resistance layer by irradiating the resistance layer with a laser beam to aggregate chromium in the portion irradiated with the laser beam within the resistance layer.

According to this method of manufacturing a thin-film resistance, the chromium aggregate having a specific resistance smaller than the specific resistance of chromium silicide is formed in the resistance layer. It is thereby possible to manufacture and provide a thin-film resistance which includes the resistance layer containing chromium silicide, while having a resistance value smaller than the resistance value of the resistance layer.

[Item 19] The method of manufacturing a thin-film resistance according to Item 18, in which the chromium aggregate is formed in a partial region of the resistance layer.

[Item 20] The method of manufacturing a thin-film resistance according to Item 18 or 19, in which multiple chromium aggregates are formed.

[Item 21] The method of manufacturing a thin-film resistance according to any one of Items 18 to 20, in which the chromium aggregate is formed as grains or layers.

[Item 22] The method of manufacturing a thin-film resistance according to any one of Items 18 to 21, in which the chromium aggregate having a width greater than the thickness of the resistance layer is formed.

[Item 23] The method of manufacturing a thin-film resistance according to any one of Items 18 to 22, further including the step of adjusting the resistance value of the resistance layer in a decreasing direction with the chromium aggregate.

[Item 24] The method of manufacturing a thin-film resistance according to any one of Items 18 to 23, in which the resistance layer is irradiated with a laser beam having energy capable of blocking the resistance layer while being defocused from the resistance layer to thereby form the chromium aggregate.

[Item 25] The method of manufacturing a thin-film resistance according to any one of Items 18 to 24, further including the step of focusing on and irradiating the resistance layer with the laser beam having energy capable of blocking the resistance layer to form a trimming mark in a portion of the resistance layer.

[Item 26] The method of manufacturing a thin-film resistance according to Item 25, further including the step of adjusting the resistance value of the resistance layer in an increasing direction with the trimming mark.

[Item 27] The method of manufacturing a thin-film resistance according to any one of Items 18 to 26, in which the resistance layer having a thickness not more than 1 µm is prepared.

[Item 28] An electronic component including
a support substrate having a principal surface, and
a thin-film resistance including a resistance layer that contains chromium silicide and a chromium aggregate that is made of chromium agglomeration and formed in the resistance layer, the thin-film resistance formed on the principal surface.

In this electronic component, the chromium aggregate having a specific resistance smaller than the specific resistance of chromium silicide is formed in the resistance layer. It is thereby possible to provide an electronic component which includes the thin-film resistance including the resistance layer containing chromium silicide, while having a resistance value smaller than the resistance value of the resistance layer.

[Item 29] The electronic component according to Item 28, in which the support substrate includes a semiconductor layer.

[Item 30] The electronic component according to Item 29, in which
the semiconductor layer includes a device region including a functional device and an outer region outside the device region, and
the thin-film resistance is formed in the outer region.

[Item 31] The electronic component according to any one of Items 28 to 30, further including an insulating layer formed on the principal surface and having an insulating principal surface, in which
the thin-film resistance is formed on the insulating principal surface.

[Item 32] An electronic component including
an insulating layered structure in which multiple insulating layers are layered, and
a thin-film resistance including a resistance layer that contains chromium silicide and a chromium aggregate that is made of chromium agglomeration and formed in the resistance layer, the thin-film resistance formed within the insulating layered structure.

In this electronic component, the chromium aggregate having a specific resistance smaller than the specific resistance of chromium silicide is formed in the resistance layer. It is thereby possible to provide an electronic component which includes the thin-film resistance including the resistance layer containing chromium silicide, while having a resistance value smaller than the resistance value of the resistance layer.

[Item 33] The electronic component according to Item 32, further including
a high-voltage side first wiring formed within the insulating layered structure, and
a low-voltage side second wiring formed within the insulating layered structure, in which
the thin-film resistance is connected between the first wiring and the second wiring.

[Item 34] The electronic component according to any one of Items 28 to 33, in which the chromium aggregate is formed in a partial region of the resistance layer.

[Item 35] The electronic component according to any one of Items 28 to 34, in which multiple chromium aggregates are formed.

[Item 36] The electronic component according to any one of Items 28 to 35, in which the chromium aggregate is formed as grains or layers.

[Item 37] The electronic component according to any one of Items 28 to 36, in which the resistance layer has a trimming mark from which the chromium silicide has disappeared.

[Item 38] The electronic component according to any one of Items 28 to 37, in which the chromium aggregate has a width greater than the thickness of the resistance layer.

[Item 39] The electronic component according to any one of Items 28 to 38, in which the resistance layer has a thickness not more than 1 μm.

Various other design changes may be made within the range of the matters described in the appended claims.

What is claimed is:
1. An electronic component comprising:
a first insulating layer;
a resistance layer including a metal thin film that is formed on the first insulating layer, the resistance layer having a first end portion, a second end portion and a central portion between the first end portion and the second end portion, the resistance layer having a rear surface being in contact with the first insulating layer and a front surface opposite to the rear surface;
a second insulating layer formed on the first insulating layer such that the second insulating layer covers the resistance layer, the second insulating layer having a planar shape matching a planar shape of the resistance layer and having a side surface flush with a side surface of the resistance layer;
a first electrode having a first contact portion and a second contact portion spaced away from the first contact portion both of which are in contact with the resistance layer at a portion of the first end portion side with respect to the central portion of the resistance layer;
a notched portion formed in the first end portion of the resistance layer and between the first contact portion and the second contact portion; and
a second electrode having a contact portion in contact with the resistance layer at a portion of the second end portion side with respect to the central portion of the resistance layer,
wherein
the first electrode includes a first via electrode embedded in the first insulating layer and forming a physical contact with the resistance layer from a rear surface side of the resistance layer, and
the second electrode includes a second via electrode embedded in the first insulating layer and forming a physical contact with the resistance layer from the rear surface side of the resistance layer.

2. The electronic component according to claim 1, wherein the contact portion of the second electrode includes a third contact portion facing the first contact portion and a fourth contact portion facing the second contact portion.

3. The electronic component according to claim 1, wherein
the resistance layer is formed in a quadrilateral shape having a first side, a second side, a third side, and a fourth side in plan view,
the first end portion of the resistance layer is formed by the first side, the third side, and the fourth side,
the second end portion of the resistance layer is formed by the second side, the third side, and the fourth side, and
the notched portion includes a first notched portion extending from the first side toward the second side.

4. The electronic component according to claim 3, wherein the notched portion includes a second notched portion extending from the second side toward the first side.

5. The electronic component according to claim 1, comprising a plurality of the first contact portions and a plurality of the second contact portions.

6. The electronic component according to claim 1, further comprising:
a first lower wiring layer formed in a region of a first insulating layer side with respect to the resistance layer and electrically connected to the first via electrode; and
a second lower wiring layer formed in a region of the first insulating layer side with respect to the resistance layer and electrically connected to the second via electrode.

7. The electronic component according to claim 6, wherein the resistance layer is connected in series to the first lower wiring layer and the second lower wiring layer.

8. The electronic component according to claim 6, further comprising:
a first upper wiring layer formed on the second insulating layer and electrically connected to the first lower wiring layer; and
a second upper wiring layer formed on the second insulating layer and electrically connected to the second lower wiring layer.

9. The electronic component according to claim 8, wherein the resistance layer is connected in series to the first upper wiring layer and the second upper wiring layer.

10. The electronic component according to claim 8, wherein
the first upper wiring layer is spaced away from the resistance layer in plan view, and
the second upper wiring layer is spaced away from the resistance layer in plan view.

11. The electronic component according to claim 8, wherein
  the first upper wiring layer forms an uppermost wiring layer, and
  the second upper wiring layer forms an uppermost wiring layer.

12. The electronic component according to claim 8, wherein the first upper wiring layer has a thickness not less than a thickness of the first lower wiring layer.

13. The electronic component according to claim 8, wherein the second upper wiring layer has a thickness not less than a thickness of the second lower wiring layer.

14. The electronic component according to claim 8, further comprising:
  a first long via electrode penetrating the first insulating layer and the second insulating layer such that the first long via electrode is electrically connected to the first lower wiring layer and the first upper wiring layer; and
  a second long via electrode penetrating the first insulating layer and the second insulating layer such that the second long via electrode is electrically connected to the second lower wiring layer and the second upper wiring layer.

15. The electronic component according to claim 14, wherein the resistance layer is positioned on a straight line connecting the first long via electrode and the second long via electrode in plan view.

16. The electronic component according to claim 14, wherein the first long via electrode has a first lower portion positioned in a first lower wiring layer side with respect to the resistance layer and a first upper portion positioned in a first upper wiring layer side with respect to the resistance layer and having a length not less than a length of the first lower portion.

17. The electronic component according to claim 14, wherein the second long via electrode has a second lower portion positioned in a second lower wiring layer side with respect to the resistance layer and a second upper portion positioned in a second upper wiring layer side with respect to the resistance layer and having a length not less than a length of the second lower portion.

18. The electronic component according to claim 14, further comprising an insulating layer covering the first upper wiring layer and the second upper wiring layer and having a first pad opening to expose the first upper wiring layer and a second pad opening to expose the second upper wiring layer.

19. The electronic component according to claim 18, wherein the insulating layer covers a connection portion between the first upper wiring layer and the first long via electrode in plan view.

20. The electronic component according to claim 1, wherein the resistance layer has a single-layer structure.

* * * * *